United States Patent
Liu et al.

(10) Patent No.: US 12,360,142 B2
(45) Date of Patent: Jul. 15, 2025

(54) RESOURCE MANAGEMENT AND CONTROL METHOD AND SYSTEM

(71) Applicant: METIS IP (SUZHOU) LLC, Suzhou (CN)

(72) Inventors: Lifeng Liu, Beijing (CN); Huasheng Liu, Beijing (CN); Guoliang Li, Beijing (CN); Jiaming Pan, Beijing (CN); Liu Tan, Beijing (CN); Canjin Gao, Beijing (CN); Sheng Yao, Beijing (CN); Wenhao Lu, Beijing (CN); Zhiwei Ye, Beijing (CN)

(73) Assignee: METIS IP (SUZHOU) LLC, Suzhou (CN)

( * ) Notice: Subject to any disclaimer, the term of this patent is extended or adjusted under 35 U.S.C. 154(b) by 827 days.

(21) Appl. No.: 17/252,723

(22) PCT Filed: Jun. 15, 2019

(86) PCT No.: PCT/CN2019/091432
§ 371 (c)(1),
(2) Date: Dec. 15, 2020

(87) PCT Pub. No.: WO2019/238133
PCT Pub. Date: Dec. 19, 2019

(65) Prior Publication Data
US 2021/0247426 A1    Aug. 12, 2021

(30) Foreign Application Priority Data

Jun. 15, 2018 (CN) .......................... 201810618980.X
Jun. 29, 2018 (CN) .......................... 201810695056.1
(Continued)

(51) Int. Cl.
*G01R 21/133* (2006.01)
*G01R 22/10* (2006.01)
(Continued)

(52) U.S. Cl.
CPC ......... *G01R 21/1336* (2013.01); *G01R 22/10* (2013.01); *G06Q 30/0645* (2013.01); *G06Q 50/06* (2013.01)

(58) Field of Classification Search
CPC .. G01R 21/1336; G01R 22/10; G01R 22/063; G06Q 30/0645; G06Q 50/06; G06Q 50/16
See application file for complete search history.

(56) References Cited

U.S. PATENT DOCUMENTS 7,851,517 B2   12/2010  Holmes
2011/0004446 A1  1/2011  Dorn et al.
(Continued)

FOREIGN PATENT DOCUMENTS

CN    2705533 Y    6/2005
CN    1963542 A    5/2007
(Continued)

OTHER PUBLICATIONS

First Office Action in Chinese Application No. 201810618980.X mailed on Apr. 27, 2020, 16 pages.
(Continued)

*Primary Examiner* — Mohammad Ali
*Assistant Examiner* — Saad M Kabir
(74) *Attorney, Agent, or Firm* — Metis IP LLC

(57) ABSTRACT

The present disclosure relates to methods and systems for managing and controlling resources. A system for managing and controlling resources may comprise a storage device configured to store a set of instructions, one or more processors configured to communicate with the storage device. When executing the set of instructions, the one or more processors may be configured to cause the system to collect resource usage data through one or more meters, process the resource usage data based on a preset algorithm
(Continued)

to determine resource usage state, and control at least the one or more meters and/or one or more smart devices to perform specified operations based on the resource usage state. The present disclosure provides methods and systems for managing and controlling resources based on meters or smart devices controlled by the network.

18 Claims, 50 Drawing Sheets

(30)  Foreign Application Priority Data

| Jun. 29, 2018 | (CN) | ......................... | 201810717488.8 |
| Jul. 25, 2018 | (CN) | ......................... | 201810824190.7 |
| Sep. 5, 2018 | (CN) | ......................... | 201811030564.4 |
| Sep. 5, 2018 | (CN) | ......................... | 201811030850.0 |
| Sep. 6, 2018 | (CN) | ......................... | 201811036305.2 |

(51) Int. Cl.
  *G06Q 30/0645* (2023.01)
  *G06Q 50/06* (2012.01)

(56)  References Cited

U.S. PATENT DOCUMENTS

| 2014/0156138 A1 | 6/2014 | Klaff et al. |
| 2016/0192412 A1 | 6/2016 | Cho |
| 2017/0068266 A1 | 3/2017 | Enyedy |

FOREIGN PATENT DOCUMENTS

| CN | 101154312 A | 4/2008 |
| CN | 101163073 A | 4/2008 |
| CN | 101499196 A | 8/2009 |
| CN | 101526371 A | 9/2009 |
| CN | 201435110 Y | 3/2010 |
| CN | 101714278 A | 5/2010 |
| CN | 101901373 A | 12/2010 |
| CN | 101931271 A | 12/2010 |
| CN | 102074073 A | 5/2011 |
| CN | 102542448 A | 7/2012 |
| CN | 102548027 A | 7/2012 |
| CN | 102568108 A | 7/2012 |
| CN | 102866699 A | 1/2013 |
| CN | 102938729 A | 2/2013 |
| CN | 103198576 A | 7/2013 |
| CN | 203038073 U | 7/2013 |
| CN | 103280091 A | 9/2013 |
| CN | 203849848 | 9/2014 |
| CN | 104076774 A | 10/2014 |
| CN | 104101779 A | 10/2014 |
| CN | 104123638 A | 10/2014 |
| CN | 104134286 A | 11/2014 |
| CN | 104505937 A | 4/2015 |
| CN | 105225348 A | 1/2016 |
| CN | 105225438 A | 1/2016 |
| CN | 105550924 A | 5/2016 |
| CN | 205318535 U | 6/2016 |
| CN | 205318536 U | 6/2016 |
| CN | 205540908 U | 8/2016 |
| CN | 105939376 A | 9/2016 |
| CN | 205582118 U | 9/2016 |
| CN | 106019087 A | 10/2016 |
| CN | 106060161 A | 10/2016 |
| CN | 106066416 A | 11/2016 |
| CN | 106297242 A | 1/2017 |
| CN | 106375457 A | 2/2017 |
| CN | 106451766 A | 2/2017 |
| CN | 106526311 A | 3/2017 |
| CN | 106530039 A | 3/2017 |
| CN | 206115525 U | 4/2017 |
| CN | 106773813 A | 5/2017 |
| CN | 106787193 A | 5/2017 |
| CN | 206224727 U | 6/2017 |
| CN | 107230164 A | 10/2017 |
| CN | 107300897 A | 10/2017 |
| CN | 107301540 A | 10/2017 |
| CN | 206563980 U | 10/2017 |
| CN | 107527441 A | 12/2017 |
| CN | 107809138 A | 3/2018 |
| CN | 107967801 A | 4/2018 |
| CN | 107995250 A | 5/2018 |
| CN | 207338265 | 5/2018 |
| CN | 207441006 U | 6/2018 |
| JP | H1049781 A | 2/1998 |
| KR | 101767449 B1 | 8/2017 |
| WO | 2008077654 A1 | 7/2008 |

OTHER PUBLICATIONS

First Office Action in Chinese Application No. 201810717488.8 mailed on Apr. 28, 2020, 35 pages.
First Office Action in Chinese Application No. 201810695056.1 mailed on Apr. 3, 2019, 17 pages.
The Second Office Action in Chinese Application No. 201810695056.1 mailed on Dec. 11, 2019, 17 pages.
First Office Action in Chinese Application No. 201811030850.0 mailed on Feb. 3, 2020, 21 pages.
First Office Action in Chinese Application No. 201810824190.7 mailed on Mar. 3, 2020, 16 pages.
International Search Report in PCT/CN2019/091432 mailed on Sep. 23, 2019, 10 pages.
Written Opinion in PCT/CN2019/091432 mailed on Sep. 23, 2019, 12 pages.
Liao, Si'ning, A Simple Study on the Application of Fel Kong System and Intelligent Electricity Meters, Science and Technology Innovation Herald, 2017, 3 pages.
Li, Dongdong et al., Study of smart power utilization system and development of smart controller for homes, Power System Protection and Control, 41(4): 123-129, 2013.
Zhu, Yu-Nan et al., Data Mining Application in Smart Meter Quality Control, IOS Press, 369-374, 2016.

RESOURCE MANAGEMENT AND CONTROL METHOD AND SYSTEM

CROSS REFERENCE TO RELATED APPLICATIONS

This application is a national stage application of International Application No. PCT/CN2019/091432, filed on Jun. 15, 2019, which claims priority of Chinese Patent Application No. 201810618980.X filed on Jun. 15, 2018, Chinese Patent Application No. 201810717488.8 filed on Jun. 29, 2018, Chinese Patent Application No. 201810695056.1 filed on Jun. 29, 2018, Chinese Patent Application No. 201811030850.0 filed on Sep. 5, 2018, Chinese Patent Application No. 201811036305.2 filed on Sep. 6, 2018, Chinese Patent Application No. 201810824190.7 filed on Jul. 25, 2018, Chinese Patent Application No. 201811030564.4, filed on Sep. 5, 2018, the entire contents of each of which are incorporated herein by reference.

TECHNICAL FIELD

The present disclosure relates to the technical field of managing and controlling resources, in particular to a method and system for managing and controlling resources based on Internet techniques.

BACKGROUND

With the development of Internet of Things technology, resource management is gradually shifting from offline to online. How to use Internet technology more efficiently to facilitate resource management has been a concern. The present disclosure provides a method and system for managing and controlling resources based on a network control meter and/or a smart device.

SUMMARY

One of the embodiments of the present disclosure provides a control system. The control system may include a storage device configured to store a set of instructions; one or more processors configured to communicate with the storage device, wherein, when executing the set of instructions, the one or more processors may be configured to cause the system to collect resource usage data through one or more meters; determine a resource usage state by processing the resource usage data based on a preset algorithm; control the one or more meters and/or one or more smart devices to perform a specified operation based at least on the resource usage state.

In some embodiments, the one or more processors may be further configured to cause the system to obtain relevant time information; obtain a judgment result by determining whether the relevant time information belongs to a specific time period, and obtain a determination result; control the one or more meters and/or the one or more smart devices to perform the specified operation based at least on the resource usage state, wherein, the one or more processors may be further configured to cause the system to control the one or more meters and/or the one or more smart devices to perform the specified operation based on the resource usage state and the judgment result.

In some embodiments, the resource usage state may reflect an amount of resource that has been used. The resource usage state may include a remaining amount of resource being less than a set threshold.

In some embodiments, to control the one or more meters or the one or more smart devices to perform the specified operation based at least on the resource usage state, the one or more processors may be further configured to cause the system to control the one or more meters to cut off a resource supply or control the one or more smart devices to be closed and locked if the remaining amount of resource is less than the set threshold, and the relevant time information does not belong to the specific time period.

In some embodiments, the one or more processors may be further configured to cause the system to receive recharge information from a client terminal; generate a recharge instruction based on the recharge information, wherein, the recharge instruction may include unique identification information; send the recharge instruction to the one or more meters or the client terminal.

In some embodiments, the resource usage data may be collected through one or more first type of resource meters and control the one or more meters and/or the one or more smart devices to perform the specified operation based at least on the resource usage state, and the one or more processors may be further configured to cause the system to control one or more second types of resource meters to perform the specified operation based at least on the resource usage state.

In some embodiments, to collect resource usage data through the one or more meters, the one or more processors may be further configured to cause the system to send a configuration instruction of data collection to the one or more meters; and receive the resource usage data automatically uploaded by the one or more meters based on the configuration instruction of data collection.

In some embodiments, the one or more processors may be further configured to cause the system to obtain a registration state of a renting house, wherein, the one or more meters are related to the renting house, a usage state of the renting house may be reflected through the resource usage state. To control the one or more meters and/or the one or more smart devices to perform the specified operation based at least on the resource usage state, wherein the one or more processors may be further configured to cause the system to control the one or more meters and/or the one or more smart devices to perform the specified operation based on the resource usage state and the registration state.

In some embodiments, to control the one or more meters and/or the one or more smart devices to perform the specified operation based on the resource usage state and the registration state, the one or more processors may be further configured to cause the system to control the one or more meters to cut off a resource supply or the one or more smart devices to be closed and locked in response to the registration state being vacant and the resource usage state being in use.

One of the embodiments of the present disclosure provides a control method. The control method may include collecting resource usage data through one or more meters; determining a resource usage state by processing the resource usage data based on a preset algorithm; controlling the one or more meters and/or one or more smart devices to perform a specified operation based at least on the resource usage state.

One of the embodiments of the present disclosure provides a computer-readable storage medium that stores computer instructions. When the instructions are executed by one or more processors of a system, the one or more processors may be configured to cause the system to collect resource usage data through one or more meters; determine a resource usage state by processing the resource usage data based on a preset algorithm; and control the one or more meters and/or one or more smart devices to perform a specified operation based at least on the resource usage state.

One of the embodiments of the present disclosure provides a method for processing data. The method may include obtaining first control data based on a first communication protocol, obtaining a device identifier of a first preset target device and an operation identifier corresponding to a first operation based on the first control data, wherein, the first preset target device may include one or more meters and/or one or more smart devices; converting the operation identifier corresponding to the first operation to an operation instruction corresponding to the first operation; sending the operation instruction to the first target device based on the device identifier of the first preset target device, the operation instruction corresponding to the first operation, and a second communication protocol.

One of the embodiments of the present disclosure provides a device for processing data. The device may include a gateway controlling module, a data processing module, and a wireless communicating module. The gateway controlling module may be configured to receive first control data issued by a server to control a first preset target device to perform a first operation, generate a first data packet including the first control data, send the first data packet to the data processing module, receive a second data packet sent by the data processing module, and send the second data packet to the wireless communicating module. The data processing module may be configured to receive the first data packet, analyze and obtain a target device operation instruction corresponding to the first operation from the first data packet, generate the second data packet including the target device operation instruction, and send the second data packet to the gateway controlling module. The wireless communicating module may be configured to parse the second data packet to obtain the target device operation instruction and send the target device operation instruction to the first preset target device to make the first preset target device perform the first operation.

In some embodiments, the gateway controlling module may include a gateway center module and a data routing module. The gateway center module may be configured to receive the first control data issued by the server, determine the data in each field of the data packet with a first preset format according to the control data, generate the first data packet based on the data in each field of the data packet with the first preset format, and send the first data packet to the data routing module. The data routing module may be configured to forward the first data packet to the data processing module, receive the second data packet fed back by the data processing module, and send the second data packet to the wireless communicating module.

In some embodiments, a device for processing data may further include a first preset target device. The first preset target device may be configured to execute the first operation and feedback the result of the first operation to the wireless communicating module. The wireless communicating module may also be configured to generate the first operation including a third data packet of the first operation result and send the third data packet to the data routing module. The data routing module may also be configured to send the third data packet to the data processing module. The data processing module may further be configured to update a device operating state of the first preset target device according to the third data packet, generate a fourth data packet including the updated device operating state, and send the fourth data packet to the data routing module. The data routing module may also be configured to send the fourth data packet to the gateway center module. The gateway center module may also be configured to generate a fifth data packet including the updated device operating state of the fourth data packet with a second preset format and feedback the fifth data packet to the server.

In some embodiments, the gateway center module may be further configured to receive the second control data issued by the server for controlling the second preset target device to execute a second operation, generate a sixth data packet including the second control data, and send the sixth data packet to the data routing module. The data routing module may also be configured to forward the sixth data packet to the wireless communicating module. The wireless communicating module may be further configured to parse an operation instruction for controlling the second preset target device to execute the second operation from the sixth data packet, and send the operation instruction to the second preset target device to make the second preset target device execute the second operation.

In some embodiments, the wireless communicating module may be further configured to receive the second operation result fed back by the second preset target device after the second preset target device executes the second operation, generate a seventh data packet of the second operation result, and send the seventh data packet to the data routing module. The data routing module may also be configured to send the seventh data packet to the gateway center module. The gateway center module may also be configured to generate an eighth data packet including the second operation result of the seventh data packet with the second preset format and feedback the eighth data packet to the server.

One of the embodiments of the present disclosure provides a method for processing data implemented on a gateway controlling module. The method may include receiving, issued by a server, first control data that is configured to control a first preset target device to perform a first operation, generating a first data packet including the first control data, sending the first data packet to a data processing module, wherein the data processing module receives the first data packet, obtains and analyzes a target device operation instruction corresponding to the first operation from the first data packet, generates a second data packet including the target device operation instruction and sends the second data packet to the gateway controlling module.

Receiving the second data packet sent by the data processing module, sending the second data packet to the wireless communicating module, wherein the wireless communicating module parses the second data packet to obtain the target device operation instruction, and sends the target device operation instruction to the first preset target device to enable the first preset target device to execute the first operation.

In some embodiments, a method for processing data may include receiving the first control data issued by the server for controlling the first preset target device to perform the first operation, generating the first data packet including the first control data, and sending the first data packet to the data processing module. The method may include the gateway center module receiving the first control data issued by the server, determining the data in each field of the data packet with the first preset format according to the control data, generating the first data packet based on the data with the first preset format in each field of the data packet, and sending the first data packet to the data routing module. The data routing module may forward the first data packet to the data processing module. Correspondingly, the method may include receiving the second data packet sent by the data processing module and sending the second data packet to the wireless communicating module. The method may include the data routing module receiving the second data packet fed back by the data processing module and sending the second data packet to the wireless communicating module.

In some embodiments, the data processing method may further include the data routing module receiving the third data packet including the first operation result generated by the wireless communicating module, wherein the first operation result may be the feedback result of the first preset target device after executing the first operation. The data routing module may send the third data packet to the data processing module. The data routing module may receive and send the fourth data packet to the gateway center module.

The fourth data packet may be a data packet that includes the updated device operating state generated after the data processing module updates the device operating state of the first preset target device according to the third data packet. The gateway center module may generate the fifth data packet including the updated device operating state in the fourth data packet with the second preset format and feedback the fifth data packet to the server.

In some embodiments, a method for processing data may further include the gateway center module receiving the second control data issued by the server for controlling the second preset target device to execute the second operation, generating the second control data including the second control data packet, and sending the sixth data packet to the data routing module. The data routing module may forward the sixth data packet to the wireless communicating module to make the wireless communicating module parse an operation instruction for controlling the second preset target device to execute the second operation from the sixth data packet and send the operation instruction to the second preset target device to make the second preset target device to execute the second operation.

In some embodiments, a method for processing data may further include the data routing module receiving and sending a seventh data packet to the gateway center module, wherein, the seventh data packet may be a data packet that includes the second operation result fed back by the second preset target device received by the wireless communicating module after the second preset target device executes the second operation. The gateway center module may generate an eighth data packet including the second operation result of the seventh data packet with the second preset format, and feedback the eighth data packet to the server.

One of the embodiments of the present disclosure provides a method for processing data implemented on a data processing module. The method may include receiving a first data packet sent by a gateway controlling module; analyzing the first data packet to obtain a target device operation instruction corresponding to a first operation from the first data packet; generating a second data packet including the target device operation instruction and sending the second data packet to the gateway controlling module.

In some embodiments, a method for processing data may further include receiving the third data packet sent by the data routing module of the gateway controlling module; updating the device operating state of the first preset target device according to the third data packet; generating the fourth data packet including the updated device operating state; sending the fourth data packet to the data routing module.

One of the embodiments of the present disclosure provides a method for controlling a smart meter. The method may include obtaining monitoring information corresponding to a current monitoring parameter and determining whether the monitoring information satisfies a preset condition; determining whether a current time period is within an uninterrupted power time period if the monitoring information satisfies the preset condition; obtaining monitoring information corresponding to a current monitoring object continuously when the current time period is within the uninterrupted power time period; sending a trip instruction to a smart meter to trip the smart meter if the current time period is not within the uninterrupted power time period.

In some embodiments, the current monitoring parameter may be electricity consumption, and the monitoring information may be the current remaining electricity quantity. Obtaining the monitoring information corresponding to the current monitoring parameter and determining whether the monitoring information satisfies the preset condition may include obtaining the electricity consumption information uploaded by the smart meter, calculating the current remaining electricity quantity according to the electricity consumption information, and determining whether the monitoring information satisfies the preset condition if the current remaining electricity quantity is less than or equal to zero.

In some embodiments, the current remaining electricity quantity may be calculated according to the electricity consumption information if the electricity consumption information includes the current electricity consumption and the current total electricity quantity, which may include calculating the difference between the current total electricity quantity and the current electricity consumption to obtain the current remaining electricity quantity. The current remaining electricity quantity may be calculated if the electricity consumption information includes the current electricity consumption, the current total electricity quantity, and the allowable overdraft electricity quantity according to the electricity consumption information, which may include calculating the difference between the current total electricity quantity and the current electricity consumption, the sum of the difference and the allowable overdraft electricity quantity to obtain the current remaining electricity quantity.

In some embodiments, a method for controlling a smart meter may further include pushing a recharge reminder message when the current remaining electricity quantity is greater than zero and less than a preset electricity threshold.

In some embodiments, a method for controlling a smart meter may further include storing the trip state information of the smart meter according to the trip response information returned by the smart meter; sending a closing instruction to close the smart meter when receiving an electricity recharge instruction and the smart meter is currently in the trip state; updating the corresponding trip state information of the smart meter after receiving the trip response information returned by the smart meter.

In some embodiments, the current monitoring parameter may be the rent of a room corresponding to the smart meter, and the monitoring information may be the current remaining rent. Obtaining the monitoring information corresponding to the current monitoring parameter and determining whether the monitoring information satisfies a preset condition may include obtaining the rent information of the current monitored room. The rent information may include a house rent, a current rent, a start time of rental, and rental time. The unit rent price of the current monitored room may be obtained by calculating the house rent, the start time of rental, and rental time. The current remaining rent may be calculated according to the current rent and the unit rent price. Whether the current remaining rent is less than or equal to a first rent threshold may also be determined. The monitoring information satisfying the preset condition may be determined if the current remaining rent is less than or equal to the first rent threshold. The monitoring information does not satisfy the preset condition may be determined if the current remaining rent is greater than the preset first rent threshold.

In some embodiments, determining whether the current time period is within the uninterrupted power time period may include calculating the remaining time of the rent term according to the first rent threshold and the rent information; determining whether the current time period is within the remaining rent term; determining that the current time period is within the uninterrupted power supply time period when the current time period is within the remaining rent term; and determining the current time period being not within the uninterrupted power supply time period when the current time period is not within the remaining rent term.

In some embodiments, a method for controlling a smart meter may further include sending a rent recharge reminder message when the current remaining rent is greater than zero and less than a second rent threshold.

In some embodiments, a method for controlling a smart meter may further include storing the trip state information of the smart meter according to the trip response information returned by the smart meter; sending a trip instruction to the smart meter after receiving an order to pay rent from the user, wherein the smart meter is in the trip state; updating the corresponding trip state information of the smart meter after receiving the trip response information returned by the smart meter.

One of the embodiments of the present disclosure provides a device for controlling a smart meter, including a first obtaining module configured to obtain monitoring information corresponding to a current monitoring parameter; a first determining module configured to determine whether the monitoring information satisfies a preset condition; a second determining module configured to determine whether the current time period is within an uninterrupted power time period if the monitoring information satisfies the preset condition; a second obtaining module configured to obtain monitoring information corresponding to a current monitoring object continuously when the current time period is within the uninterrupted power time period; and a trip controlling module configured to send a trip instruction to a smart electric meter to trip the smart meter if the current time period is not within the uninterrupted power time period.

One of the embodiments of the present disclosure provides a method for recharging an electric meter. The method may include receiving, by a server, recharge information and generating a corresponding recharge instruction; determining whether a smart electric meter is online, wherein the smart electric meter has a network communication function and a near field communication function. If the smart electric meter is online, sending, by the server, the recharge instruction to the smart electric meter to cause the smart electric meter to complete a recharge operation according to the recharge instruction; if the smart electric meter is offline, sending, by the server, the recharge instruction to a client terminal to cause the client terminal to send the recharge instruction to the smart electric meter through the near field communication function.

In some embodiments, a method for recharging an electric meter may further include receiving successful recharge indication information of sent by the smart meter after the recharge is successful, or failed recharge indication information after the recharge is failed.

In some embodiments, a method for recharging an electric meter may further include receiving the electricity information sent by the smart electric meter. The server may generate a recharge notification information according to the electricity information and send the recharge notification information to the client terminal.

One of the embodiments of the present disclosure provides a method for recharging an electric meter. The method may include receiving, through a network, a recharge instruction issued by a server, or receiving a recharge instruction sent by a client terminal through a near field communication function; executing the received recharge instruction; sending indication information of successful recharge or indication information of failed recharge to the server according to an execution result of the recharge instruction.

In some embodiments, before a smart meter executes the received recharge instruction, the method may further include determining whether the received recharge instruction has been executed. If the received recharge instruction has not been executed, the method may enter the step of executing the received recharge instruction by the smart meter; if the received recharge instruction has been executed, the smart meter may no longer execute the recharge instruction.

In some embodiments, the smart meter may determine whether the received recharge instruction has been executed if the recharge instruction includes a unique ID number, which may include determining whether the recharge instruction has been executed according to the unique ID number in the received recharge instruction.

One of the embodiments of the present disclosure provides a device for recharging a smart electric meter, including an instruction generating module configured to receive recharge information and generate a corresponding recharge instruction; an online determining module configured to determine whether a smart electric meter is online, wherein the smart electric meter may have a network communication function and a near field communication function; a first sending module configured to send the recharge instruction to the smart electric meter when the smart meter is online to cause the smart electric meter to complete a recharge according to the recharge instruction; a second sending module configured to send the recharge instruction to a client terminal when the smart electric meter is offline to cause the client terminal to send the recharge instruction to the smart electric meter through the near field communication function.

One of the embodiments of the present disclosure provides a device for recharging a smart electric meter, including an instruction receiving module configured to receive, through a network, a recharge instruction issued by a server, or receive a recharge instruction sent by a client terminal through a near field communication function; an instruction executing module configured to execute the received recharge instruction; an information returning module configured to send indication information of successful recharge or indication information of failed recharge to the server according to an execution result of the recharge instruction.

One of the embodiments of the present disclosure provides a storage medium, the storage medium may include a stored program, wherein the program may execute any one of the above charging methods for an electric meter.

One of the embodiments of the present disclosure provides a processor, the processor may be configured to run a program, wherein any one of the charging methods mentioned above for the electric meter may be executed when the program is running.

One of the embodiments of the present disclosure provides a method for controlling a working state, including obtaining first information related to a switch component of an electric energy measurement device, wherein the first information may be configured to indicate at least one of an operating state of the switch component designated by a server, a duration the electric energy measurement device being offline, or the working state of the switch component after a preset operation is performed on a first component related to the switch component; and controlling an operating state of the switch component according to the first information.

In some embodiments, controlling the working state of the switch component according to the first information may include determining whether the current working state of the switch component is the same as the current working state specified by the server for the switch component when the electric energy measurement device is online.

If the current working state of the switch component is inconsistent with the working state specified by the server for the switch component, the current working state of the switch component may be switched to the working state specified by the server for the switch component.

In some embodiments, if the current working state of the switch component is inconsistent with the working state specified by the server for the switch component, the current working state of the switch component may be switched to the working state designated by the server for the switch component, which may include switching the current working state of the switch component to be disconnected if the current working state of the switch component is closed, wherein the working state specified by the server for the switch component is disconnected. If the current working state of the switch component is disconnected, and the working state specified by the server for the switch component is closed, the current working state of the switch component may be switched to be closed.

In some embodiments, controlling the working state of the switch component according to the first information may include determining whether the duration of the electric energy measurement device being offline is longer than a first preset duration. If the duration of the electric energy measurement device being offline is greater than the first preset duration, the working state of the switch component may be switched to be disconnected.

In some embodiments, controlling the working state of the switch component according to the first information may include switching the working state of the switch component from disconnected to closed after the operator executes a preset operation on a first component; obtaining the working parameter of the electric energy measurement device if the duration of switching the working state of the switch component from disconnected to closed is longer than a second preset duration; and controlling the working state of the switch component according to the working parameter of the electric energy measurement device.

In some embodiments, obtaining the working parameter of the electric energy measurement device may include obtaining the total electricity consumption of the electric energy measurement device. Controlling the working state of the switch component according to the working parameter of the electric energy measurement device may include controlling the working state of the switch component to be closed if the total electricity consumption of the electric energy measurement device is less than the maximum available electricity quantity of the electric energy measurement device; controlling the working state of the switch component to switch from closed to disconnected if the total electricity consumption of the electric energy measurement device is greater than or equal to the maximum available electricity quantity of the electric energy measurement device.

In some embodiments, the total electricity consumption of the electric energy measurement device is the electricity consumption of the electric energy measurement device within a time range corresponding to the duration. The maximum available electricity quantity of the electric energy measurement device may be the maximum available electricity quantity within the time range corresponding to the duration.

One of the embodiments of the present disclosure provides a device for controlling working state, including an obtaining unit configured to obtain first information related to a switch component of an electric energy measurement device, wherein the first information may be configured to indicate at least one of an operating state of the switch component, designated by a server, a duration the electric energy measurement device being offline, or the working state of the switch component after a preset operation is performed on a first component related to the switch component; and a controlling unit configured to control an operating state of the switch component according to the first information.

In some embodiments, the controlling unit may be configured to determine whether the current working state of the switch component is consistent with the working state specified by the server for the switch component when the electric energy measurement device is online, or switch the current working state of the switch component to the working state specified by the server for the switch component if the current working state of the switch component is not consistent with the working state specified by the server for the switch component.

In some embodiments, the controlling unit may be configured to switch the current working state of the switch component to be disconnected if the current working state of the switch component is closed, wherein the working state specified by the server for the switch component is disconnected; and switch the current working state of the switch component to be closed if the current working state of the switch component is disconnected, wherein the working state specified by the server for the switch component is closed.

In some embodiments, the controlling unit may be configured to determine whether the duration of the electric energy measurement device being offline is longer than a first preset duration and if the duration of the electric energy measurement device being offline is longer than the first preset duration, then controlling the working state of the switch component to be disconnected.

In some embodiments, the controlling unit may be configured to switch the working state of the switch component from disconnected to closed after obtaining that the operator executes a preset operation on the first component, and if the duration of the working state of the switch component being switched from disconnected to closed is longer than the second preset duration, the obtaining unit may be triggered to obtain the operating parameter of the electric energy measurement device, and control the working state of the switch component according to the operating parameter of the electric energy measurement device.

In some embodiments, the obtaining unit may be configured to obtain the total electricity consumption of the electric energy measurement device; the controlling unit may be configured to control the working state of the switch component to be closed if the total electricity consumption of the electric energy measurement device is less than the maximum available electricity quantity of the electric energy measurement device; control the working state of the switch component to be switched from closed to disconnected if the total electricity consumption of the electric energy measurement device is greater than or equal to the maximum available electricity quantity of the electric energy measurement device.

In some embodiments, the total electricity consumption of the electric energy measurement device may be the electricity consumption of the electric energy measurement device within the time range corresponding to the duration; the maximum available electricity quantity of the electric energy measurement device may be the maximum available electricity quantity within the time range corresponding to the duration.

One of the embodiments of the present disclosure provides a method for controlling a meter. The method may include receiving measurement data corresponding to a first type of resource sent by a first meter in a meter set, wherein the meter set may include at least one meter associated with each other; calculating a current remaining amount of the first type of resource according to the measurement data, historical measurement data of the first meter, and a historical remaining amount of the first type of resource, wherein the historical measurement data of the meter may be measurement data corresponding to the first type of resource sent by the first meter last time, and the historical remaining amount of the first type of resource may be a remaining amount of the first type of resource calculated last time; determining whether the current remaining amount of the first type of resource is greater than a preset available amount of the first type of resource; and controlling a valve of at least one meter in the meter set to close if the current remaining amount of the first type of resource is not greater than the preset available amount of the first type of resource.

In some embodiments, controlling the valve of at least one meter in the meter set to be closed may include controlling the first meter to be closed, and/or controlling the designated meter associated with the first meter in the meter set to be closed.

In some embodiments, a method for controlling a meter may further include determining whether the current remaining amount of the first type of resource is less than a preset early warning amount of the first type of resource if the current remaining amount of the first type of resource is greater than a preset available amount of the first type of resource; sending the early warning information indicating that the remaining amount of the first type of resource is insufficient to the client terminal if the current remaining amount of the first type of resource is less than the preset early warning amount of the first type of resource.

In some embodiments, after controlling the valve of at least one meter in the meter set to be closed, a method for controlling a meter may further include freezing the smart door lock corresponding to the meter set in the case that the user does not receive the first type of resource fee paid by the user within a preset time period, and/or the user overdrafts the first type of resource usage exceeding the preset amount of overdraft.

In some embodiments, a method for controlling a meter may further include calculating the current remaining amount of the first type of resource based on the cost balance of the first type of resource when receiving the first type of resource fee paid by the user; determining whether the current remaining amount of the first type of resource is greater than the preset available amount of the first type of resource; controlling the valve of the closed meter in the meter set to open if the current remaining amount of the first type of resource is greater than the preset available amount of the first type of resource.

In some embodiments, after controlling the valve of the closed meter in the meter set to open, a method for controlling a meter may further include unfreezing the smart door lock corresponding to the meter set.

One of the embodiments of the present disclosure provides a device for controlling a meter, including a data receiving unit configured to receive measurement data corresponding to a first type of resource sent by a first meter in a meter set, wherein the meter set may include at least one meter associated with each other; a first calculating unit configured to calculate a current remaining amount of the first type of resource based on the measurement data, historical measurement data of the first meter, and a historical remaining amount of the first type of resource, wherein, the historical measurement data of the meter may be measurement data corresponding to the first type of resource sent by the first meter last time, and the historical remaining amount of the first type of resource may be remaining amount of the first type of resource calculated last time; a first determining unit configured to determine whether the current remaining amount of the first type of resource is greater than a preset available amount of the first type of resource; and a processing and controlling unit configured to control a valve of at least one meter in the meter set to close if the current remaining amount of the first type of resource is not greater than the preset available amount of the first type of resource.

In some embodiments, when the control processing unit controls the valve of at least one meter in the meter set to be closed, it is specifically configured to control the first meter to be closed, and/or to control the designated meter associated with the first meter to be closed in the meter set.

In some embodiments, a device for controlling a meter may further include a second determining unit configured to determine whether the current remaining amount of the first type of resource is less than the preset early warning amount of the first type of resource when the current remaining amount of the first type of resource is greater than the preset available amount of the first type of resource; and an information sending unit configured to send the early warning information indicating the remaining amount of the first type of resource is insufficient to the client terminal when the current remaining amount of the first type of resource is less than the preset early warning amount of the first type of resource.

In some embodiments, the control processing unit may be further configured to freeze the smart door lock corresponding to the meter set in the case that the user does not receive the first type of resource fee paid by the user within the preset time period, and/or the user overdrafts the first type of resource and exceeds the preset amount of overdraft after controlling the valve of at least one meter in the meter set to be closed.

In some embodiments, a device for controlling a meter may further include a second calculating unit configured to calculate the current remaining amount of the first type of resource based on the cost balance of the first type of resource when receiving the first type of resource fee paid by the user; a third determining unit configured to determine whether the current remaining amount of the first type of resource is greater than the preset available amount of the first type of resource. If the current remaining amount of the first type of resource is greater than the preset available amount of the first type of resource, the control processing unit may control the valve of the closed meter in the meter set to open.

One of the embodiments of the present disclosure provides a system for controlling a meter, including a meter set including at least one meter associated with each other, a processor connected to each meter in the meter set, and a client terminal connected to the processor, wherein the at least meter in the meter set may be configured to record measurement data of a corresponding resource, respectively, and send the recorded measurement data to the processor; the processor may be configured to receive the measurement data corresponding to a first type of resource from a first meter in the meter set; calculate a current remaining amount of a first type of resource according to the measurement data, historical measurement data of the first meter, and a historical remaining amount of the first type of resource; determine whether the current remaining amount of the first type of resource is greater than a preset available amount of the first type of resource, wherein, if the current remaining amount of the first type of resource is not greater than the preset available amount of the first type of resource, controlling a valve of at least one meter in the meter set to be closed; freeze or unfreeze a smart door lock corresponding to the meter set; send information to a client terminal; receive a control instruction sent by the client terminal; and send the control instructions to the at least one meter in the meter set according to the received control instruction. The client terminal may be configured to receive the information sent by the processor, and send the control instruction to the processor.

One of the embodiments of the present disclosure provides a method for collecting data implemented on a data processing unit, the data processing unit may include a collector or a data processing module inside an electric meter, and the method for collecting data may include obtaining a configuration instruction of data collection; collecting power data of the electric meter according to a preset cycle and the configuration instruction of data collection; compressing and storing of the collected power data; uploading the stored power data to a server when a preset upload condition is satisfied.

In some embodiments, performing data compression on the collected power data may include performing byte compression on the collected power data to obtain intermediate data; determining a continuous data group whose numerical value change of two adjacent data is within a preset value from the intermediate data; processing the data group according to a preset data processing rule to obtain compressed data, wherein, the preset data processing rule may include converting the data group to a data group including the first data in the data group and the number of no changes, wherein the number of no changes may include the value of the total number of data in the data group minus one.

In some embodiments, performing byte compression on the collected power data to obtain intermediate data may include deleting the end value of each power value of the power data to obtain the data to be processed; and converting the format of each power value of the data to be processed into a preset format to obtain intermediate data.

In some embodiments, the configuration instruction of data collection may include data collection frequency and data collection time. Correspondingly, collecting the power data of the electric meter in a preset time period according to the configuration instruction of data collection may include collecting the power data of the electric meter at regular time intervals during the data collection time period according to the data collection frequency.

In some embodiments, the configuration instruction of data collection may include data upload frequency or data upload volume. Correspondingly, uploading the stored power data to the server when satisfying a preset upload condition may include uploading the collected power data to the server when the upload time corresponding to the data upload frequency is satisfied, or when the data volume of the stored power data of the electric meter is greater than the data upload volume.

One of the embodiments of the present disclosure provides a method for collecting data implemented on a server, including generating a configuration instruction of data collection, wherein the configuration instruction of data collection may include a data collection frequency, a data collection time, and function switch information, the function switch information may be the information about whether a data processing unit turns on a collection function of power data; sending the configuration instruction of data collection to the data processing unit by remote issuing.

One of the embodiments of the present disclosure provides a device for collecting data implemented on a data processing unit, the data processing unit may include a collector or a data processing module inside an electric meter, and the device for collecting data may include an instruction obtaining module configured to obtain a configuration instruction of data collection; a data collecting module configured to collect power data of the electric meter according to a preset cycle and the configuration instruction of data collection; a data processing module configured to process and store the collected power data; a data uploading module configured to upload the stored power data to a server when a preset upload condition is satisfied.

In some embodiments, a data processing module may include a data compressing sub-module configured to perform byte compression on the collected power data to obtain intermediate data; a data selecting sub-module configured to determine a continuous data group whose numerical value change of two adjacent data is within a preset value from the intermediate data; a data processing sub-module configured to process the data group according to the preset data processing rule to obtain compressed data, wherein, the preset data processing rule may include converting the data group into a data group including the first data in the data group and the number of no changes, wherein the number of no changes may include the total number of data in the data group minus one.

In some embodiments, a data compressing sub-module may include a deleting unit configured to delete the end value of each power value of the power data to obtain the data to be processed; and a format converting unit configured to convert the format of each power value of the data to be processed into a preset format to obtain intermediate data.

In some embodiments, a configuration instruction of data collection may include data collection frequency and data collection time. Correspondingly, the data collecting module may include a data collecting sub-module configured to collect power data of the electric meter at regular time intervals according to the data collection frequency during the data collection time period.

One of the embodiments of the present disclosure provides a storage medium, wherein the storage medium may include a stored program, and the data collecting method mentioned above may be executed when the program is running.

One of the embodiments of the present disclosure provides a processor configured to run a program, wherein the data collecting method mentioned above may be executed when the program is running.

One of the embodiments of the present disclosure provides a method for detecting an abnormal state of a renting house, including obtaining state indication information sent by a smart device corresponding to the renting house; determining whether the renting house is in an abnormal state according to a rental state of the renting house and the state indication information sent by the smart device corresponding to the renting house. The smart device corresponding to the renting house may include at least a smart door lock, a smart meter, and the state indication information may be configured to indicate the usage record information of the smart device.

In some embodiments, a smart device may include a smart door lock and a smart meter, and the state indication information may include door opening and closing record information and electricity consumption record information. Determining whether the rental house is in an abnormal state according to the rental state of the renting house and the state indication information sent by the smart device corresponding to the renting house including determining whether the number of opening times of the renting house within the first preset duration is greater than the first preset number of opening times according to the door opening and closing record information if the renting house is in an unregistered rental state, and determining whether the electricity consumption within a preset duration of the renting house is greater than the first preset electricity consumption according to the electricity consumption record information of the renting house; and confirming that the renting house is in an abnormal state if the number of times the renting house opening doors within the first preset duration is greater than the first preset number of opening times, and the electricity consumption of the renting house within the first preset duration is greater than the first preset electricity consumption.

In some embodiments, a smart device may further include a smart meter in a public area where the renting house is located. The state indication information may include door opening and closing record information, electricity consumption record information, door lock password state information, and electricity consumption record information of the public area where the renting house is located, A method for detecting an abnormal state of a renting house may also include determining whether the renting house is in an abnormal state according to a preset rule based on the rental state of the renting house, the state information of the door lock password, the electricity consumption record information of the renting house, and the electricity consumption record information of the public area.

In some embodiments, determining whether the renting house is in an abnormal state according to the rental state of the renting house, the door lock password state information, the electricity consumption record information of the renting house, and the electricity consumption record information of the public area including determining whether the renting house is in arrears according to the state information of the door lock password and the electricity consumption record information of the renting house if the renting house is in the registered rental state. If the renting house is in arrears, determining whether the public area where the renting house is located in a second preset duration is greater than a second preset electricity consumption according to the electricity record information of the public area; and confirming the renting house is in an abnormal state if the electricity consumption of the public area where the renting house is located during the second preset duration is greater than the second preset electricity consumption.

In some embodiments, determining whether the renting house is in arrears according to the door lock password state information and the electricity consumption record information of the renting house may include determining whether the door lock password is frozen; determining the renting house is in arrears if the door lock password is frozen; or determining whether the power supply of the renting house is in a power-off state according to the electricity consumption record information of the renting house; and confirming the renting house is in arrears if the power supply of the renting house is in a power-off state.

In some embodiments, a method for detecting an abnormal state of a renting house may further include sending warning information indicating the abnormal state of the renting house to the owner of the renting house when the renting house is confirmed to be in an abnormal state; and/or, sending warning information indicating that the renting house is in an abnormal state to the operator of the renting house.

One of the embodiments of the present disclosure provides a device for detecting an abnormal state of a renting house including an information obtaining unit configured to obtain state indication information sent by a smart device corresponding to the renting house, wherein the smart device corresponding to the renting house may include at least a smart door lock and a smart meter, and the state indication information may be configured to indicate usage record information of the smart device; a first determining unit configured to determine whether the renting house is in an abnormal state according to the rental state of the renting house and the state indication information sent by the smart device corresponding to the renting house.

In some embodiments, a smart device may include a smart door lock and a smart meter, and the state indication information may include door opening and closing record information and electricity consumption record information. When the first determining unit determines whether the renting house is in an abnormal state according to the rental state of the renting house and the state indication information sent by the smart device corresponding to the renting house, it is specifically applied that determining whether the number of opening times of the renting house within the first preset duration is greater than the first preset number of opening times according to the door opening and closing record information if the renting house is in the unregistered rental state, and determining whether the electricity consumption of the renting house during the first preset duration is greater than the first preset electricity consumption; and confirming the renting house is in an abnormal state if the number of opening times of the renting house in the first preset duration is greater than the preset number of door opening times and the electricity consumption of the renting house within the first preset duration is greater than the first preset electricity consumption.

In some embodiments, a smart device may further include a smart meter in the public area where the renting house is located. The state indication information may also include door lock password state information and the electricity consumption record information of the public area where the renting house is located. A device for detecting an abnormal state of the renting house may further include a second determining unit configured to determine the rental state of the renting house, the state information of the door lock password, the electricity consumption record information of the renting house, and the electricity consumption of the public area, and determining whether the renting house is in an abnormal state according to a preset rule.

In some embodiments, a device for detecting an abnormal state of a renting house may further include an information sending unit configured to send warning information indicating that the renting house is in an abnormal state to the owner of the renting house when the renting house is confirmed to be in an abnormal state; and/or, send warning information indicating that the renting house is in an abnormal state to the operator of the renting house.

One of the embodiments of the present disclosure provides a storage medium, wherein the storage medium may include a stored program, and a method for detecting an abnormal state of a rental house may be executed when the program is running.

One of the embodiments of the present disclosure provides a processor, wherein the processor may be configured to run a program, and a method for detecting an abnormal state of a rental house may be executed when the program is running.

BRIEF DESCRIPTION OF THE DRAWINGS

The present disclosure may be further illustrated in terms of exemplary embodiments. These exemplary embodiments may be described in detail with reference to the drawings. The embodiments may not be restrictive. In the embodiments, the same numbers represent the same structures, wherein.

DETAILED DESCRIPTION

Figure 1:
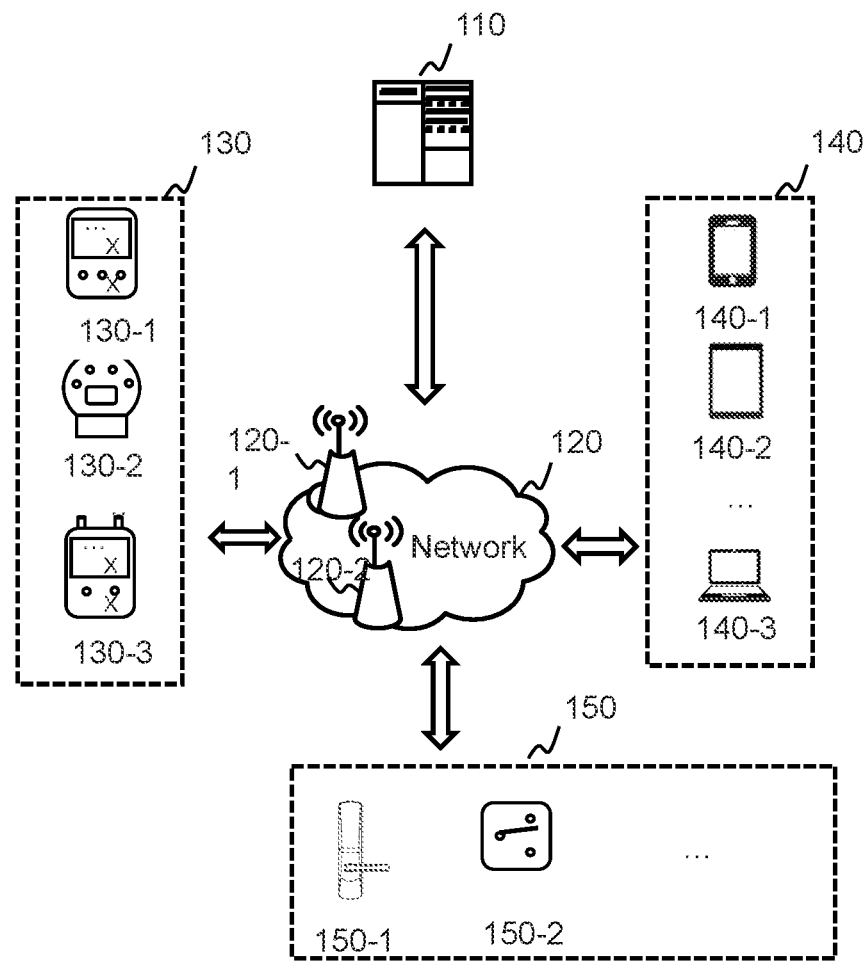
FIG. 1 is a diagram illustrating a system for managing and controlling resources according to some embodiments of the present disclosure.

To describe the technical solutions of the embodiments of the present disclosure clearly, the following may introduce the drawings illustrated in the description of the embodiments briefly. The drawings in the following description may be some examples or embodiments of the present disclosure. For those ordinary skilled in the art, the present disclosure may be applied to other similar scenarios based on these drawings without creative work. Unless obtained from the context or the context illustrates otherwise, the same numbers in the drawings may refer to the same structure or operation.

It should be understood that the "system", "device", "unit" and/or "module" used herein may be a method for distinguishing different components, elements, parts, or assemblies of different levels. However, if other words may achieve the same purpose, the words may be replaced by other expressions.

As used in the disclosure and the appended claims, the singular forms "a," "an," and "the" may include plural referents unless the content dictates otherwise. Generally speaking, the terms "comprise" and "include" may only suggest that the steps and elements that have been clearly identified may be included, and these steps and elements do not constitute an exclusive list, and the method or device may also include other steps or elements.

A flowchart is used in the present disclosure to illustrate the operations performed by the system according to the embodiments of the present disclosure. It should be understood that the preceding or following operations may not be necessarily performed exactly in order. Instead, the steps may be processed in reverse order or simultaneously. At the same time, other operations to these processes may be added, or a step or several operations from these processes may be removed.

FIG. 1 is a diagram illustrating a system for managing and controlling resources according to some embodiments of the present disclosure.

A resource management and control system 100 may be configured to control and manage energy meters such as electric meters, water meters, and gas meters in various production and living areas, such as residential houses, office buildings, factories, schools, hospitals, hotels, rental houses, etc. For example, the system 100 may obtain usage data of energy resources, such as water, electricity, gas, etc., in a jurisdiction area, obtain remaining records of a meter associated with remaining energy resources, the recharge of the meter, or control the meter based on the remaining records, etc. In some embodiments, the system 100 may also determine states of the places where the meters and/or other smart devices are located based on data information obtained from the meters and/or other smart devices, and control the places. As shown in FIG. 1, the resource management and control may include at least a server 110 (processor), a meter 130, a client terminal 140 (user terminal), a smart device 150, and a network 120.

The server (processor) 110 may process data and/or information related to the control of the meter 130 to perform one or more functions described in the present disclosure. For example, the server 110 may obtain the electricity consumption and power data of a smart electric meter, analyze the electricity consumption of a user, and ensure the safety of the electricity consumption of the user. The server 110 may also obtain data of a smart water meter, control the smart water meter according to the data, or prompt a user to recharge. The server 110 may also control the opening or closing of a meter. For example, the server 110 may obtain the remaining electricity of the smart electric meter, and control the smart electric meter to open or close according to the remaining electricity. As another example, the server 110 may also recharge one or more meters and update the remaining records of one or more meters based on the recharge instructions of the user. The server 110 may also process data and/or information related to the control of the smart device 150 to perform one or more functions described in the present disclosure. For example, the server 110 may also obtain the remaining rent of a house and control one or more smart devices and/or meters in the house according to the remaining rent. For example, the server 110 may also control the opening or closing of a door lock according to the remaining electricity of the smart electric meter. The server 110 may also control the smart device 150 according to data of a plurality of meters such as smart electric meters, smart water meters, and smart gas meters. In some embodiments, the server 110 may be a single server or a server group. The server group may be centralized or distributed (e.g., the server 110 may be a distributed system). In some embodiments, the server 110 may be local or remote. For example, the server 110 may access the meter 130, the client terminal 140, and the smart device 150 through the network 120. As another example, the server 110 may be directly connected to the meter 130, the client terminal 140, and the smart device 150 to access stored information and/or data. In some embodiments, the server 110 may be implemented on a cloud platform. For example, the cloud platform may include private cloud, public cloud, hybrid cloud, community cloud, distributed cloud, inter-cloud, multiple clouds, etc., or any combination of the examples mentioned above. In some embodiments, the server 110 may be implemented on a computing device. In some embodiments, the server 110 may be implemented on a mobile device.

The network 120 may be configured for the exchange of information and/or data. One or more components (server 110, meter 130, client terminal 140, smart device 150) in the system may send information/data to other components through the network 120. For example, the server 110 may obtain data information from the meter 130 or the smart device 150 through the network 120. The server 110 may send the prompt information to the client terminal. In some embodiments, the network 120 may be any one or a combination of a wired network or a wireless network. For example, the network 120 may include a cable network, a wired network, an optical fiber network, a telecommunication network, an intranet, an Internet, a local area network (LAN), a wide area network (WAN), a wireless local area network (WLAN), a metropolitan area network (MAN), a public switch telephone network (PSTN), General Packet Radio Network (GPRS), Mobile Phone Network, Bluetooth Network, ZigBee Network, Near Field Communication Network (NFC), Narrowband Internet of Things (NB-IoT/LoRa), etc., or any combination of the examples mentioned above. In some embodiments, the network 120 may include one or more network access points. For example, the network 120 may include wired or wireless network access points, such as base stations and/or Internet exchange points 120-1, 120-2, or the like. Through the access point, one or more components of the system 100 may be connected to the network 120 to exchange data and/or information.

The meter 130 may be configured to record usage data of corresponding resources, remaining records, and to perform control operations such as opening and closing of valves. In some embodiments, the meter 130 may be a smart electric meter, a smart water meter, a smart gas meter, or the like. In some embodiments, the meter 130 may include one or more meters, for example, a smart electric meter, or a smart electric meter and a smart water meter, or a plurality of smart electric meters. In some embodiments, the server 110 may automatically control at least one meter of the plurality of meters 130 to perform closing or opening of a value according to monitoring information. For example, the remaining usage record of the meter 130 may be collected, and when the remaining usage of a certain resource is less than 0, the server 110 may control the corresponding meter to close or control the corresponding meter or other meters to close at the same time. In some embodiments, each meter may have a serial number, location information, state information, or the like. In some embodiments, the meter 130 may send the recorded data to the server 110 via the network 120. The meter 130 may close the valve according to an instruction sent by the server 110. After the meter 130 closes the valve, the supply of corresponding resources may be interrupted, or the connection with the network 120 may be interrupted. After the meter 130 opens the valve, the corresponding resources may be supplied or the connection with the network 120 may be established. The meter 130 may be provided with an independent communication module, and perform data transmission with the server 110 or the client terminal 140 through the communication module. For example, the meter 130 may communicate with the client terminal 140 to complete the recharge and payment. The meter 130 may feedback the recharge result to the client terminal 140 or the server 110, and receive an instruction from the server 110 to open the valve. In some embodiments, the communication module may be implemented based on a cable network, wired network, optical fiber network, telecommunication network, intranet, Internet, local area network (LAN), wide area network (WAN), wireless local area network (WLAN), metropolitan area network (MAN)), Public Switched Telephone Network (PSTN), General Packet Radio Network (GPRS), Mobile Phone Network, Bluetooth Network, ZigBee Network, Serial Communication Network, Near Field Communication (NFC) Network, Narrowband Internet of Things (NB-IoT/LoRa), etc. or the communication function of any combination of the examples mentioned above.

The client terminal (user terminal) 140 may be a user terminal of the owner or user of the house where the meter 130 is installed. For example, the client terminal may be a user terminal of a hotel manager, or a user terminal of a landlord who rents a house, or a user terminal of a house occupant. The client terminal 140 may receive information or data sent by the meter 130, the server 110, and the smart device 150 via the network 120. For example, the client terminal 140 may receive, from the server 110, the prompt information that needs to be recharged. The client terminal 140 may receive, from the meter 130, the information that the valve has been closed. The client terminal 140 may be configured to display the record data of the resource management and control system 100, the working state of each meter 130 and the smart device 150, the recharge record, and other related information. The client terminal 140 may also be configured to recharge and pay the meter 130 directly or through the server, and receive the recharge result fed back by the server 110 or the meter 130 in the system 100. The client terminal 140 may also be configured to control the meter 130 or the smart device 150 in the system 100. In some embodiments, the client terminal 140 may include but is not limited to, a desktop computer, a laptop computer, a smart smartphone, a personal digital assistant (PDA), a tablet computer, a handheld game console, smart glasses, a smartwatch, a wearable device, a virtual display device, a handheld game player, etc., or any combination thereof.

The smart device 150 may be a device in a house. In some embodiments, the smart device 150 may include but is not limited to an electrical equipment such as door locks, electrical switches, televisions, air conditioners, etc. The smart device 150 may receive instructions from the server 110 and/or the client terminal 140 and execute the instructions. For example, a door lock may receive an instruction from the server 110 and be closed or opened based on the instruction. In some embodiments, the smart device 150 may also feed back the working state to the server 110. For example, the smart device 150 may feed back the state that the door lock has been opened or closed to the server 110.

In some embodiments, the server 110, the meter 120, the client terminal 140, and the smart device 150 may each be provided with a storage device. An independent storage device may also be provided in the system 100 for storing data and/or instructions. In some embodiments, the storage device may include mass memory, removable memory, volatile read-write memory, read-only memory (ROM), etc., or any combination of the examples mentioned above. Exemplary mass storage devices may include magnetic disks, optical disks, solid-state drives, or the like. Exemplary removable storage may include flash disks, floppy disks, optical disks, memory cards, compact hard disks, magnetic tapes, or the like. An exemplary volatile read-only memory may include random access memory (RAM). Exemplary random access memory may include dynamic random access memory (DRAM), dual data rate synchronous dynamic random access memory (DDR-SDRAM), static random access memory (SRAM), thyristor random access memory (T-RAM), zero capacitance memory (Z-RAM)), etc. Exemplary read-only memory may include masked read-only memory (MROM), programmable read-only memory (PROM), erasable programmable read-only memory (EPROM), electrically erasable programmable read-only memory (EEPROM), compact hard disk read-only memory (CD-ROM), digital multi-function hard disk read-only memory, etc. In some embodiments, the storage device may also be implemented on a cloud platform. For example, the cloud platform may include private cloud, public cloud, hybrid cloud, community cloud, distributed cloud, inter-cloud, multiple clouds, etc., or any combination of the examples mentioned above.

In some embodiments, the system 100 may also include a data processing device, which may be used as a network device in the network 120 to implement data communication among the server 110, the meter 130, the client terminal 140, and the smart device 150.

In some embodiments, a data processing device may include a data processing module 101, a gateway controlling module 102, and a wireless communicating module 103. The gateway controlling module 102 may be configured to communicate with the server 110 and/or the client terminal 140 based on a first communication protocol, for example, receiving downlink data of the server 110 and/or the client 140 and sending data inside the device to the server 110 and/or the client terminal 140, transferring or distributing data in the internal communication. The first communication protocol may be a TCP/IP protocol. The data processing module 101 may be configured to implement the control of the related business logic of the meter and/or of the smart device. For example, the data processing module 101 may determine the identification or operation instructions that the meter and/or smart device may recognize based on output data of the gateway controlling module 102. As another example, the data processing module 101 may also receive data related to the meter 130 and/or the smart device 150 transmitted by the wireless communicating module 103 (e.g., state data, results of executing operation instructions, etc.), and transmit the data to the gateway controlling module 102 after encapsulation. The wireless communicating module 103 may be configured for data communication with the meter 130 and/or the smart device 150 based on a second communication protocol. In some embodiments, the second communication protocol may be a protocol based on serial communication, ZigBee communication, Bluetooth communication, near field communication, or narrowband Internet of Things (NB-IoT/LoRa) communication.

In some embodiments, the data processing module 101 in the data processing device may be omitted, whose functions may be implemented by the wireless communicating module. For example, the wireless communicating module 103 may directly obtain data from the gateway controlling module 102, obtain identification or operation instructions from the gateway controlling module 102, convert them into an identification or operation instruction that may be recognized by the meter and/or smart device, and directly send the operation instruction to a target meter and/or smart device, thus the meter and/or smart device may perform corresponding operations.

Figure 2:
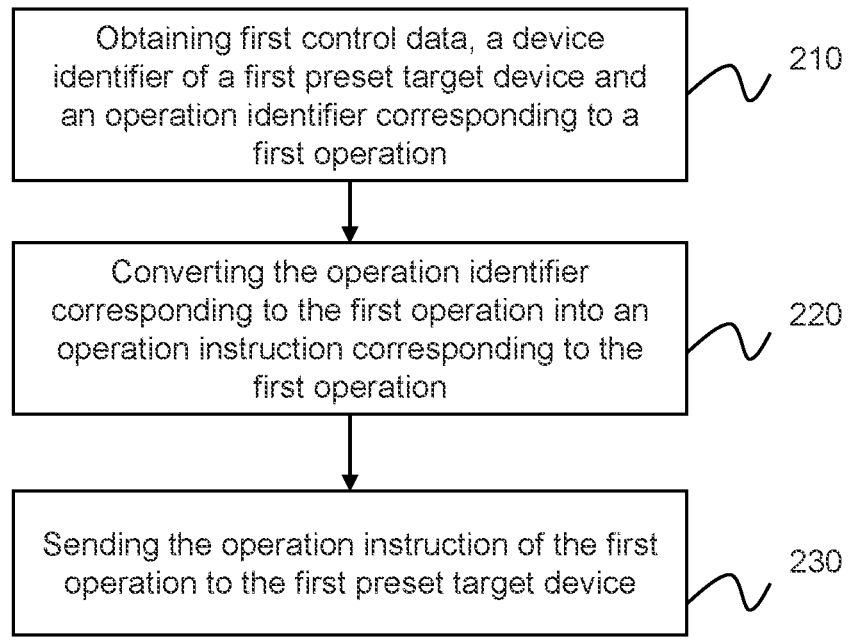
FIG. 2 is an exemplary flowchart illustrating a process for processing data according to some embodiments of the present disclosure.

The present disclosure also provides a data processing method to implement data communication between the server 110 and/or the client 140 with the meter 130 and/or the smart device 150. FIG. 2 is an exemplary flowchart illustrating a process for processing data according to some embodiments of the present disclosure. In some embodiments, one or more steps of the process 200 may be implemented on a data processing device, including.

Step 210, obtaining first control data and obtaining a device identifier of a first preset target device and an operation identifier corresponding to a first operation based on the first control data. In some embodiments, step 210 may be implemented by the gateway controlling module 102.

In some embodiments, the gateway controlling module 102 may obtain the first control data by communicating with the server 110 and/or the client terminal 140 based on a first communication protocol. In some embodiments, the first control data may be encapsulated according to the first communication protocol and may be configured to control the first preset target device to perform the first operation. For example, the first control data may include the device identifier of the first preset target device and the operation identifier corresponding to the first operation. The first preset target device may be at least one of the meter 130 or the smart device 150. Specifically, the first preset target device may be one or more electric meters, water meters, gas meters, door locks, equipment switches, or the like, or a combination thereof. The first operation may be operations such as an opening operation, a closing operation, a recharging operation, an operation for changing power values, an operation for disconnecting a switch, an operation for closing a switch, or an operation for collecting data. In some embodiments, the gateway controlling module may parse the first control data to obtain the device identifier of the first preset target device and the operation identifier corresponding to the first operation, and the device identifier of the preset target device and the operation identifier corresponding to the first operation may be encapsulated into a first data packet according to a preset data format and transmitted to the data processing module 101. In some embodiments, the device identifier may be a communication address of the device.

Step 220, converting the operation identifier corresponding to the first operation into an operation instruction. In some embodiments, Step 220 may be implemented by the data processing module 101.

In some embodiments, the data processing module 101 may receive the first data packet, obtain the device identifier of the first preset target device and the operation identifier corresponding to the first operation from the first data packet, and convert the operation identifier corresponding to the first operation into an operation instruction corresponding to the first operation based on a preset rule, the device identifier of the first preset target device and the operation identifier corresponding to the first operation. In some embodiments, the data processing module 101 may replace the operation identifier corresponding to the first operation in the first data packet with the operation instruction to obtain a second data packet. The second data packet may be transmitted to the wireless communicating module 103 through the gateway controlling module 102.

Step 230, sending the operation instruction of the first operation to the first preset target device based on the device identifier of the first preset target device and the operation instruction of the first operation. In some embodiments, Step 230 may be implemented by the wireless communicating module 103.

In some embodiments, the wireless communicating module 103 may receive the second data packet, and extract the device identifier of the first preset target device and the operation instruction of the first operation from the second data packet. In some embodiments, the device identifier of the first preset target device may be the communication address of the first preset target device. The wireless communicating module 103 may send the operation instruction to the first preset target device based on the communication address to complete the specified operation. In some embodiments, the wireless communicating module 103 may send the operation instruction to the first preset target device based on a second communication protocol.

It should be noted that the descriptions of process 200 may be only for examples and illustrations and do not limit the scope of the present disclosure. For those skilled in the art, various modifications and changes may be made to process 200 under the guidance of the present disclosure. However, the amendments and changes may be still within the scope of the present disclosure. For example, step 220 and step 230 may be integrated into one single operation and implemented by the wireless communicating module 103.

Figure 3:
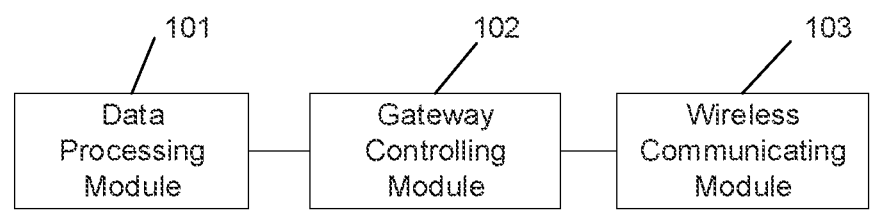
FIG. 3 is a diagram illustrating a data processing device according to some embodiments of the present disclosure.

FIG. 3 is a diagram illustrating a data processing device according to some embodiments of the present disclosure. In some embodiments, the data processing device may include a gateway controlling module 102, a data processing module 101, and a wireless communicating module 103. The data processing module 101 may be a collector module, and the wireless communicating module 103 may be a Zigbee wireless module of the Zigbee protocol.

The functions of the gateway controlling module 102, the data processing module 101, and the wireless communicating module 103 may be described as follows.

The gateway controlling module may be configured to receive a first control data issued by a server and/or a client terminal for controlling a first preset target device to perform a first operation, generate a first data packet including the first control data, send the first data packet to the data processing module, receive a second data packet sent by the data processing module, and send the second data packet to the wireless communicating module.

The data processing module may be configured to receive the first data packet, analyze the first data packet to obtain a target device operation instruction corresponding to the first operation, generate the second data packet including the target device operation instruction, and send the second data packet to the gateway controlling module. In some embodiments, the data processing module may parse the first data packet to obtain the target device operation instruction corresponding to the first operation, convert the target device operation instruction into a recognizable operation instruction of the target device inside the device, and replace the original target device operation instruction corresponding to the first operation in the first data packet with the recognizable operation instruction to obtain the second data packet.

The wireless communicating module may be configured to parse the target device operation instruction from the second data packet, and send the target device operation instruction to the first preset target device to make the first preset target device perform the first operation.

In some embodiments, the data processing module may be omitted the wireless communicating module may implement functions of the data processing module. For example, the wireless communicating module may directly receive the first data packet output by the gateway controlling module, parse the first data packet to obtain the target device operation instruction corresponding to the first operation, and convert it into the recognizable operation instruction of the target device inside the device. The wireless communicating module may directly send the recognizable operation instruction inside the device to the target device to make the target device perform the corresponding operation.

In the embodiment, the data processing module may analyze the first data packet to obtain the target device operation instruction corresponding to the first operation, which may be equivalent to functioning as a collector module. In the present disclosure, the gateway controlling module, the data processing module, and the wireless communicating module may be integrated, and only one wireless communicating module may be used, which may reduce the wiring and cost.

In addition, the functions of a gateway and a collector may be realized by the data processing device in the embodiments.

In some embodiments, the gateway controlling module may include a gateway center module and a data routing module.

The gateway center module may be configured to receive the first control data issued by the server, determine data in each field of a data packet with a first preset format according to the control data, generate the first data packet based on the data in each field of the data packet with the first preset format, and send the first data packet to the data routing module.

The data routing module may be configured to forward the first data packet to the data processing module or the wireless communicating module, receive the second data packet fed back by the data processing module or the wireless communicating module, and transmit the second data packet to the wireless communicating module.

Figure 4:
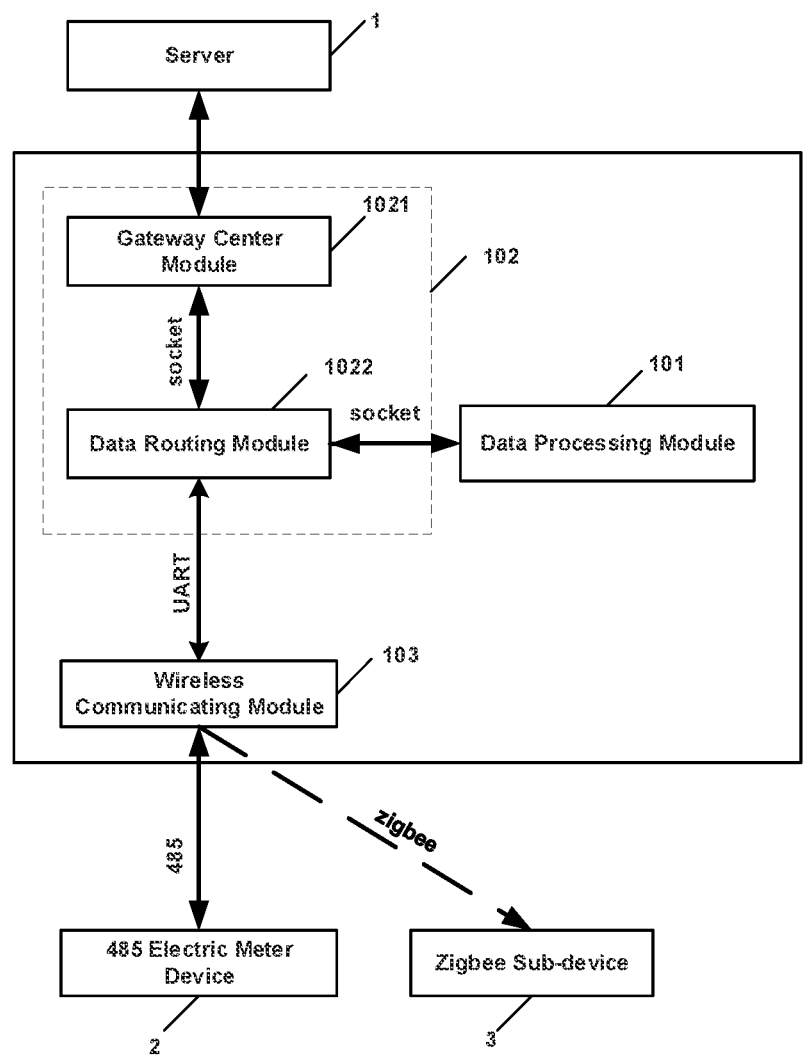
FIG. 4 is a diagram illustrating another data processing device according to some embodiments of the present disclosure.

Specifically, referring to FIG. 4, the entire system may be divided into three parts: a server 1, a data processing device, and one or more preset target devices. The preset target devices may include a first preset target device, such as the 485 meter device 2, and a second preset target device, such as a Zigbee sub-device 3, e.g., a Zigbee electric meter, a Zigbee door lock, a Zigbee refrigerator, or the like.

The data processing device may include a gateway controlling module 102, a data processing module 101, and a wireless communicating module 103. The gateway controlling module 102 may further include a gateway center module 1021 and a data routing module 1022.

The gateway center module 1021 may be configured to process upstream and downstream data of the server and complete the management of a gateway center. The data routing module 1022 may be configured for data transfer and distribution. The data processing module 101 may be configured to control one or more related business logics of the electric meter and the collector. The wireless communicating module 103 may be configured for the transfer and distribution of Zigbee wireless data and control data of the 485 meter device.

The gateway center module 1021, the data routing module 1022, and the data processing module 101 may exist in the data processing device in three independent processes. The gateway center module 1021, the data routing module 1022, and the data processing module 101 may perform cross-process communication through a Unix socket. The gateway center module 1021 may communicate with the server 1 via Ethernet. The data routing module 1022 may communicate with the wireless communication module 103 through the UART serial port of a universal asynchronous receiver transmitter.

Figure 5:
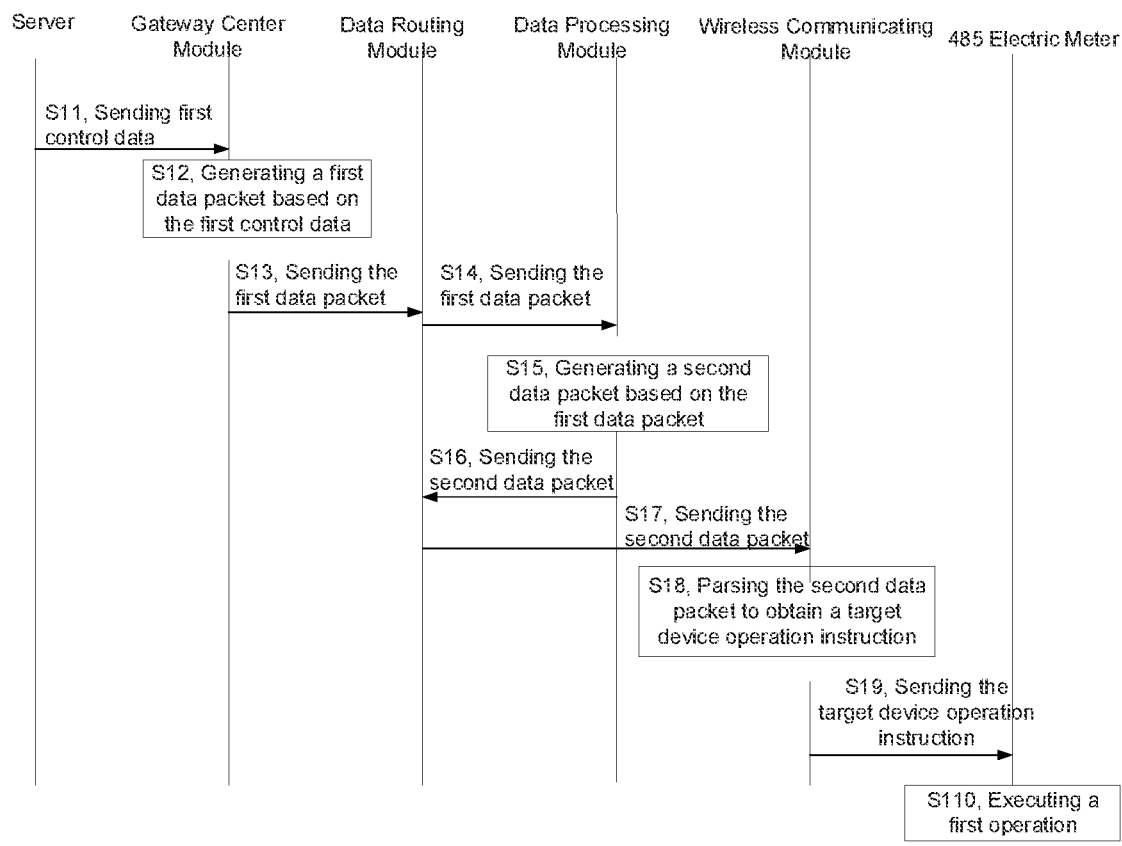
FIG. 5 is a flowchart of a method for processing data implemented on a device according to some embodiments of the present disclosure.

Referring to FIG. 5, in some embodiments, the working process of the server 1, the gateway center module 1021, the data routing module 1022, the data processing module 101, the wireless communicating module 103, and the 485 meter device 2 may include:

S11, the server sending the first control data to the gateway center module;

The server may include a software as a service (SaaS) server and a platform as a service (PaaS) server. The SaaS server may send the first control data to the PaaS server, and the PaaS server may send the first control data to the gateway center module.

The first control data may be configured to control the first preset target device to perform the first operation. The first operation may be a tripping operation, a closing operation, an operation for changing a power value, an operation for collecting data, etc. The first control data may include the device identifier of the first preset target device and the operation identifier corresponding to the first operation.

The working process may include S12, the gateway center module generating the first data packet based on the first control data;

Specifically, the data in each field of the data packet with a first preset format may be determined according to the first control data, and the first data packet may be generated based on the data in each field of the data packet with the first preset format.

The structure of the data packet with the first preset format may be shown in Table 1.

TABLE 1 is a table illustrating the structure of the
data packet with the first preset format.
Data Packet with a first preset format

| 4 bits | 4 bits | 8 bits | 16 bits | 8 bits | N bytes | 8 bits |
|---|---|---|---|---|---|---|
| Data Request Type | Packet Sequence Number | LQI | Destination Address | Payload Length | Payload | XOR |

The data request may be configured to distinguish the type of a data request. The specific content of the type of data request may refer to Table 2.

TABLE 2 a table illustrating the types of data requests.

| Data Request Type | Definition |
|---|---|
| 0x02 | 485 Electric Meter Control Instruction |
| 0x04 | Control Instruction |
| 0x05 | Zigbee Data |

The packet sequence number may represent the sequence number of the data packet and the repeated packet processing may be avoided through the packet sequence number.

LQI may be a link signal quality that may identify Zigbee link information.

The destination address may be a Zigbee short address that may be configured to identify a Zigbee sub-device.

The payload length may be the length of the payload of identification data.

The data payload may be protocol data packets of L1 and L2.

The XOR may be an XOR check digit.

The content of the data load may be the first control data and the content of remaining fields except for the data load in the data packet with the first preset format may be automatically generated by the gateway controlling module.

The first data packet may be obtained after the data in each field of the data packet when the first preset format is determined.

It should be noted that the data before the data load may be considered as an added header and the destination address may be set to 0xFFFE.

The working process may include S13, the gateway center module sending the first data packet to the data routing module;

The working process may include S14, the data routing module sending the first data packet to the data processing module;

The data routing module may include functions of data forwarding and distribution. According to the destination address in the first data packet, the data routing module may determine a device to where the first data packet is sent. Due to the destination address in some embodiments is the first preset target device, the data routing module may be required to send the first data packet to the data processing module for data processing.

The working process may include S15, the data processing module generating a second data packet based on the first data packet;

Specifically, the first data packet may be analyzed to obtain a target device operation instruction corresponding to the first operation, and the second data packet including the target device operation instruction may be generated.

The data payload in the first data packet may carry the operation identifier corresponding to the first operation, and the data processing module may only need to search for the target device operation instruction corresponding to the operation identifier. The second data packet may be generated based on the target device operation instruction. The format of the second data packet may be the same as that of the first data packet, and the specific content of the added header may be different. The added header of the second data packet may be regarded as a 485 header identifier.

The working process may include S16, the data processing module sending the second data packet to the data routing module;

The working process may include S17, the data routing module sending the second data packet to the wireless communicating module;

The data routing module in step S16 and step S17 may be configured to forward the second data packet.

The working process may include S18, the wireless communicating module parsing the second data packet to obtain the target device operation instruction.

Specifically, the 485 header identifier may be removed from the second data packet, and the target device operation instruction may be extracted from the data load.

The working process may include S19, the wireless communicating module sending the target device operation instruction to the 485 meter device;

The working process may include S110, the 485 meter device performing the first operation.

The 485 meter device may be tripped when the first operation is a tripping operation. The 485 meter device may be closed when the first operation is a closing operation, and the 485 meter device may collect meter data when the first operation is collecting data.

In the embodiment, the data processing device may be configured to deliver control information, and the device may be configured to control the first preset target device to perform operations.

Optionally, based on the embodiments, the data processing device may further include the first preset target device. The first preset target device may be a 485 meter device 2. The data processing device may have a built-in first preset target device and may connect to a 485 control chip through the UART port of the wireless communicating module, and access the first preset target device through 485 A/B lines. The data processing device may realize the functions of a gateway, a collector, and an electric meter through the built-in first preset target device.

In addition, a plurality of 485 meters may be connected through 485 A/B lines and the number of connected 485 meters may be equal to or less than 31.

Figure 6:
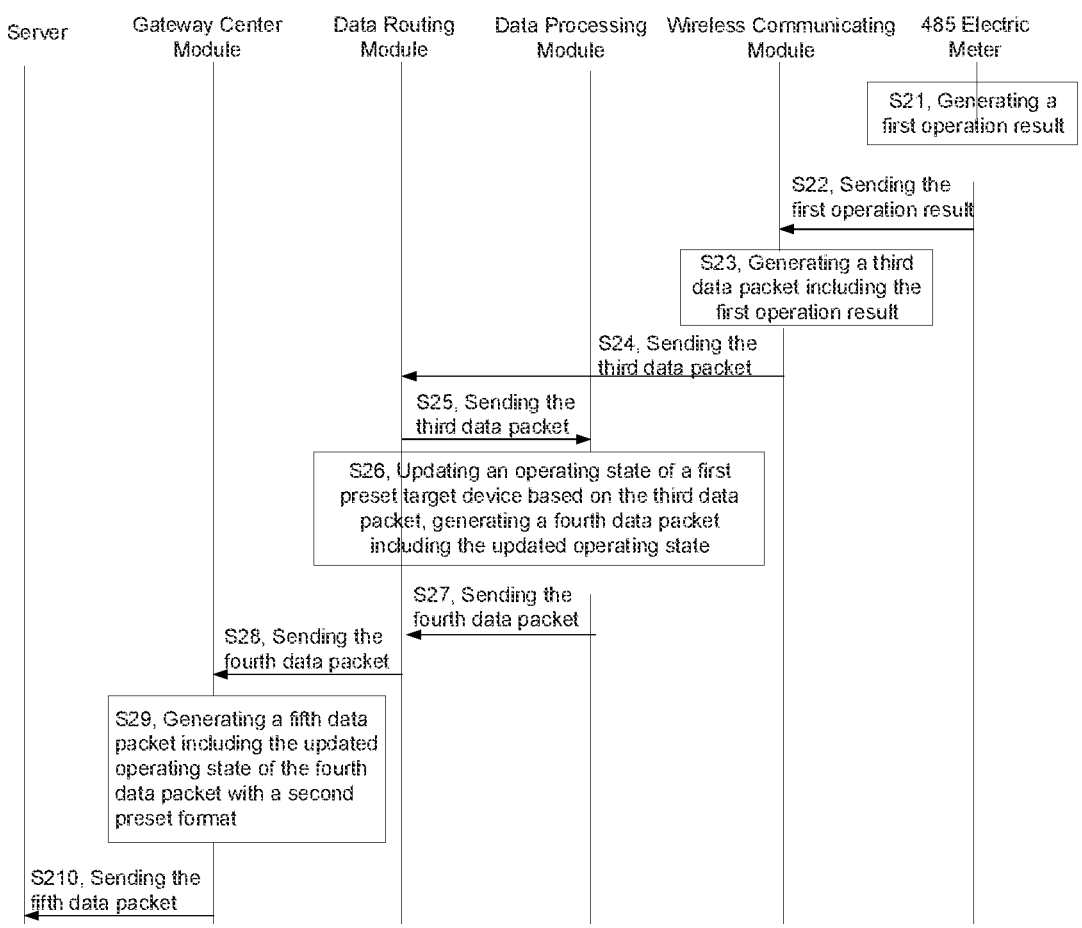
FIG. 6 is a flowchart of another method for processing data implemented on a device according to some embodiments of the present disclosure.

Referring to FIG. 6, in some embodiments, after Step S110 is performed, the working process may further include:

S21, the 485 meter device generating a first operation result;

When the first operation is a tripping operation, the first operation result may be the information indicating that the tripping operation is performed successfully; when the first operation is a closing operation, the first operation result may be the information indicating that the closing operation is performed successfully.

S22, the 485 meter device sending the first operation result to the wireless communicating module;

S23, the wireless communicating module generating a third data packet including the first operation result;

Specifically, the third data packet may have the same format as the first data packet and the second data packet, the wireless communicating module may set the data load in the third data packet as the first operation result, and add the header of the third data packet.

S24, the wireless communicating module sending the third data packet to the data routing module;

S25, the data routing module sending the third data packet to the data processing module;

Due to the data processing module communicates with the wireless communicating module through the data routing module, thus the data routing module may serve as a data transfer.

S26, the data processing module updating a device operating state of the first preset target device according to the third data packet, and generating a fourth data packet including the updated device operating state;

Specifically, the first operation result of the data load in the data packet may be the result of the first operation performed by the 485 electric meter device, and the device operation state of the 485 electric meter device may be updated according to the first operation result. For example, when the first operation is the tripping operation, the first operation result may be the information indicating that the tripping operation is performed successfully, and the data processing module may update the device operation state of the first preset target device to be "tripped."

Hence, the data processing module may generate the fourth data packet according to the updated device operation state. the process of generating the fourth data packet may be the same as the process of generating the third data packet, which may not be repeated herein. The destination address in the fourth data packet may be set to OxFFFE.

S27, the data processing module sending the fourth data packet to the data routing module;

S28, the data routing module sending the fourth data packet to the gateway center module;

S29, the gateway center module generating a fifth data packet with a second preset format including an updated device operation state in the fourth data packet including;

The communication protocol between the gateway center module and the server may be different from the communication protocol inside the data processing device, thus the format of the fifth packet and the fourth data packet may be different. The communication protocol between the gateway center module and the server may be the Transmission Control Protocol/Internet Interconnection Protocol (TCP/IP), and the fifth data packet with the second preset format may be a data packet meeting the requirements of TCP/IP.

S210, the gateway center module sending the fifth data packet to the server.

Specifically, the gateway center module may send the fifth data packet to the server via Ethernet. After the server receives the fifth data packet, the server may update and display the operation state of the first preset target device.

In the embodiment, after the first preset target device executes the first operation, the first preset target device may feed back the execution result of the first operation to the server through the data processing device, thus the server may know the execution result of the first operation.

Figure 7:
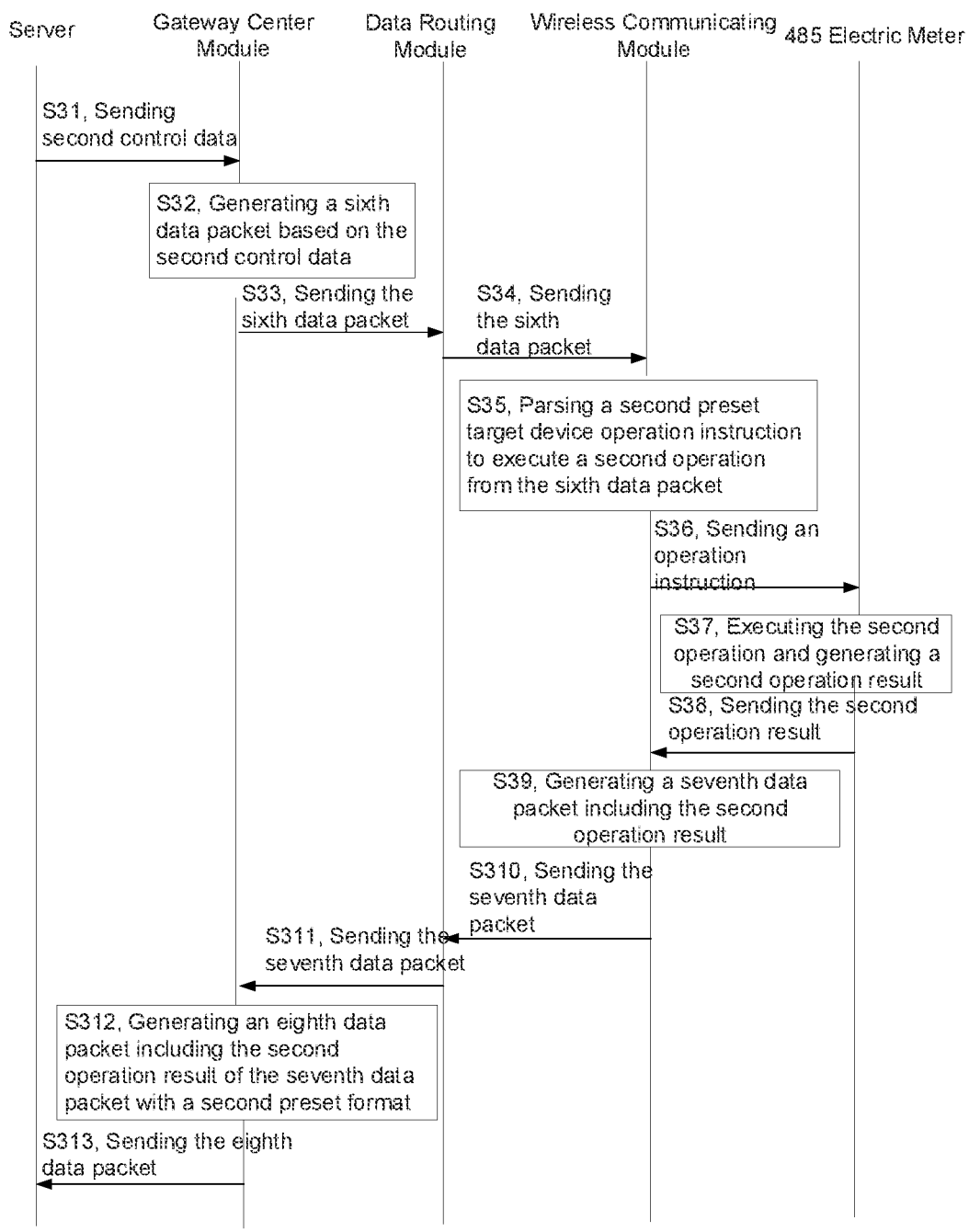
FIG. 7 is a flowchart for a data processing device controlling execution operations of a second preset target device according to some embodiments of the present disclosure.

Optionally, based on the embodiments mentioned above in which the gateway control module may include a gateway center module and a data routing module, referring to FIG. 7, FIG. 7 shows a flowchart for a data processing device controlling execution operations of a second preset target device according to some embodiments of the present disclosure. The second preset target device may be a Zigbee device, such as a Zigbee electric meter, a Zigbee door lock, etc.

S31, the server may send the second control data to the gateway center module;

The second control data may be issued by the server to control the second preset target device to perform the second operation. When the second preset target device is a Zigbee electric meter, the second operation may include a closing operation, a tripping operation, etc. When the second preset target device is a Zigbee door lock, the second operation may include an unlocking operation, a locking operation, etc.

S32, the gateway center module may generate a sixth data packet based on the second control data;

Specifically, the gateway center module may generate the sixth data packet including the second control data. The process of generating the sixth data packet may be the same as the process of generating the first data packet.

S33, the gateway center module may send the sixth data packet to the data routing module;

S34, the data routing module may send the sixth data packet to the wireless communicating module;

S35, the wireless communicating module may parse the sixth data packet to obtain an operation instruction for controlling the second preset target device to perform the second operation.

Specifically, the wireless communicating module may remove the header of the sixth data packet, extract the second control data from the data load, and check the table to determine the operation instruction corresponding to the second control data. The second control data may include the device identifier of the second preset target device and the operation identifier corresponding to the second operation. In the embodiment, the operation instruction corresponding to the operation identifier corresponding to the second operation may be retrieved.

S36, the wireless communicating module may send the operation instruction to the second preset target device;

S37, the second preset target device may execute the second operation and generate a second operation result;

The second preset target device executing the second operation and generating the second operation result may be the same as the process of the first preset target device executing the first operation and generating the first operation result.

S38, the second preset target device may send the second operation result to the wireless communicating module;

S39, the wireless communicating module may generate a seventh data packet including the second operation result;

Specifically, the wireless communicating module generating the seventh data packet may be similar to the process of generating the third data packet, which may refer to the descriptions mentioned above.

S310, the wireless communicating module may send the seventh data packet to the data routing module;

S311, the data routing module may send the seventh data packet to the gateway center module;

S312, the gateway center module may generate an eighth data packet with the second preset format that includes the second operation result in the seventh data packet;

Specifically, the process of generating the eighth data packet may be similar to the process of generating the fifth data packet, which may not be repeated herein.

S313, the gateway center module may send the eighth data packet to the server.

Specifically, the eighth data packet may be sent to the server via the Ethernet, and the server may update and display the operation state of the second preset target device.

In the embodiment, the server may control the Zigbee device to perform operations through the data processing device, further control different types of Zigbee devices to perform operations, and realize the function of binding a plurality of devices with one gateway.

Figure 8:
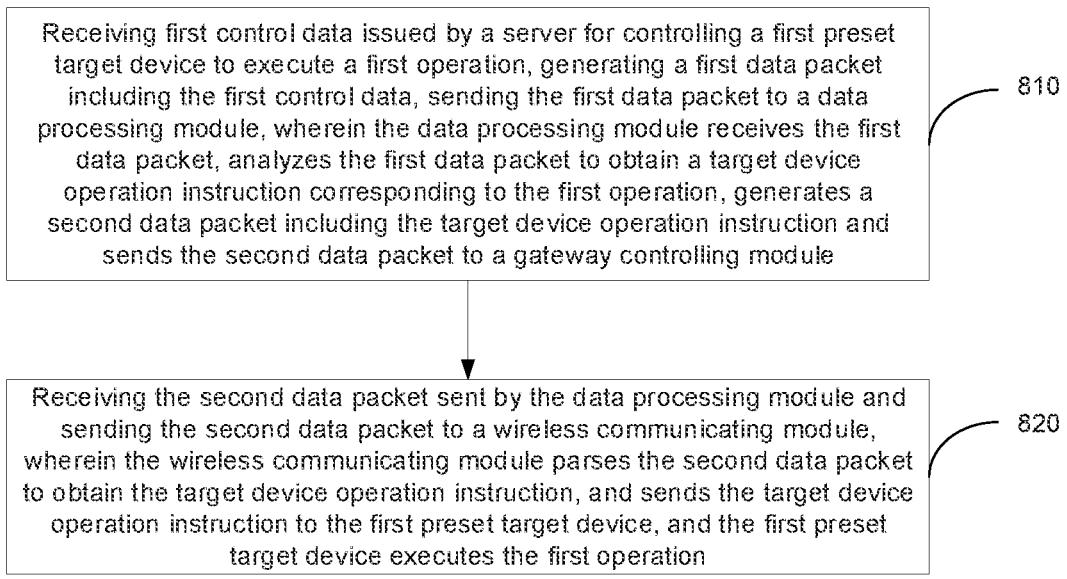
FIG. 8 is a flowchart of a method for processing data implemented on a gateway controlling module according to some embodiments of the present disclosure.

Another aspect of the present disclosure provides a method for processing data, which may be implemented on a gateway control module. Refer to FIG. 8, the method for processing data may include:

Step 810, receiving a first control data issued by the server for controlling a first preset target device to perform a first operation, generating a first data packet including the first control data, sending the first data packet to the data processing module, thus the data processing module may receive the first data packet, analyze and obtain a target device operation instruction corresponding to the first operation from the first data packet, generate a second data packet including the target device operation instruction and send the second data packet to the gateway control module.

Step 820, receiving the second data packet sent by the data processing module and sending the second data packet to the wireless communicating module, thus the wireless communicating module may parse the second data packet to obtain the target device operation instruction, send the target device operation instruction to the first preset target device to direct the first preset target device to execute the first operation.

In the embodiment, the data processing module may analyze the target device operation instruction corresponding to the first operation from the first data packet, which may act as a collector module. In the present disclosure, the gateway control module, the data processing module, and the wireless communicating module may be integrated, and only one wireless communicating module may be used, which may reduce wiring and cost.

It should be noted that the illustrations and descriptions of each step in the embodiment may be referred to the corresponding descriptions in the embodiments as described above, which may not be repeated herein.

Optionally, based on the embodiment of the method for processing data, the receiving the first control data issued by the server for controlling the first preset target device to perform the first operation, generating the first data packet including the first control data, and sending the first data packet to the data processing module may include operations as follows:

The gateway center module may receive the first control data issued by the server, determine the data in each field of the data packet with the first preset format, generate the first data packet based on the data in each field of the data packet with the first preset format, and send the first data packet to the data routing module;

The data routing module may forward the first data packet to the data processing module;

Correspondingly, receiving the second data packet sent by the data processing module and sending the second data packet to the wireless communicating module may include:

the data routing module receiving the second data packet fed back by the data processing module and sending the second data packet to the wireless communicating module.

In the embodiment, the data processing device may realize the control of information distribution, and the data processing device may be configured to control the first preset target device to perform operations.

It should be noted that the illustration and descriptions of each step in the embodiment may be referred to as the corresponding illustration in the embodiments as described above, which may not be repeated herein.

Optionally, based on the previous embodiments, the method for processing data may further include operations as follows:

The method for processing data may further include operations as follows.

The data routing module may receive a third data packet including a first operation result generated by the wireless communicating module. The first operation result may be a result fed back by the first preset target device after performing the first operation;

The data routing module may send the third data packet to the data processing module;

The data routing module may receive and send a fourth data packet to the gateway center module. The fourth data packet may be a data packet including an updated device operation state generated by the data processing module after updating the device operating state of the first preset target device according to the third data packet;

The gateway center module may generate a fifth data packet with a second preset format including the updated operation state of the first preset target device in the fourth data packet and feed back the fifth data packet to the server.

In the embodiment, after the first preset target device executes the first operation, the first preset target device may also feed back the execution result of the first operation to the server through the data processing device, thus the server may know the execution result of the first operation.

It should be noted that the illustration and description of each step in the embodiment may refer to the corresponding descriptions in the embodiments as described above, which may not be repeated herein.

Optionally, based on the embodiment of the second method for processing data, the method for processing data may further include operations as follows:

The gateway center module may receive second control data issued by the server for controlling a second preset target device to perform a second operation, generate a sixth data packet including the second control data, and sending the sixth data packet to the data routing module;

The data routing module may forward the sixth data packet to the wireless communicating module, thus the wireless communicating module may parse the sixth data packet to obtain an operation instruction for controlling the second preset target device to perform the second operation, and send the operation instruction to the second preset target device to direct the second preset target device to execute the second operation.

Further, the data routing module may receive and send the seventh data packet to the gateway center module. The seventh data packet may be a data packet including a second operation result generated by the wireless communicating module receiving the second operation result fed back by the second preset target device after executing the second operation;

The gateway center module may generate an eighth data packet with the second preset format including the second operation result in the seventh packet and feed back the eighth data packet to the server.

In the embodiment, the server may control Zigbee devices to perform operations through the data processing device, control different types of Zigbee devices to perform operations, and realize the function of binding a plurality of devices with one gateway.

It should be noted that the illustration and description of each step in the embodiment may be referred to the corresponding descriptions in the embodiments as described above, which may not be repeated herein.

Figure 9:
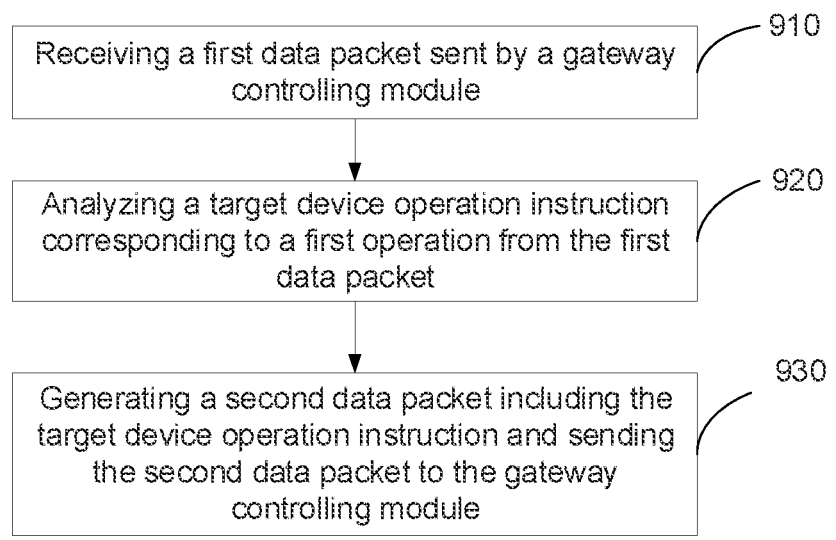
FIG. 9 is a flowchart of a method for processing data implemented on a data processing module according to some embodiments of the present disclosure.

Optionally, based on the embodiments of the methods and devices for processing data, the present disclosure provides a method for processing data, which may be implemented on a data processing module. Referring to FIG. 9, the method may include:

Step 910, receiving a first data packet sent by a gateway control module;

Step 920, analyzing the first data packet to obtain a target device operation instruction corresponding to a first operation;

Step 930, generating a second data packet including the target device operation instruction and sending the second data packet to the gateway control module.

Further, the method may also include:
receiving a third data packet sent by a data routing module in the gateway control module;
updating a device operation state of a first preset target device according to the third data packet, generating a fourth data packet including the updated device operation state, and sending the fourth data packet to the data routing module.

In the embodiment, the data processing module may analyze the target device operation instruction corresponding to the first operation from the first data packet, which may act as a collector module. In the present disclosure, the gateway control module, the data processing module, and the wireless communicating module may be integrated, and only one wireless communicating module may be used, which may reduce wiring and cost.

It should be noted that, the illustrations and descriptions of each step in the embodiment may be referred to the corresponding descriptions in the embodiments described above, which may not be repeated herein.

Optionally, the present disclosure further provides a device for processing data. The data processing device may include a processor and memory. The gateway control module, the data processing module, and the wireless communicating module mentioned above may be all stored as program units in the memory and the processor may execute the program units stored in the memory to realize the corresponding function.

The processor may include a kernel, that is configured to acquire a corresponding program unit from the memory. One or more kernels may be set up in the processor. By integrating the gateway control module, the data processing module, and the wireless communicating module, only one wireless communicating module may be used, which may reduce wiring and cost. The memory may include non-permanent memory in a computer-readable medium, random access memory (RAM), and/or non-volatile memory, such as read-only memory (ROM) or flash memory (flash RAM). The memory may include at least one memory chip.

The embodiment of the present disclosure provides a storage medium that is configured to store one or more programs, and an unlocking method may be performed when the program is executed by a processor.

The embodiment of the present disclosure provides a processor, the processor may be configured to execute a program. The data processing method may be executed when the program is executed.

The embodiment of the present disclosure provides a device. The device may include a processor, a memory, and a program that is stored in the memory and may be executed by the processor. When the processor executes the program, the following steps may be implemented:

A method for processing data performed by a gateway control module may include:
  receiving, issued by the server, first control data for controlling the first preset target device to perform a first operation, generating a first data packet including the first control data, and sending the first data packet to a data processing module. The data processing module may receive the first data packet, analyze the first data packet to obtain a target device operation instruction corresponding to the first operation, generate a second data packet including the target device operation instruction, and sending the second data packet to the gateway control module:

The gateway control module may receive the second data packet sent by the data processing module and send the second data packet to the wireless communicating module. The wireless communicating module may parse the second data packet to obtain the target device operation instruction and send the target device operation instruction to the first preset target device to make the first preset target device execute the first operation.

Further, receiving the first control data issued by the server for controlling the first preset target device to perform the first operation, generating the first data packet including the first control data, and sending the first data packet to the data processing module may include:

the gateway center module receiving the first control data issued by the server, determining the data in each field of the data packet with the first preset format according to the control data, generating the first data packet based on the data in each field of the data packet with the first preset format, and sending the first data packet to the data routing module;

the data routing module transmitting the first data packet to the data processing module;

Correspondingly, receiving the second data packet sent by the data processing module and sending the second data packet to the wireless communicating module may include:

the data routing module receiving the second data packet fed back by the data processing module and sending the second data packet to the wireless communicating module.

Further, the method for processing data may also include:

the data routing module receiving a third data packet including the first operation result generated by the wireless communicating module, wherein the first operation result may be the result fed back by the first preset target device after performing the first operation;

the data routing module sending the third data packet to the data processing module;

the data routing module receiving and sending a fourth data packet to the gateway center module, wherein, the fourth data packet may be a data packet including the updated device operation state generated by the data processing module updating the operation state of the first preset target device according to the third data packet;

the gateway center module generating a fifth data packet with a second preset format including the updated device operation state in the fourth data packet and feed back the fifth data packet to the server.

Further, the method for processing data may also include:

the gateway center module receiving, issued by the server, second control data for controlling a second preset target device to perform the second operation, generating a sixth data packet including the second control data, and sending the sixth data packet to the data routing module;

the data routing module forwarding the sixth data packet to the wireless communicating module. The wireless communicating module may parse the sixth data packet to obtain an operation instruction for controlling the second preset target device to perform the second operation, and send the operation instruction to the second preset target device to make the second preset target device execute the second operation.

Further, the method for processing data may also include:

the data routing module receiving and sending a seventh data packet to the gateway center module, wherein the seventh data packet may be a data packet including a second operation result generated by the wireless communicating module receiving the second operation result fed back by the second preset target device after the second preset target device performs the second operation;

the gateway center module generating an eighth data packet with a second preset format including the second operation result in the seventh data packet and feeding back the eighth data packet to the server.

The devices in the present disclosure may be servers, PCs, PADs, mobile phones, etc.

The present disclosure also provides a computer program product, which may be applied for executing a program that initializes the following steps when the computer program product is executed on a data processing device:

A method for processing data implemented on a gateway control module may include:

Receiving, issued by the server, the first control data for controlling the first preset target device to perform the first operation, generating a first data packet including the first control data, and sending the first data packet to the data processing module, thus the data processing module may receive the first data packet, analyze the first data packet to obtain a target device operation instruction corresponding to the first operation, generate the second data packet including the target device operation instruction and send the second data packet to the gateway control module:

Receiving a second data packet sent by the data processing module and sending the second data packet to the wireless communicating module, thus the wireless communicating module may parse the second data packet to obtain the target device operation instruction, send the target device operation instruction to the first preset target device to direct the first preset target device to execute the first operation.

Further, the receiving, issued by the server, first control data for controlling a first preset target device to perform a first operation, generating a first data packet including the first control data, and sending the first data packet to the data processing module may include:

the gateway center module receiving the first control data issued by the server, determining data in each field of the data packet with the first preset format according to the control data, generating the first data packet with the first preset format based on the data in each field of the data packet, and sending the first data packet to the data routing module;

the data routing module transmitting the first data packet to the data processing module;

Correspondingly, the receiving the second data packet sent by the data processing module and sending the second data packet to the wireless communicating module may include:

the data routing module receiving the second data packet fed back by the data processing module and sending the second data packet to the wireless communicating module.

Further, the method for processing data may also include:

the data routing module receiving a third data packet including a first operation result generated by the wireless communicating module, wherein the first operation result may be a result fed back by the first preset target device after performing the first operation;

the data routing module sending the third data packet to the data processing module;

the data routing module receiving and sending a fourth data packet to the gateway center module, wherein the fourth data packet may be a data packet including the updated device operation state generated by the data processing module after updating the device operation state of the first preset target device according to the third data packet;

the gateway center module generating a fifth data packet with the second preset format including the updated device operation state in the fourth data packet and feeding back the fifth data packet to the server.

Further, the method for processing data may also include:

the gateway center module receiving, issued by the server, second control data for controlling a second preset target device to perform a second operation, and generating a sixth data packet including the second control data, and sending the sixth data packet to the data routing module;

the data routing module forwarding the sixth data packet to the wireless communicating module, thus the wireless communicating module may parse the sixth data packet to obtain an operation instruction for controlling the second preset target device to perform the second operation, and sending the operation instruction to the second preset target device to make the second preset target device execute the second operation.

Further, the method for processing data may also include:

the data routing module receiving and sending a seventh data packet to the gateway center module, wherein the seventh data packet may be a data packet including the second operation result generated by the wireless communicating module receiving the second operation result fed back by the second preset target device after performing the second operation;

the gateway center module generating an eighth data packet with a second preset format including the second operation result in the seventh data packet and feeding back the eighth data packet to the server.

The embodiment of the present disclosure provides a device. The device may include a processor, a memory, and a program implemented on the processor and being stored in the memory. When the processor executes the program, the following steps may be implemented:

A method implemented on the data processing module for processing data may include:

Receiving the first data packet sent by the gateway control module;

Analyzing the first data packet to obtain the target device operation instruction corresponding to the first operation;

Generating the second data packet including the target device operation instruction, and sending the second data packet to the gateway control module.

Further, the method may also include:

Receiving the third data packet sent by the data routing module of the gateway control module;

Updating the device operation state of the first preset target device according to the third data packet, generating the fourth data packet including the updated device operation state, and sending the fourth data packet to the data routing module.

The devices in the present disclosure may be servers, PCs, PADs, mobile phones, etc.

The present disclosure also provides a computer program product that may be suitable for executing a program that initializes the following steps when the computer program product is executed on a data processing device:

A method for processing data implemented on a data processing module may include:

Receiving the first data packet sent by the gateway control module;

Analyzing the first data packet to obtain the target device operation instruction corresponding to the first operation;

Generating the second data packet including the target device operation instruction, and sending the second data packet to the gateway control module.

Further, the method may also include:

Receiving the third data packet sent by the data routing module of the gateway control module;

Updating the device operation state of the first preset target device according to the third data packet, generating the fourth data packet including the updated device operation state, and sending the fourth data packet to the data routing module.

Some embodiments of the present disclosure provide a method for controlling a smart meter. In some embodiments, the server may obtain monitoring information from the meter, analyze and process the monitoring information to determine whether the monitoring information satisfies a preset condition. The server may also obtain relevant time information and determine whether the time information is in a specific time period. The server may control the state of the meter based on a processing result of the monitoring information and related time information. For example, the server may control the meter to close a valve in response to determining that the monitoring information and the related time information both satisfy the preset condition. After receiving the instruction of closing the valve, the meter may close the valve to stop providing resources. For example, the meter may be an electric meter, and when receiving the instruction of closing the valve, the meter may close the valve and stop providing power to an electric device. In some embodiments, the relevant time information may be any time during which the server performs one or more of the operations as described above. For example, the relevant time information may be the time when obtaining the monitoring information or may be the time when the server processes the monitoring information, or the time that the server obtains randomly, or the time that the server obtains t at a certain time interval regularly (e.g., obtaining the time every one hour), or the current time.

Figure 10:
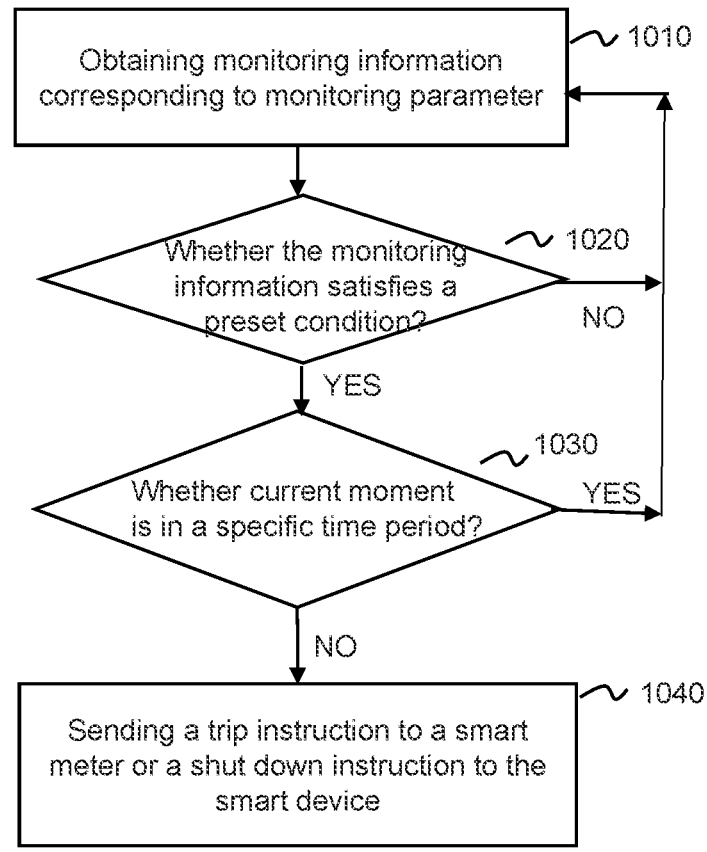
FIG. 10 is a flowchart illustrating an exemplary method for controlling a smart meter according to some embodiments of the present disclosure.

FIG. 10 is a flowchart illustrating an exemplary method for controlling a smart meter according to some embodiments of the present disclosure.

In step 1010, the server may obtain monitoring information corresponding to one or more monitoring parameters. In some embodiments, the monitoring parameters may include but are not limited to resource usage information, such as electricity consumption, rent, water consumption, gas usage, the time length that a house has been rented, etc. In some embodiments, the corresponding monitoring information may be the amounts of resources that have been consumed, for example, the amount of electricity that has been consumed, the amount of water that has been consumed, the amount of gas that has been consumed, the time length that a house has been rented, etc., or remaining resource information, for example, a remaining amount of electricity, a remaining amount of water, a remaining amount of gas, a remaining rent, etc. The remaining rent may be the difference between the prepaid rent and the rent that has been consumed. The rent that has been consumed may be determined by the unit rent price and the time length that a house has been rented. For example, if the house is rented on a daily basis, the rent that has been consumed may be the product of the daily rent and the number of days that have been rented. If the house is rented on an hourly basis, the rent that has been consumed may be the product of the hourly rent and the number of hours that have been rented. In some embodiments, different monitoring parameters may correspond to different monitoring information. For example, if the monitoring parameter is the electricity consumption, the monitoring information may include at least the electricity that has been consumed and/or the remaining amount of electricity; if the monitoring parameter is the house rent, then the monitoring information may include at least the current remaining rent. In some embodiments, different application scenarios may have different monitoring parameters. For example, in an application scenario, to monitor whether the electricity fee of the user in a prepaid mode is in arrears, the corresponding monitoring parameter may be the remaining amount of electricity. In another application scenario, to monitor whether the house rent of the user is in arrears, the corresponding monitoring parameter may be the time length of the house that has been rented.

In step 1020, the server may determine whether the monitoring information satisfies the preset condition. In some embodiments, the monitoring information may be the remaining used resources, for example, a remaining amount of electricity, a remaining amount of water, a remaining amount of gas, a remaining rent, etc. In some embodiments, the preset condition may be whether the remaining amount is less than or equal to zero. For example, the monitoring information may be the remaining amount of electricity, and the preset condition may be whether the remaining amount of electricity is less than or equal to zero. As another example, the monitoring information may be the remaining rent, and the preset condition may be whether the remaining rent is less than or equal to zero. In some embodiments, the server may preset a first threshold, and the preset condition may be whether the remaining amount is less than or equal to the first threshold. The server may also set a second threshold, and the preset condition may be whether the remaining amount is less than or equal to the second threshold and greater than the first threshold. In some embodiments, when the remaining amount is less than or equal to the second threshold and greater than the first threshold, the server may send prompt information to the client terminal of the user. For example, the meter may be an electric meter, the monitoring information may be the remaining amount of electricity, the first threshold may be 0, and the second threshold may be 20 kW·h. When the remaining amount of electricity is less than 20 kW·h and greater than 0, the server may send a message to the user to remind the user that the remaining amount of electricity is small and needs to be recharged as soon as possible. When the remaining electricity is less than 0, the meter may be controlled to close the valve. As another example, the monitoring information may be the remaining rent, the first threshold may be 0, and the second threshold may be a daily rent. When the remaining rent is less than or equal to the daily rent, a prompt message may be sent to the client terminal of the user. When the remaining rent is less than or equal to 0, the smart door lock may be controlled to be closed.

In some embodiments, the remaining amount may be the remaining usage that is calculated when the resource is not allowed to be overdrawn. In some embodiments, the remaining amount may be the remaining usage when the resource is allowed to be overdrawn. For example, when the electricity is not allowed to be used overdraft, the remaining amount of electricity may be the difference between the recharged electricity and the used electricity that has been consumed. If the electricity may be used for an overdraft, the remaining electricity should be calculated by considering the electricity that may be overdrawn. Thus, the remaining electricity may be the sum of the difference between the charged electricity and the electricity that has been consumed and the electricity that may be overdrawn.

In some embodiments, the preset conditions corresponding to different monitoring parameters may be different or the same. For example, if the monitoring parameter is electricity consumption, the preset condition may be whether the current remaining amount of electricity satisfies a preset value, and the preset value may be set according to actual needs. If the monitoring parameter is water consumption, the corresponding preset condition may be whether the current remaining amount of water volume is less than or equal to a water volume threshold that may be set according to actual needs.

In step 1030, whether the relevant time information is in a specific time period may be determined. In some embodiments, the specific time period may be a time period when resources are restricted to be cut off. The time period when resources are restricted to be cut off may be a time period when safety accidents or great inconvenience to people's production and life may be caused after the resource supply is cut off. According to different resource types and/or resource usage scenarios, the time period for limiting the cutting off of resources may be different. For example, for the electric meters of residential houses (including self-owned houses or rented houses), the specific time period may be 20:00~00:00 at night. As another example, for an electric meter in an office building, the specific time period may be from 9:00 to 18:00 during the day. As another example, for a residential gas meter, a specific time period may include a plurality of segments, including but not limited to 7:00~9:00, 11:00~13:00, 17:30~18:30, etc. In some embodiments, if the relevant time information is not in a specific time period, it is determined that the relevant time information satisfies the preset time condition.

In step 1040, an instruction of closing valve may be sent to a smart meter or a closing instruction may be sent to a smart device based on a determining result that the monitoring information satisfies the preset condition and the related time information satisfies the preset time condition. In some embodiments, if the relevant time information is not within the specific time period and the monitoring information satisfies the preset condition, an instruction of closing the valve may be sent to the smart meter, and the smart meter may execute the instruction of closing the valve to turn off the power after receiving the instruction of closing the valve. Or, a closing instruction may be sent to the smart device to close the corresponding smart device.

In some embodiments, the server may store the closed or open state information of the meter. When the meter is in the closed state and receives recharge completion information, the server may send an open instruction to the meter and update the open state. In some embodiments, the server may store closed or open state information of the smart device. When the smart device is in the closed state and receives the recharge completion information, it may send an open instruction to the smart device and update the open state.

In some embodiments, the sequence of step 620 and step 630 may not be limited. For example, step 630 may be performed first, and then step 620 may be performed; or step 620 may be performed first, and then step 630 may be performed; or step 620 and step 630 may be performed in parallel.

A method for controlling a smart meter provided in the embodiment may obtain monitoring information, calculate the current remaining amount of the meter according to the monitoring information: determine whether the current remaining amount is less than or equal to the first threshold if the current remaining amount of electricity is less than or equal to the first threshold and the relevant time information is within a specific time period, the smart meter may not be controlled to turn off the value to stop power supply, and continue to monitor the remaining amount of electricity corresponding to the smart meter; if the current remaining amount of electricity is less than or equal to the first threshold and the relevant time information is not within a specific time period, the smart meter may be controlled to turn off the value to stop supply the power. The method may turn off the value to stop the power supply when the recharge of the user and the allowable overdraft run out and avoid the inconvenience in the daily life of the user caused by closing the valve during the time period when the user must use the resource to improve the experience of the user.

Figure 11:
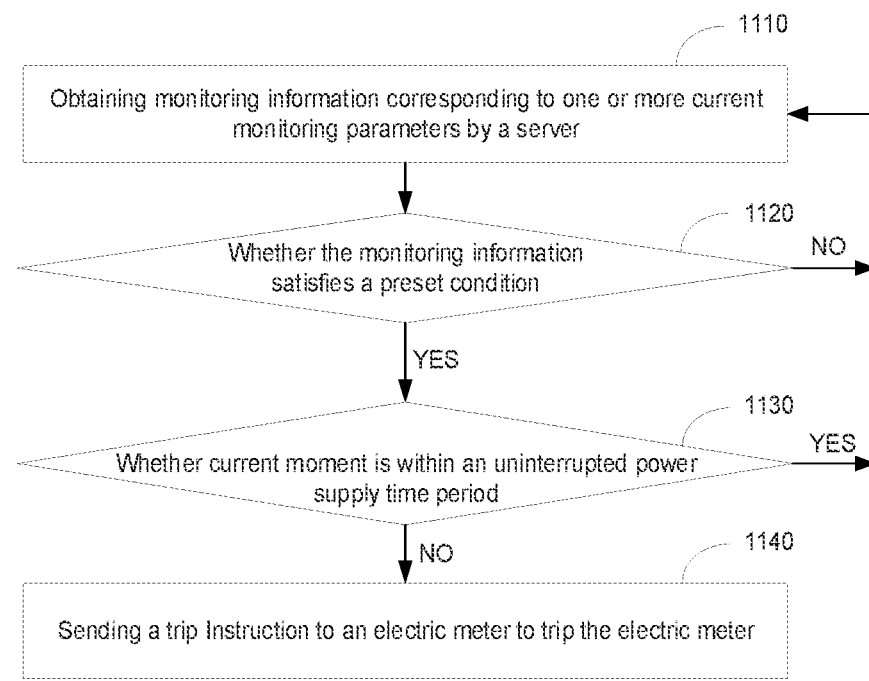
FIG. 11 is a flowchart illustrating an exemplary method for controlling a smart meter according to some embodiments of the present disclosure.

FIG. 11 is a flowchart illustrating an exemplary method for controlling a smart meter according to some embodiments of the present disclosure.

In step 1110, a server may obtain monitoring information corresponding to a current monitoring parameter. In some embodiments, the monitoring parameter may be electricity consumption, and the corresponding monitoring information may include at least the current remaining amount of electricity.

In step 1120, whether the monitoring information satisfies a preset condition may be determined. If the monitoring information is determined to satisfy the preset conduction, step 1130 may be proceeded to be performed; if the monitoring information is determined to not satisfy the preset conduction, the method may be returned to perform step 710. In some embodiments, preset conditions corresponding to different monitoring parameters may be different or the same. For example, if the monitoring parameter is the electricity consumption, the preset condition may be whether the current remaining amount of electricity satisfies a preset value, and the preset value may be set by the user according to actual needs. For example, the preset value may be 0 when the current remaining amount of electricity is equal to the difference between the sum of the current total electricity and the allowable overdraft electricity and the current electricity consumption; or the preset condition may be whether the current electricity consumption is within the range of the current total electricity, that is, whether the difference between the current total electricity and the current electricity consumption is less than or equal to 0. If the monitoring parameter is the house rent, the corresponding preset condition may be whether the current remaining rent is less than or equal to the rent threshold that may be set by the user according to actual needs.

In step 1130, whether the relevant time information is within a time period of the uninterrupted power supply may be determined. In some embodiments, step 740 may be performed if the relevant time information is not within the time period of uninterrupted power supply; the method may return to perform step 710 if the relevant time information is within the time period of uninterrupted power supply.

When the monitoring information is determined to satisfy the preset condition, whether the relevant time information is within the preset time period of the uninterrupted power supply may be determined. If the relevant time information is within the time period of uninterrupted power supply, the closing instruction may not be issued to the smart meter and the step of obtaining the monitoring information of the current monitoring parameters may be performed repeatedly.

The time period of the uninterrupted power supply may be set according to actual needs. For example, in the application scenario of monitoring electricity costs, the time period of the uninterrupted power supply may be set as the time period necessary for electricity consumption, for example, 18:00~08:00; certainly, other time periods may also be set.

In step 1140, the server may send an instruction of closing a valve to the smart meter to direct the smart meter to close the value.

If the relevant time information is not within the time period of uninterrupted power supply, the instruction of closing the valve may be issued. After receiving the instruction of closing the valve, the smart meter may execute the instruction of closing the valve to turn off the valve and stop the power supply.

A method for controlling a smart meter provided in the embodiment may obtain the monitoring information corresponding to the current monitoring parameter. When the monitoring information satisfies the preset condition, the smart meter may be controlled to not close the valve and turn off the power immediately but whether the relevant time information is within the time period of the uninterrupted power supply may be determined continuously; if the relevant time information is not within the time period of uninterrupted power supply, the smart meter may be controlled to close the valve and turn off the power immediately; if the relevant time information is within the time period of uninterrupted power supply, the smart meter may not be controlled to close the valve, but obtain monitoring information continuously. The method may not only automatically turn off the power when the monitoring information satisfies the preset condition, but also avoid the inconvenience in the daily life of the user caused by the electricity outage during the necessary time period of electricity consumption, and improve the experience of the user.

Figure 12:
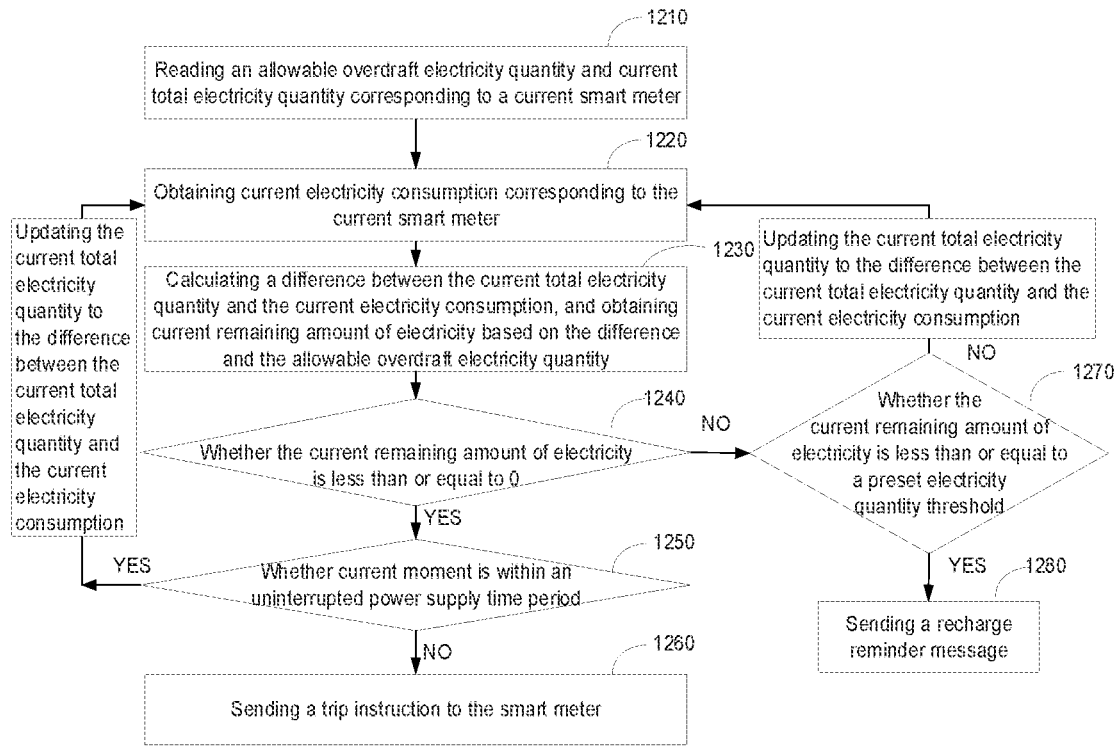
FIG. 12 is a flowchart illustrating another exemplary method for controlling a smart meter according to some embodiments of the present disclosure.

FIG. 12 is a flowchart illustrating another method for controlling a smart meter according to some embodiments of the present disclosure. In the embodiment, the monitoring parameter may be the electricity consumption as an example for description.

In step 1210, allowable overdraft electricity quantity and current total electricity quantity corresponding to a current smart meter may be obtained.

The allowable overdraft electricity quantity may be determined by the unit that charges the electricity consumption, for example, 30 kW·h. The current total electricity quantity may be the current recharged electricity of the user minus the cumulative electricity quantity that has been consumed on the date of statistics. For example, if the user recharges 200 kW·h in the current period and the accumulated electricity quantity that has been consumed is 150 kW·h, the current total electricity quantity is 50 kW·h.

In step 1220, the current electricity quantity that has been consumed corresponding to the current smart meter may be obtained.

The current electricity quantity that has been consumed may be an electricity quantity that has been consumed in the current statistical period measured by the smart meter.

In step 1230, the difference between the current total electricity quantity and the current electricity quantity that has been consumed may be obtained and the current remaining amount of electricity may be obtained according to the difference and the allowable overdraft electricity quantity.

In the application scenario, the current remaining amount of electricity may equal a sum of the allowable overdraft electricity quantity and a difference between the current total electricity quantity and the current electricity quantity that has been consumed. For example, if the current total electricity quantity is 50 kW·h, the allowable overdraft electricity quantity is 30 kW·h, and the current electricity quantity that has been consumed is 10 kW·h, the current remaining electricity quantity is calculated to be 50−10+30=70 kW·h.

In another application scenario, the overdraft electricity may be not allowed, the current remaining electricity quantity may equal the current total electricity quantity minus the current electricity quantity that has been consumed.

In step 1240, whether the current remaining electricity quantity is less than or equal to zero. In some embodiments, step 1250 may be performed if the current remaining electricity quantity is less than or equal to 0; step 1270 may be performed if the current remaining electricity is greater than 0;

For example, the current remaining electricity quantity obtained in the example is 70 kW·h, which is greater than 0, and step 870 may be performed.

In step 1250, whether relevant time information is within a time period of uninterrupted power supply; step 1260 may be performed if the relevant time information not within the time period of uninterrupted power supply; if the relevant time information is within the time period of uninterrupted power supply, the current total electricity quantity may be updated to be the difference between the current total electricity quantity and the current electricity quantity that has been consumed, and step 1220 may be performed.

For example, if the time period of the uninterrupted power supply is 18:00~08:00, and the relevant time information is 00:00, the current total electricity quantity may be updated to be the difference between the current total electricity quantity and the current electricity quantity that has been consumed, for example, the current total electricity quantity may be updated to be 50−10=40 kW·h.

In step 1260, an instruction of closing a valve may be sent to the smart meter.

If the electricity sum calculated in step 1230 is less than or equal to 0, and the relevant time information is not within the time period of uninterrupted power supply, the server may send the instruction of closing the valve to the smart meter, and the smart meter may execute the instruction of closing the valve.

In step 1270, whether the current remaining electricity quantity is less than or equal to a preset electricity threshold; step 1280 may be performed if the current remaining electricity quantity is less than or equal to the preset electricity threshold; step 1220 may be performed if the current remaining electricity quantity is greater than the preset electricity threshold, thus the current total electricity quantity may be updated to the difference between the current total electricity quantity and the current electricity quantity that has been consumed.

The preset electricity threshold may be set according to actual needs, for example, 30 kW·h or other values.

Whether the current remaining electricity quantity calculated in step 1230 is less than the preset electricity threshold may be determined. If the current remaining electricity quantity is less than or equal to the preset electricity threshold, it may indicate that the remaining electricity quantity in the user account is low, which may need to remind the user to recharge; if the current remaining electricity quantity is greater than the preset electricity threshold, it may indicate that the remaining electricity quantity of the user account is not lower than a warning value, thus the current total electricity quantity may be updated to the difference between the current total electricity quantity and the current electricity quantity that has been consumed, and the current electricity quantity that has been consumed may be obtained continuously.

In step 1280, a recharge reminder message may be sent.

The server may send recharge information to the client terminal of the user or send a message reminding the recharge to the mobile phone of the user to remind the user to recharge in time.

A method for controlling a smart meter provided in the embodiment may include obtaining the electricity consumption information of the user and calculating the current remaining electricity quantity of the user according to the electricity consumption information; determining whether the current remaining electricity quantity is less than or equal to 0. If the current remaining electricity quantity is less than or equal to 0 and the relevant time information is within the time period of uninterrupted power supply, thus the smart meter may not be controlled to turn off the valve and stop the power supply and continue to monitor the electricity consumption of the smart meter; if the current remaining electricity quantity is less than or equal to 0 and the relevant time information is not within the time period of uninterrupted power supply, the smart meter may be controlled to close the valve and stop power supply. The method may not only satisfy the need to close the valve and stop the power supply when the recharged electricity of the user and the allowable overdraft power is used up but also avoid the inconvenience in the daily life of the user caused by closing the valve and stopping power supply during the time period that the user must use electricity, thereby improving the experience of the user.

Figure 13:
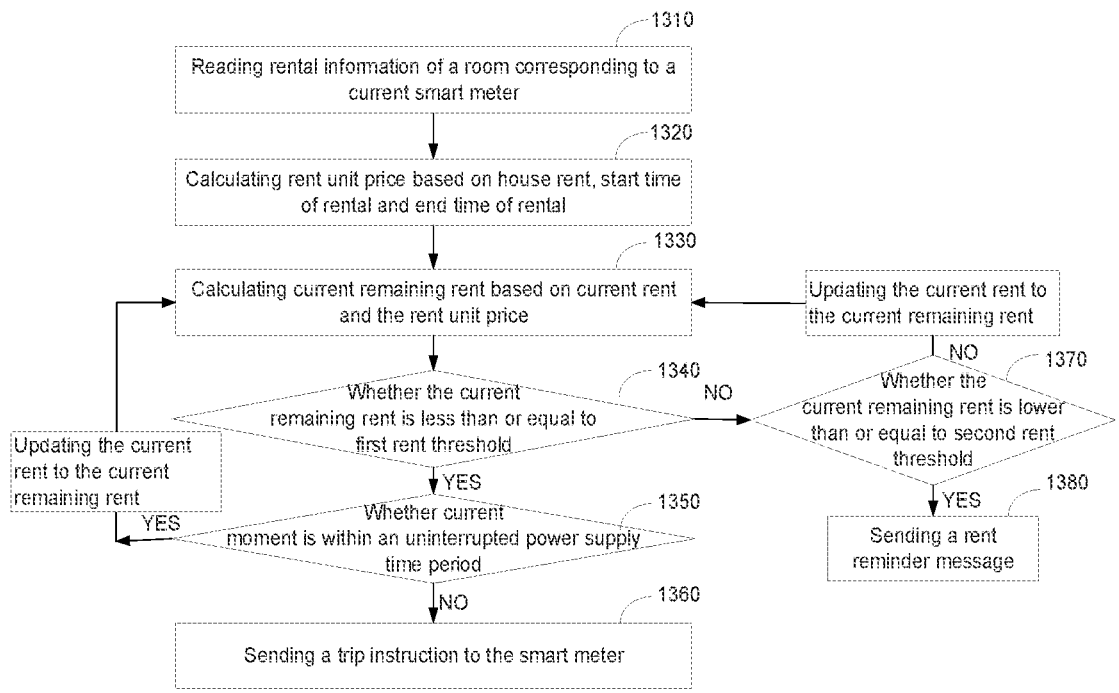
FIG. 13 is a flowchart illustrating another exemplary method for controlling a smart meter according to some embodiments of the present disclosure.

FIG. 13 is a flowchart illustrating another exemplary method for controlling a smart meter according to some embodiments of the present disclosure. In the embodiment, the monitoring parameter may be the house rent as an example for description.

In step 1310, rent information of a room corresponding to a current smart meter may be obtained.

In a scenario of the present disclosure, the room may be in a long-term renting mode. For example, the long-term renting mode may refer to a mode in which the rental period may exceed a preset number of days, such as monthly renting or longer.

In another scenario of the present disclosure, the room may be a short-term renting mode, for example, daily renting or a shorter time, such as an hourly room.

In both application scenarios, the rent information may include house rent, a current rent, a start time of rental, and an end time of rental.

The house rent may be the rent of the currently monitored room within a preset period, such as monthly rent and daily rent.

The current rent may be the amount of rent corresponding to the current period, and the current remaining rent may be the rent remaining after the current rent deducts the unit rent price of the current period.

In addition, the server may also store information related to the smart meter, such as a smart meter number and meter state information, and also store information about the room corresponding to the smart meter, such as room information, tenant information, the start time of rental, the end time of rental, and other designated data.

In step 1320, the unit rent price may be calculated according to the house rent, the start time of rental, and the end time of rental.

The unit rent price may refer to the amount of rent per unit time. The unit time corresponding to different application scenarios may be different. For example, in the scenario of monthly rent or longer, the unit time may be one day or one month. In the scenario of daily rent or shorter, the unit time may be one hour.

The unit rent price may be calculated based on the rent and a lease term. For example, for the long-term renting mode, a homeowner of the room may negotiate with a tenant of the room to determine the monthly rent price. The unit rent price may be the rent of one day, that is the daily rental price, thus the daily rent price may be equal to the monthly rent price divided by the number of days in the month.

For the short-term renting mode, the unit rent price may be equal to the rent for the lease term divided by the length of the lease term. For example, if the lease term is 3 days, the unit rent price may equal 3 days rent divided by 3 days. As another example, the lease term may be 4 hours, the unit rent price may be the unit price per hour, that is equal to 4 hours rent divided by 4 hours.

In step 1330, the current remaining rent may be determined based on the current rent and the unit rent price. When each rent deduction cycle arrives, firstly, whether the current time is within the range of the start time of rental and the end time of rental. If the current time is within the range, the corresponding unit rent price may be subtracted from the current rent. If the current time is not within the range, the current process may end.

If the current date is the first day of the month, the current rent may be the rent of the balance of the previous month; if the current date is the Nth day of the month, the current rent may be the balance of the last month minus N−1 daily rents.

In an embodiment of the present disclosure, if the renting mode is the long-term renting mode, the day's rent may be deducted every day and the current remaining rent may be calculated. The current remaining rent may be equal to the current rent minus the daily rent.

For the short-term renting mode, the period of deduction of the rent may be determined according to the lease term. If the lease term is several hours, the corresponding rent may be deducted every hour and the current remaining rent may be calculated. The current remaining rent may be equal to the current rent minus the unit price per hour.

In step 1340, whether the current remaining rent is less than or equal to a first rent threshold may be determined; step 1350 may be performed if the current remaining rent is less than or equal to the first rent threshold; step 970 may be performed if the current remaining rent is greater than the first rent threshold.

After the current remaining rent is calculated in step 1330, whether the current remaining rent is less than or equal to the first rent threshold may be determined. If the current remaining rent is less than or equal to the first rent threshold, whether the relevant time information is within the time period of uninterrupted power supply.

The first rent threshold may be set by the user according to actual needs.

In step 1350, whether relevant time information is within the time period of uninterrupted power supply. If the relevant time information is within the time period of uninterrupted power supply, the current rent may be updated to the current remaining rent and step 1330 may be performed; step 1360 may be performed if the relevant time information is not within the time period of uninterrupted power supply.

Step 1360 may be performed if the relevant time information is within the time period of uninterrupted power supply, the current rent may be updated to the current remaining rent, and step 1330 may be performed until the relevant time information is not within the time period of uninterrupted power supply.

The time period of the uninterrupted power supply may be set according to the remaining time of the lease term. For example, if the remaining time period of the lease is 2 days calculated according to the first rent threshold, the time period of the uninterrupted power supply may be 2 days from the relevant time information. As another example, if the remaining time of the lease term is 2 hours, the time period of the uninterrupted power supply may be 2 hours from the relevant time information.

In step 1360, an instruction of closing a valve may be sent to a smart meter.

If the current remaining rent is less than or equal to 0, and the relevant time information is not within the time period of uninterrupted power supply, the instruction of closing the valve may be sent to the smart meter.

Optionally, after controlling the tripping and closing of the smart meter, the tripping and closing state information of the smart meter may be saved to subsequently control the smart meter according to the tripping and closing state information of the smart meter.

After receiving the order to pay the rent from the user, and the smart meter is closed, an opening instruction may be sent to the smart meter After controlling the opening of the smart meter and receiving the opening response information returned by the smart meter, the tripping and closing state information of the smart meter may be saved. In step 1370, whether the current remaining rent is lower than or equal to a second rent threshold; step 1380 may be performed if the current remaining rent is lower than or equal to the second rent threshold; if the current remaining rent is higher than the second rent threshold, the current rent may be updated to the current remaining rent, and step 930 may be performed.

The second rent threshold may be set according to actual needs. For example, the second rent threshold may be set as the daily rent, which may be calculated based on the average number of days in a month.

The second rent threshold may be set according to the actual needs of users, and the second rent threshold may be greater than, equal to, or smaller than the first rent threshold.

In step 1380, reminder information of rent payment may be sent.

The server may push the reminder information of rent payment to the client terminal of the user or send a message reminding rent payment to the mobile phone of the user, which is not limited in the present disclosure.

The method for controlling a smart meter provided in the embodiment may include obtaining the rent information of the user, deducting the rent according to the preset rent deduction cycle, and calculating the current remaining rent. Then, the closing or opening of the smart meter may be controlled according to the price of the current remaining rent, effectively urging the tenant to pay the rent as soon as possible, avoiding the contradiction between the tenant and the homeowner; at the same time, avoiding the inconvenience in the daily life of tenants caused by closing the valve when electricity must be used at night, which may improve the user experience.

Corresponding to the embodiment of the method for controlling a smart meter, the present disclosure also provides a corresponding embodiment of a device for controlling a smart meter.

Figure 14:
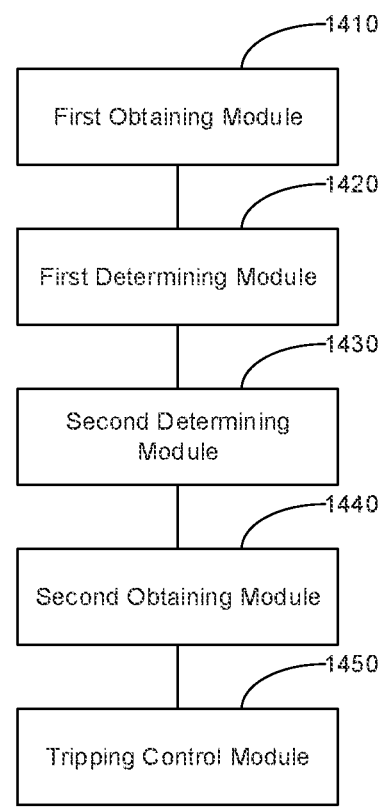
FIG. 14 is a block diagram of a device for controlling a smart meter according to some embodiments of the present disclosure.

Please refer to FIG. 14, which shows a block diagram of a device for controlling a smart meter according to some embodiments of the present disclosure. The device may be implemented on a computing device. As shown in FIG. 14, the device may include a first obtaining module 1410, a first determining module 1420, a second determining module 1430, a second obtaining module 1440, and a valve closing control module 1450.

The first obtaining module 1410 may be configured to obtain monitoring information corresponding to one or more current monitoring parameters. In some embodiments, the monitoring parameters may include but are not limited to, resource usage information, such as electricity consumption, rent, water consumption, gas usage, etc. In some embodiments, the corresponding monitoring information may be the amounts of resources that have been consumed, for example, the amount of electricity that has been consumed, the amount of water that has been consumed, the amount of gas that has been consumed, the time length that a house has been rented, etc., or the remaining resource information, for example, a remaining amount of electricity, a remaining amount of water, a remaining amount of gas, a remaining rent, etc. In some embodiments, different monitoring parameters may correspond to different monitoring information.

In an embodiment of the present disclosure, the current monitoring parameter may be the electricity consumption, and the corresponding monitoring information may be a remaining amount of electricity.

In an application scenario, the user may be allowed to overdraft electricity quantity. At this time, a remaining amount of electricity may equal the current total electricity quantity minus the electricity consumption plus the allowed overdraft electricity quantity.

In another application scenario, the user may not be allowed to overdraft electricity quantity. At this time, the remaining amount of electricity may equal the total electricity quantity minus the electricity consumption.

In another embodiment, the current monitoring parameter may be the rent of a room corresponding to the smart meter, and the monitoring information may be the remaining rent of the room.

A unit rent price may be calculated according to house rent, a start time of rental, and an end time of rental and the remaining rent may be calculated according to a current rent and the unit rent price.

For a long-term renting mode, a daily rent may be deducted every day, and the remaining rent may equal the current rent minus the daily rent.

For a short-term renting mode, for example, if the current rent is deducted every hour, the remaining rent may equal the current rent minus an hourly rent.

The first determining module 1420 may be configured to determine whether the monitoring information satisfies the preset condition. In some embodiments, the monitoring information may be the remaining used resources, for example, a remaining amount of electricity, a remaining amount of water, a remaining amount of gas, a remaining rent, etc. In some embodiments, the first determining module may be configured to determine whether the remaining amount is less than or equal to zero. In some embodiments, the server may preset a first threshold, and the first determining module may be configured to determine whether the remaining amount is less than or equal to the first threshold.

The server may also set a second threshold, and the first determining module may be configured to determine whether the remaining amount is less than or equal to the second threshold and greater than the first threshold. In some embodiments, when the first determining module determines that the remaining amount is less than or equal to the second threshold and greater than the first threshold, the server may send prompt information to the client terminal of the user.

If the monitoring information is the remaining electricity, the first determining module may be specifically configured to determine whether the remaining amount of electricity is less than or equal to zero, and if the remaining amount of electricity is less than or equal to zero, determine that the monitoring information satisfies the preset condition; if the remaining amount of electricity is greater than zero, determine that the monitoring information does not satisfy the preset condition.

If the monitoring information is the remaining rent, the first determining module may be specifically configured to determine whether the remaining rent is less than or equal to a first rent threshold, and if the remaining rent is less than or equal to the first rent threshold, determine that the monitoring information satisfies the preset condition; if the remaining rent is greater than the first rent threshold, determine that the monitoring information does not satisfy the preset condition.

The second determining module 1430 may be configured to determine whether relevant time information is within a specific time period. In some embodiments, the specific time period may be a time period when resources are restricted to be cut off. The time period when resources are restricted to be cut off may be a time period when safety accidents or great inconvenience to people's production and life may be caused after the resource supply is cut off. According to different resource types and/or resource usage scenarios, the time period for limiting the cutting off of resources may be different. In some embodiments, if the relevant time information is not within a specific time period, an instruction of closing valve may be sent to a smart meter; if the relevant time information is within the specific time period, the instruction of closing valve may not be sent, and the device may be returned to execute steps obtaining the current monitoring parameter information.

For an application scenario that the monitoring information may be the remaining electricity, if the monitoring information satisfies the preset condition, determining whether the relevant time information is within the time period of uninterrupted power supply continuously. The time period of uninterrupted power supply in the application scenario may be set by the user according to actual needs, for example, the time period of the uninterrupted power supply may be set as the time period necessary for electricity consumption, for example, 18:00~08:00; certainly, another time period may also be set.

For an application scenario that the monitoring information may be the remaining rent, the time period of the uninterrupted power supply may be set according to the remaining time of the lease term. For example, if the remaining time of the lease term is 2 days based on the first rent threshold, the time period of the uninterrupted power supply may be 2 days from the start time of the relevant time information. As another example, if the remaining time of the lease term is 2 hours, the time period of the uninterrupted power supply may be 2 hours from the start time of the relevant time information.

If the relevant time information is within the time period of uninterrupted power supply, a smart meter may not be controlled to close; if the relevant time information is not within the time period of uninterrupted power supply, the smart meter may be controlled to close.

The second obtaining module 1440 may be configured to obtain the monitoring information corresponding to a current monitoring object continuously when the relevant time information is within a specific time period. For example, the second obtaining module may be configured to obtain the monitoring information corresponding to the current monitoring object continuously when the relevant time information is within the time period of uninterrupted power supply.

The valve closing control module 1450 may be configured to send the instruction of closing the valve to a smart meter when the relevant time information is not within a specific time period to close the smart meter. For example, when the relevant time information is not within the time period of uninterrupted power supply, the instruction of closing valve may be sent to the smart meter to close the smart meter.

The device for controlling a smart meter provided in the embodiment may obtain the monitoring information corresponding to the current monitoring parameter. If the monitoring information satisfies the preset condition, the smart meter may be controlled to not close the valve and turn off the power immediately but whether the relevant time information is within a specific time period may be determined continuously; if the relevant time information is not within a specific time period, the smart meter may be controlled to close the valve and turn off the power immediately; if the relevant time information is within a specific time period, the smart meter may be controlled to not close the valve, but obtain the monitoring information continuously. The method may not only automatically turn off the power when the monitoring information satisfies the preset condition, but also avoid the inconvenience in the daily life of the user caused by the resource interruption during the necessary time period of using resources and improve the experience of the user.

Figure 15:
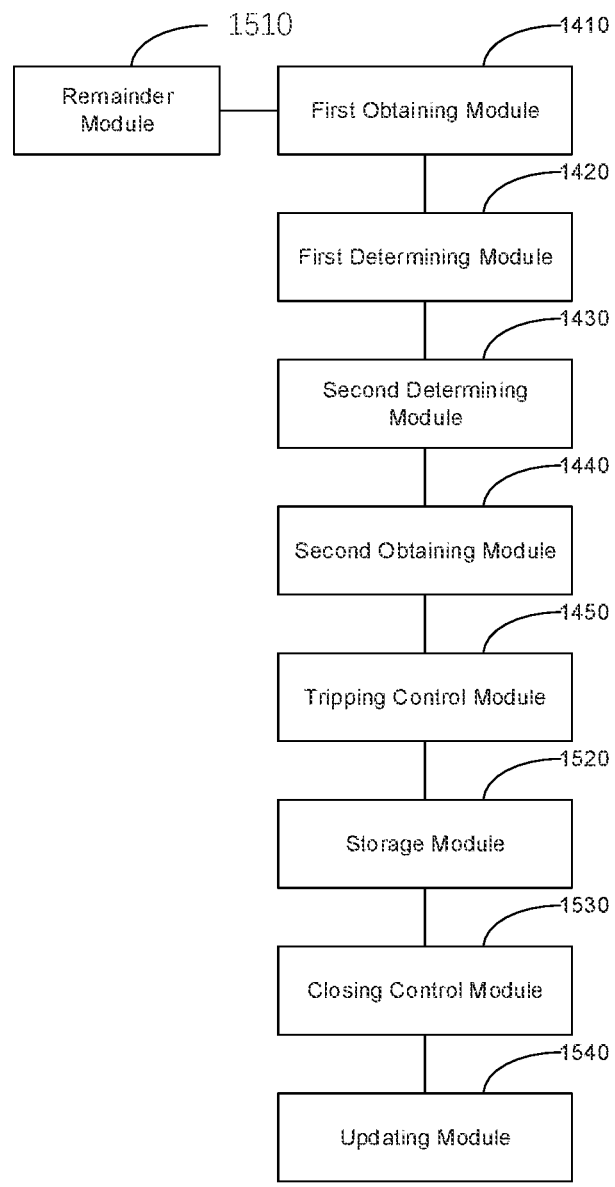
FIG. 15 is a block diagram of another device for controlling a smart meter according to some embodiments of the present disclosure.

FIG. 15 is a block diagram of another device for controlling a smart meter according to some embodiments of the present disclosure. Based on the embodiment shown in FIG. 14, the device may also include a reminder module 1510 configured to send reminder information for recharge when a reminder condition is satisfied.

In a scenario of monitoring electricity consumption, the reminder module 1510 may be configured to push a recharge reminder information when the current remaining amount is greater than 0 and less than a preset threshold.

For example, the recharge reminder information may be pushed when the remaining amount of electricity is greater than 0 and less than the preset threshold. In a scenario of monitoring rent, the reminder module 1510 may be configured to send reminder information of rent payment when the remaining rent is greater than 0 and less than the second rent threshold.

Optionally, the embodiment may also include a storage module 1520, a closing control module 1530, and an update module 1540.

The storage module 1520 may be configured to store trip state information of a smart meter according to the closing response information returned by the smart meter. For example, the trip state information of the smart meter may be stored according to the closing response information returned by the smart meter.

The closing control module 1530 may be configured to send a closing instruction to close the smart meter when a recharge instruction is received and the corresponding smart meter is currently in a closed state. For example, when the recharge instruction is received and the smart meter is currently in the closed state, the closing instruction may be sent to close the smart meter. In a scenario of monitoring electricity consumption, the closing instruction may be sent when an electricity recharge instruction is received and the smart meter is in the closed state. In a scenario of monitoring house rent, the closing instruction may be sent when an order of rent payment is received from the user and the smart meter is in the closed state.

The update module 1540 may be configured to update the trip state information corresponding to the smart meter after receiving the closing response information returned by the smart meter. For example, the trip state information corresponding to the smart meter may be updated after receiving the closing response information returned by the smart meter.

The device for controlling a smart meter provided in the embodiment may remind the user to recharge if the monitoring information satisfies the reminding condition to avoid resource interruption caused by the failure to recharge in time and improve the experience of the user. Besides, after controlling the smart meter to close, the trip state information of the smart meter may be stored to perform corresponding control instructions according to the current state of the smart meter.

Some embodiments of the present disclosure propose a method for recharging a smart meter. In some embodiments, a server may receive recharge information from a client terminal and generate a recharge instruction. Each recharge instruction may have a unique ID number. In some embodiments, the server may first determine whether a meter is online. If the meter is online, the recharge instruction may be directly sent to the meter via the network. If the meter is not online, the server may send the recharge instruction to the client terminal, and the client terminal may send the recharge instruction to the meter through near-field communication. In some embodiments, after the meter receives the recharge instruction, whether the instruction has been performed may be determined according to the ID number of the recharge instruction. If the instruction has not been performed, the meter may perform the recharge instruction to complete the recharge.

Figure 16:
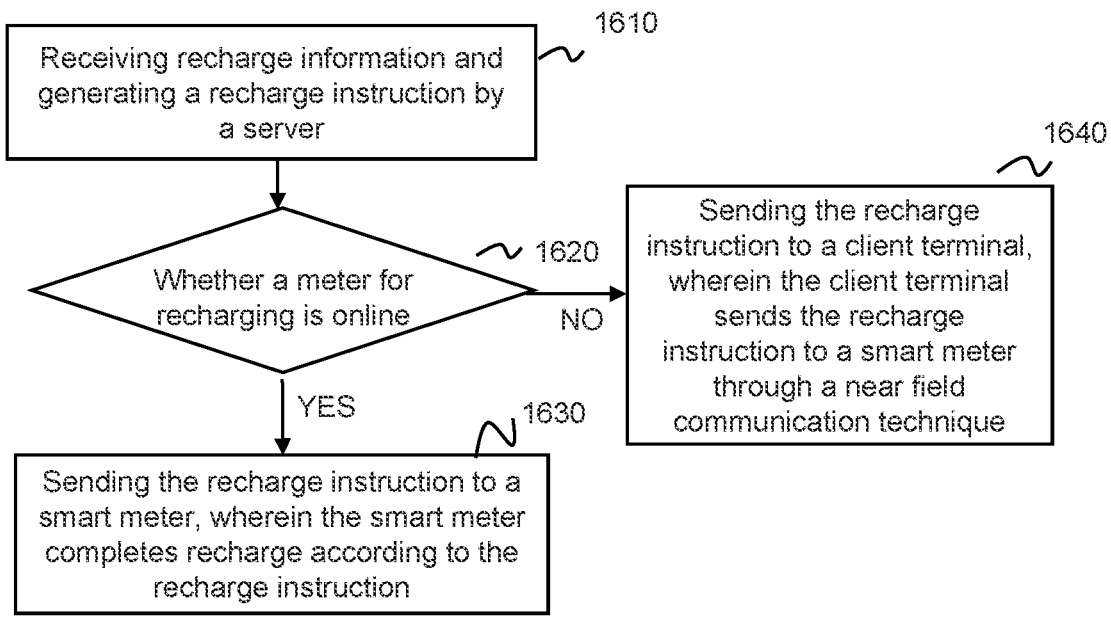
FIG. 16 is a flowchart illustrating an exemplary method for recharging a smart meter according to some embodiments of the present disclosure.

FIG. 16 is a flowchart illustrating an exemplary method for recharging a smart meter according to some embodiments of the present disclosure.

In step 1610, a server may receive recharge information and generate a recharge instruction. In some embodiments, the recharge information may be information related to the purchase of corresponding resources. For example, the recharge information may include purchase information on resources, such as electricity purchase, water purchase, gas purchase, rent renewal, etc. In some embodiments, the recharge information may include information such as a recharge type, a recharge amount, a purchase amount, a unit price, a meter type, a meter ID, a room number, etc. The type of recharge may include electricity fee recharge, water fee recharge, gas fee recharge, rent renewal, etc. The type of meter may be an electric meter, a water meter, a gas meter, etc. The room number may be the number of a room for which the rent is to be renewed. In some embodiments, the recharge instruction may be an instruction to write the purchased resource usage or recharge price into the corresponding smart meter or rental house. After the purchase price is written into the smart meter or rental house, the user may normally use corresponding resources or rent houses continuously. In some embodiments, each of the different recharge instructions may have a unique ID number to identify different recharge instructions, which may be also convenient to record the life cycle information of the recharge instruction, such as a sending time, an execution time, execution status information, etc. The ID number of the recharge instruction may be generated according to certain rules according to the meter ID, the room number, a generation time, and other information in the recharge information.

In some embodiments, the server may generate payment notification information according to the usage of the resource and send the payment notification information to a client terminal to make the client terminal send the recharge information. In some embodiments, the server may receive uploaded usage information, and the usage information may include electricity usage information, water usage information, gas usage information, used rent information, etc. In some embodiments, the smart meter may periodically send the usage information to the server. In some embodiments, the smart meter may send the usage information to the server when the remaining available amount is less than a minimum threshold, or the amount that has been consumed has been overspent. In some embodiments, the server may generate the payment notification information according to the usage information, and send the payment notification information to the client terminal. In some embodiments, after receiving the usage information sent by the smart meter, the server may determine and analyze the usage information. If the condition for sending the payment notification information is satisfied, the server may generate the payment notification information based on the usage information and send the payment notification information to the client terminal to remind the user to pay in time. The condition for sending the payment notification information may be that the balance is lower than a preset threshold, or the usage has been overspent, etc. For example, the server may receive the electricity consumption information sent by the electric meter, and analyze the electricity consumption information. When the remaining electricity quantity is less than 10 kW·h, the server may generate the payment notification information and send the payment notification information to the client terminal. The client terminal may generate a recharge request, and the recharge request may include information related to the recharge electricity fee.

In step 1620, the server may determine whether a proxy recharge meter is online. In some embodiments, the determining whether the smart meter is online may be performed by determining whether the smart meter is online through the internet, for example, cable network, wired network, optical fiber network, Internet, local area network (LAN), wide area network (WAN), wireless local area network (WLAN), metropolitan area network (MAN), public switched telephone network (PSTN), general packet wireless network (GPRS)), mobile phone network, etc. In some embodiments, the determining whether the meter is online may be that the server sends a message to the smart meter, and if the server receives a response message returned by the smart meter, the smart meter may be online; if the response message of the smart meter is not received within a certain time period by the server, the server may be determined that the smart meter is offline. The certain time may be 1 minute, 5 minutes, or 30 seconds.

In step 1630, when the smart meter is online, the server may send the recharge instruction to the smart meter, thus the smart meter may complete recharge according to the recharge instruction. In some embodiments, when the smart meter is online via the network, the server may directly send the recharge instruction to the smart meter via the network, and after receiving the recharge instruction, the smart meter may execute directly to complete the recharge process. In some embodiments, the server may send the recharge instruction to the smart meter via a wired network or a wireless network.

In step 1640, when the smart meter is not online, the server may send the recharge instruction to the client terminal, thus the client terminal may send the recharge instruction to the smart meter through a near field communication technique. In some embodiments, the smart meter may have a network communication function and a near-field communication function. Specifically, the smart meter may have a wired network interface or a wireless network module, such as a wifi module or a GPRS module. The smart meter may, but is not limited to, include communication modules with near-field communication functions such as Bluetooth, NFC, ZigBee, and serial communication. In some embodiments, when the smart meter network is offline, the server may not send the recharge instruction to the smart meter via the network, and may only transmit the recharge instruction to the smart meter through other channels. In some embodiments, the server may send the recharge instruction to the client terminal when the smart meter is offline, and the client terminal may transmit the recharge instruction to the smart meter, thus the smart meter may obtain a recharge order to complete the recharge operation from the client terminal in time when the smart meter is offline. The client terminal may receive the recharge instruction sent by the server through the network, and transmit the recharge instruction to the smart meter through a near field communication technique such as Bluetooth, NFC, ZigBee, and serial communication.

In the embodiment, a method for recharging a meter may be completed through an online or offline network. The recharge instruction may be issued through the server on the network and the recharge instruction may be received by the smart meter through the near field communication between the client terminal and smart meter. The whole process may be convenient and fast, and it may avoid normal recharge when the network signal of the smart meter is not good, which may greatly improve user experience. The smart meter may determine whether the recharge instruction has been executed before, and if the recharge instruction has been executed, it may not be executed repeatedly to avoid repeated recharging.

Figure 17:
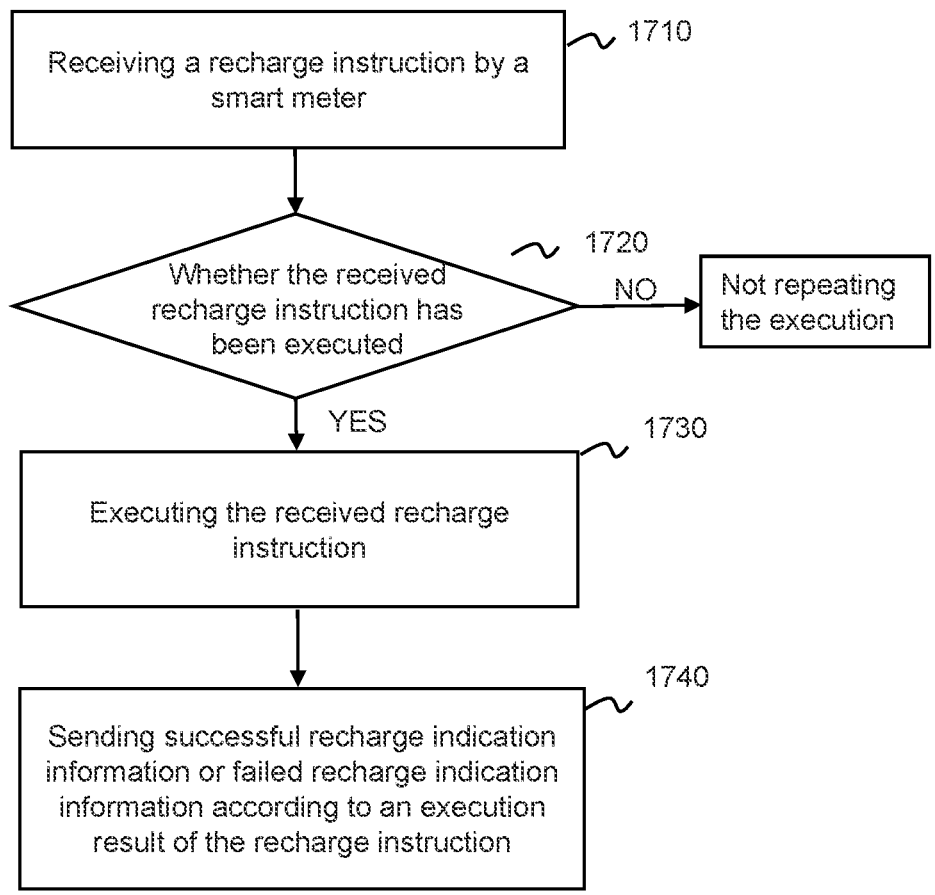
FIG. 17 is a flowchart illustrating another exemplary method for recharging a smart meter according to some embodiments of the present disclosure.

FIG. 17 is a flowchart illustrating another exemplary method for recharging a smart meter according to some embodiments of the present disclosure.

In step 1701, a smart meter may receive a recharge instruction. In some embodiments, the smart meter may receive the recharge instruction issued by a server through the network, or receive the recharge instruction sent by the client terminal through a near field communication technique. In some embodiments, when the smart meter network is online, the recharge instruction issued by the server through the network may be received. When the smart meter network is offline, the server may send the recharge instruction to the client terminal, and the smart meter may receive the recharge instruction sent by the client terminal through the near field communication technique.

In step 1702, the smart meter may determine whether the received recharge instruction is a recharge instruction that has been executed. In some embodiments, the recharge instruction may include a unique ID number, and the smart meter may determine whether the recharge instruction has been executed according to the unique ID number. For example, the smart meter may determine whether the ID number of the instruction is repeated with a previous ID number, and if the ID number of the recharge instruction is repeated, the smart meter may be determined that the instruction has been executed. As another example, the meter may add a successful recharge mark to the ID number of an instruction that has been successfully recharged. If the ID number of the recharge instruction is the same as a unique ID number with the successful recharge mark, the smart meter may be determined that the recharge instruction has been executed.

In step 1703, the smart meter may execute the received recharge instruction. After receiving the recharge instruction, the smart meter may execute the recharge instruction to complete the recharge operation to provide the user with continuous resources. In some embodiments, the smart meter may update the remaining amount of resources after completing the recharge operation.

In step 1704, the smart meter may send successful recharge indication information or failed recharge indication information according to the execution result of the recharge instruction. In some embodiments, the smart meter may send the recharge result to the server via the network. For example, if the recharge is successful, the smart meter may send the successful recharge indication information to the server, and the server may record relevant information for filing. If the recharge fails, the smart meter may send the failed recharge indication information to the server, and the server may determine whether it is necessary to reissue the recharge instruction or send corresponding prompt information to the user according to failed reason information. In some embodiments, the smart meter may also send the recharge result to the client terminal through the near-field communication technique.

After receiving the recharge instruction, the meter may obtain the recharge instruction through the network or near field communication to avoid the influence of the smart meter on the normal recharge when the network signal of the smart meter is not good. The meter may also determine whether the recharge instruction has been executed before, and if the recharge instruction has been executed, the recharge instruction may not be executed repeatedly to avoid repeated recharging.

Figure 18:
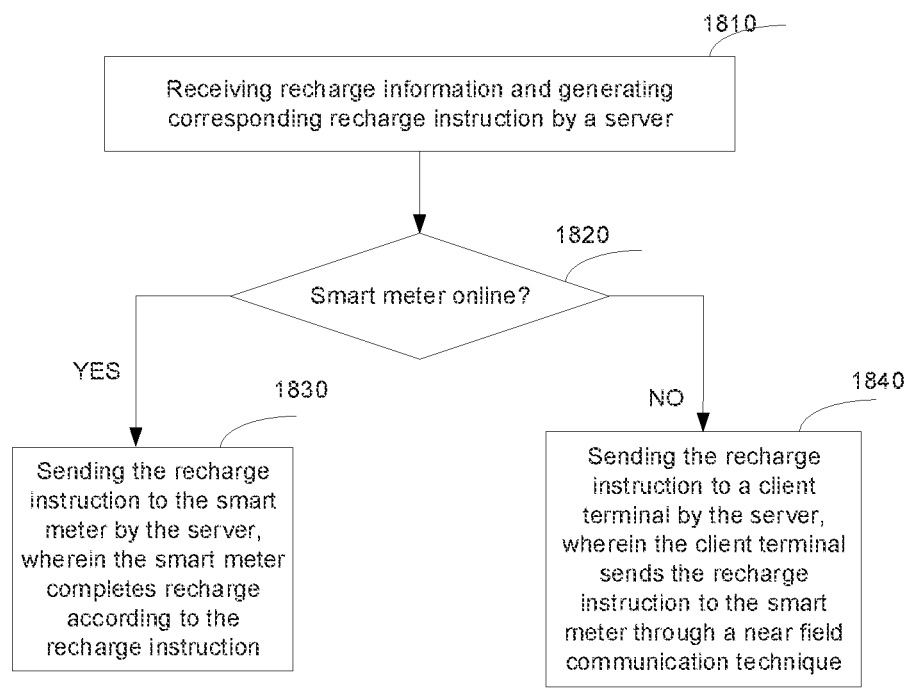
FIG. 18 is a flowchart illustrating an exemplary method for recharging an electric meter according to some embodiments of the present disclosure.

FIG. 18 is a flowchart illustrating an exemplary method for charging an electric meter according to some embodiments of the present disclosure.

In step 1810, a server may receive recharge information of electricity fee, and generate a corresponding recharge instruction.

The recharge information may be information related to the user's purchase of electricity through the network and the recharge information may include information such as a recharge fee, a purchased amount of electricity, a unit price of electricity, a meter ID, etc.

The recharge instruction may be instruction information that directs the smart meter to write the purchased amount of electricity or the recharge fee into the smart meter. After the purchased amount of electricity is written into the smart meter, the user may use the electricity normally. Each of the different recharge instructions may have a unique ID number, and the ID number of the electricity recharge instruction may be generated according to certain rules based on the meter ID, a generation time, and other information in the recharge information.

In step 1820, whether the smart meter is online may be determined. The smart meter may have a network communication function and a near-field communication function. Specifically, the smart meter may have a wired network interface or a wireless network module, such as a wifi module or a GPRS module. The smart meter may include but is not limited to, a communication module with a near field communication function such as Bluetooth, NFC, etc.

Determining whether the smart meter is online may be performed by determining whether the smart meter is online through a network. Determining whether the smart meter is online may be that the server may send a message to the smart meter, and if the server receives a response message returned by the smart meter, the smart meter may be online; if no response from the smart meter is received within a certain time period, the smart meter may be determined to be offline.

In step 1830, when the smart meter network is online, the server may send the recharge instruction to the smart meter, thus the smart meter may complete recharge according to the recharge instruction.

When the smart meter network is online, the server may directly send the recharge instruction to the smart meter via the network, and the smart meter may directly execute the recharge process after receiving the recharge instruction. Specifically, the server may send the recharge instruction to the smart meter via a wired network or a wireless network.

In step 1840, when the smart meter is not online, the server may send the recharge instruction to the client terminal, thus the client terminal may send the recharge instruction to the smart meter through a near field communication technique.

When the smart meter network is offline, the server may not send the recharge instruction to the smart meter via the network, and may only transmit the recharge instruction to the smart meter through other channels. In the embodiment, the server may send the recharge instruction to the client terminal when the smart meter is offline, and the client terminal may transmit the recharge instruction to the smart meter, thus the smart meter may obtain the recharge instruction from the client terminal in time when the smart meter is offline to complete recharge operation. The client terminal may receive the recharge instruction sent by the server through the network, and transmit the recharge instruction to the smart meter through a near field communication technique such as Bluetooth, NFC, etc.

In the embodiment, a method for recharging an electric meter may complete the purchase of electricity quantity through the network, and the recharge instruction may be received by the electric meter through the near field communication between the client terminal and electric meter, the whole process may be convenient and fast to avoid normal recharge when the network signal of the electric meter is not good, which may greatly improve user experience.

Figure 19:
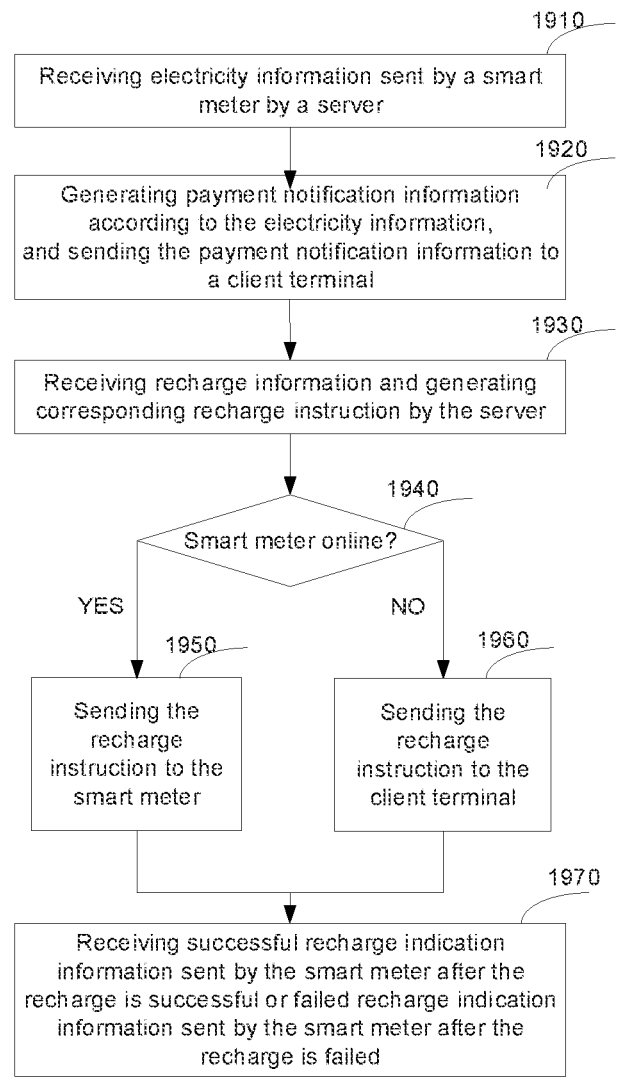
FIG. 19 is a flowchart illustrating another exemplary method for recharging an electric meter according to some embodiments of the present disclosure.

FIG. 19 is a flowchart illustrating another exemplary method for recharging an electric meter according to some embodiments of the present disclosure. The method may be implemented on a server.

In step 1910, a server may receive electricity information sent by a smart meter.

The smart meter may send the electricity information to the server periodically, or when the remaining available electricity quantity is less than the minimum threshold, or when the electricity quantity that has been consumed is overspent.

In step 1920, payment notification information may be generated according to the electricity information and the payment notification information may be sent to the client terminal.

The server may analyze the electricity information after the server receives the electricity information sent by the smart meter. If a condition for sending the payment notification information is satisfied, the server may generate the payment notification information based on the electricity information and send payment notification information to the client terminal to remind the user to pay in time. The condition for sending the payment notification information may be that the remaining electricity quantity is lower than a preset threshold, the electricity quantity that has been consumed is overspent, etc.

In step 1930, the server may receive the recharge information and generate a corresponding recharge instruction.

In step 1940, whether the smart meter is online may be determined.

In step 1950, if the smart meter is online, the recharge instruction may be sent to the smart meter, thus the smart meter may complete recharge according to the recharge instruction.

In step 1960, if the smart meter is not online, the recharge instruction may be sent to the client terminal, thus the client terminal may send the recharge instruction to the smart meter through a near field communication technique.

In step 1970, successful recharge indication information sent by the smart meter may be received after the recharge is successful, or failed recharge indication information may be received after the recharge is failed. The failed recharge indication information may include failure reason information. If the recharge instruction is executed successfully, that is, when the recharge is successful, the server may record relevant information for the record. If the recharge fails, the server may determine whether the recharge instruction needs to be reissued based on the failure reason information, or send corresponding prompt information to the user, such as a smart meter failure.

In the embodiment, a method for recharging an electric meter may generate a payment notification to remind the user to purchase electricity in time when the electricity meter satisfies a certain condition to avoid the inconvenience caused by the sudden power failure of the user during using electricity. At the same time, the message of the successful recharge or the failure recharge sent by the smart meter may be received, thus it may be convenient to make corresponding operations in time and improve user experience.

Figure 20:
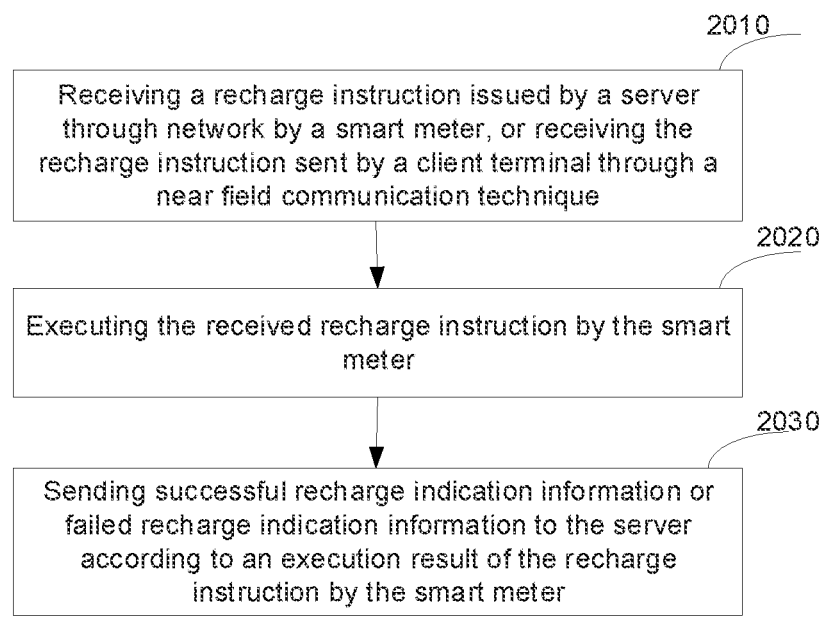
FIG. 20 is a flowchart illustrating another exemplary method for recharging an electric meter according to some embodiments of the present disclosure.

FIG. 20 is a flowchart illustrating another exemplary method for recharging an electric meter according to some embodiments of the present disclosure, and the method may be implemented on a smart electric meter.

In step 2010, a smart electric meter may receive a recharge instruction issued by a server through a network, or receive the recharge instruction sent by a client terminal through a near field communication technique. When the smart meter network is online, the smart meter may receive the recharge instruction issued by the server through the network, wherein the network may be a wired network or a wireless network. When the smart meter network is offline, the server may send the recharge instruction to the client terminal, and the smart meter may receive the recharge instruction sent by the client terminal through the near field communication technique.

In step 2020, the smart meter may execute the received recharge instruction.

After receiving the recharge instruction, the smart meter may execute the recharge instruction to complete the recharge operation to provide the user with electricity supply service continuously.

In step 2030, the smart meter may send successful recharge indication information or failed recharge indication information to the server according to the execution result of the recharge instruction. The failed recharge indication information may include failure reason information. If the recharge instruction is executed successfully, that is, when the recharge is successful, the smart meter may send the successful recharge indication information to the server, and the server may record relevant information for filing. If the recharge instruction fails to execute, the smart meter may send the failed recharge indication information to the server, the server may determine whether it is necessary to reissue the recharge instruction according to the failure reason information, or send corresponding prompt information to the user, such as the failure of the smart meter.

In the embodiment, a method for recharging an electric meter may complete the purchase of electricity quantity through the network. The recharge instruction may be issued on the network, and the recharge instruction may be received by the electric meter through the near-field communication between the client terminal and the electric meter. The whole process may be convenient and fast to avoid normal recharge when the network signal of the electric meter is not good, which may greatly improve user experience.

Figure 21:
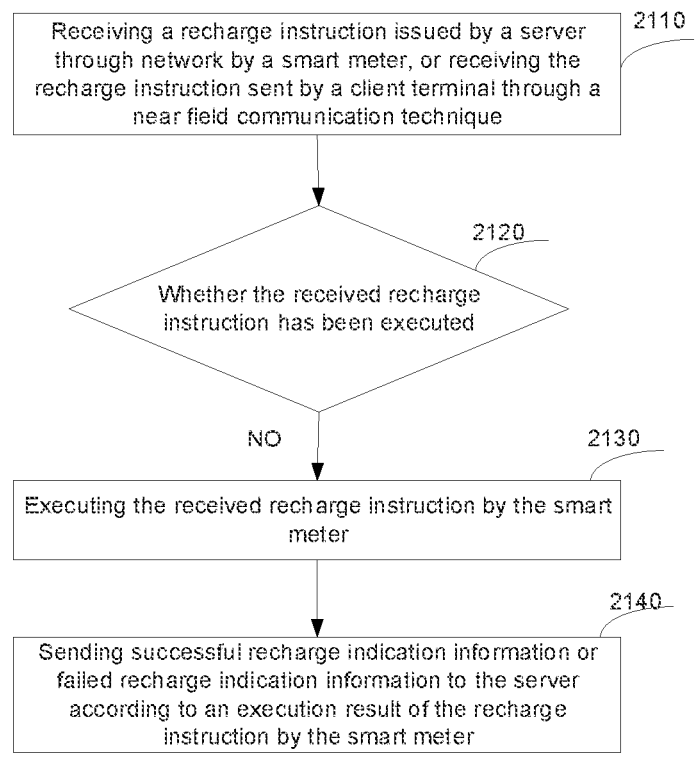
FIG. 21 is a flowchart illustrating another exemplary method for recharging an electric meter according to some embodiments of the present disclosure.

FIG. 21 is a flowchart illustrating another exemplary method for recharging an electric meter according to some embodiments of the present disclosure, and the method may be implemented on a smart electric meter.

In step 2110, the smart electric meter may receive a recharge instruction issued by a server through the network, or receive the recharge instruction sent by the client terminal through a near field communication technique.

In step 2120, the smart electric meter may determine whether the received recharge instruction is a recharge instruction that has been executed.

Specifically, if the recharge instruction includes a unique ID number, the smart electric meter may determine whether the received recharge instruction has been executed, according to the unique ID number. For example, the smart electric meter may add a successful recharge mark stored locally to the unique ID number of the recharge instruction that has been successfully performed. When a new recharge instruction is subsequently performed, firstly, the unique ID of the new recharge instruction may be compared with the unique ID number with the successful recharge mark. If the unique ID number of the new recharge instruction is the same as the unique ID number with the successful recharge mark, it may indicate that the new recharge instruction has been executed, and if all the unique ID numbers with the successful recharge mark are different from the unique ID numbers of the new recharge instruction, it may indicate that the new recharge instruction has not been executed.

The unique ID number may be a unique ID number of the recharge instruction, and the unique ID number of the recharge instruction may be generated according to certain rules based on a meter ID and the generation time of the recharge information.

If the smart electric meter has already executed the received recharge instruction, the recharge instruction may be no longer executed to avoid repeated recharging. For example, the recharge instruction may include a unique ID number 20180101, and the unique ID number 20180101 may be included in a successful recharge ID list stored locally in the smart electric meter, which indicates that the smart electric meter has executed the recharge instruction with the unique ID number 20180101 and has recharged successfully, in this case, the received recharge instruction may not be executed again.

In step 2130, if the recharge instruction has not been executed, the smart electric meter may execute the received recharge instruction.

In step 2140, the smart electric meter may send successful recharge indication information or failed recharge indication information to the server according to an execution result of the recharge instruction.

In the embodiment, after receiving the recharge instruction, firstly, determining whether the recharge instruction has been executed before, and if the recharge instruction has been executed, the recharge information may not be executed repeatedly to avoid repeated recharging.

Figure 22:
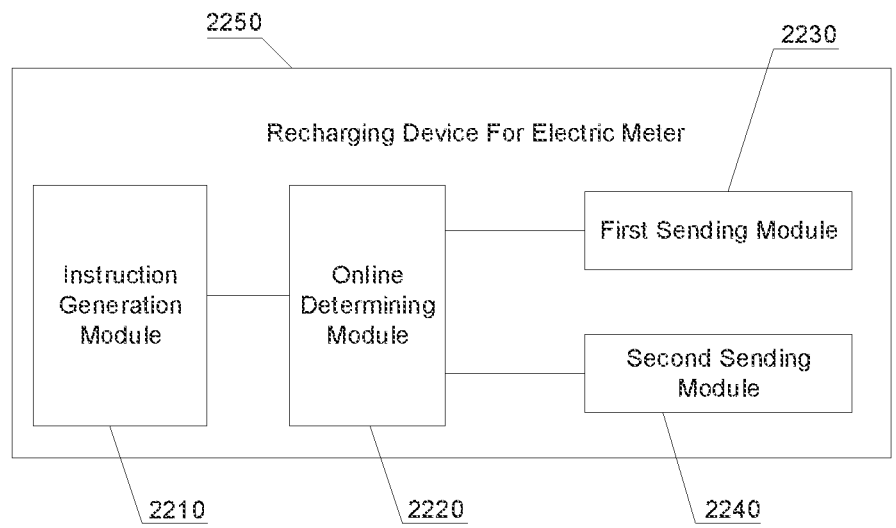
FIG. 22 is a structural diagram of a device for recharging an electric meter according to some embodiments of the present disclosure.

FIG. 22 is a structural diagram of a device for recharging an electric meter according to some embodiments of the present disclosure. The device may be implemented on a server. As shown in FIG. 22, the device 2200 for recharging an electric meter may include modules as follows:

An instruction generation module 2210 may be configured to receive recharge information and generate corresponding recharge instruction.

The recharge information may be information related to online purchase of electricity quantity of the user and is not limited to including information such as a recharge fee, a purchased amount of electricity, a unit price of electricity, a meter ID, etc.

The recharge instruction may be instruction information that directs the smart electric meter to write the purchased amount of electricity or the recharge fee into the smart electric meter. After the purchased amount of electricity is written into the smart electric meter, the user may use the electricity normally. Each of the different recharge instructions may have a unique ID number to identify different recharge instructions, and it may also be convenient to record a life cycle information of the recharge instruction, such as a sending time, an execution time, execution information, etc. The ID number of the recharge instruction may be generated according to certain rules based on the meter ID, the generation time of the recharge information, etc.

An online determining module 2220 may be configured to determine whether the smart electric meter is online.

The smart electric meter may have a network communication function and a near-field communication function. Specifically, the smart electric meter may have a wired network interface or a wireless network module, such as a wifi module or a GPRS module. The smart electric meter may include but is not limited to, a communication module with a near field communication function such as Bluetooth, NFC, etc.

Determining whether the smart electric meter is online may be performed by determining whether the smart electric meter is online through a network. Determining whether the smart electric meter is online may be that the server may send a message to the smart electric meter, and if the server receives a response message returned by the smart electric meter, the smart electric meter may be online; if no response from the smart electric meter is received within a certain time period, the smart electric meter may be determined to be offline.

A first sending module 2230 may be configured to send the recharge instruction to the smart electric meter when the smart electric meter is online, thus the smart electric meter may complete recharge according to the recharge instruction.

When the smart electric meter is online, the server may directly send the recharge instruction to the smart electric meter via the network, and the smart electric meter may directly execute the recharge process after receiving the recharge instruction. Specifically, the server may send the recharge instruction to the smart electric meter via a wired network or a wireless network.

A second sending module 2240 may be configured to send the recharge instruction to the client terminal when the smart electric meter is offline, thus the client terminal may send the recharge instruction to the smart electric meter through a near field communication technique.

When the smart electric meter is offline, the server may not send the recharge instruction to the smart electric meter via the network, and may only transmit the recharge instruction to the smart meter through other channels. In the embodiment, the server may send the recharge instruction to the client terminal when the smart electric meter is offline and transmit the recharge instruction to the smart electric meter through the client terminal, thus the smart electric meter may obtain the recharge instruction from the client terminal in time when the smart electric meter is offline to complete the recharge operation. The client may receive the recharge instruction sent by the server through the network, and transmit the recharge instruction to the smart electric meter through a near field communication technique such as Bluetooth, NFC, etc.

In the embodiment, a device for recharging an electric meter may complete the purchase of electricity quantity through the network, and the recharge instruction may be issued on the network through the near field communication between the client terminal and the smart electric meter, and the whole process may be convenient and fast to avoid normal recharge when the network signal of the smart electric meter is not good, which may greatly improve user experience.

Figure 23:
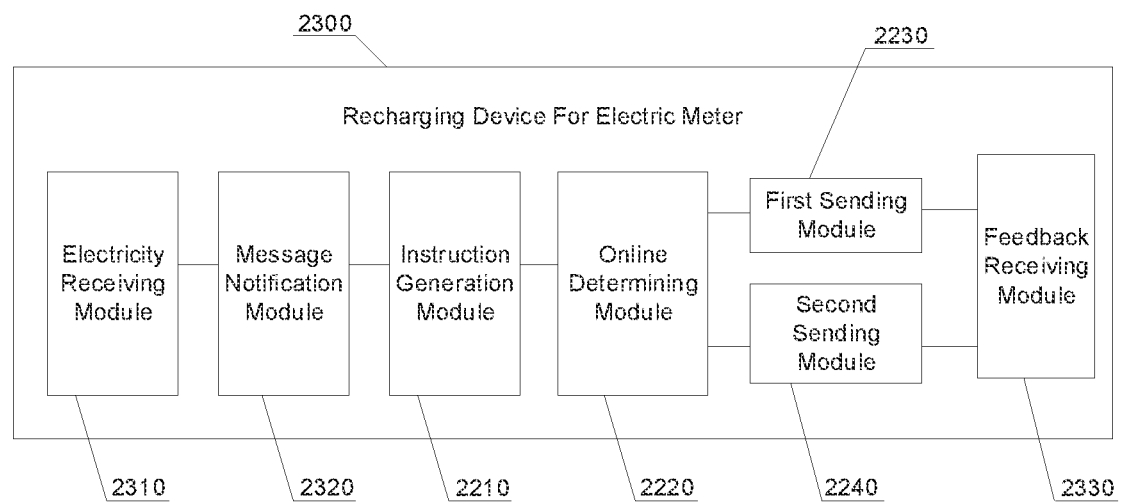
FIG. 23 is a structural diagram of another device for recharging an electric meter according to some embodiments of the present disclosure.

Based on the embodiments disclosed in the present disclosure, FIG. 23 is a structural diagram of another device for recharging an electric meter, which may be implemented on a server. As shown in FIG. 23, the device 2300 for recharging an electric meter may include modules as follows:

An electricity receiving module 2310 may be configured to receive electricity information sent by a smart electric meter.

The smart electric meter may send the electricity information to the server periodically, or when the remaining available electricity quantity is less than a minimum threshold, or when the electricity quantity that has been consumed is overspent.

A message notification module 2320 may be configured to generate payment notification information according to the electricity information and send the payment notification information to the client terminal.

The server may analyze the electricity information after the server receives the electricity information sent by the smart electric meter. If a condition for sending the payment notification information is satisfied, the server may generate the payment notification information based on the electricity information and send payment notification information to the client terminal to remind the user to pay in time. The condition for sending the payment notification information may be that the remaining electricity quantity is lower than a preset threshold, the electricity quantity that has been consumed is overspent, etc.

An instruction generation module 2210 may be configured to receive the recharge information and generate corresponding recharge instruction.

An online determining module 2220 may be configured to determine whether the smart electric meter is online.

The smart electric meter may have a network communication function and a near-field communication function.

A first sending module 2230 may be configured to send the recharge instruction to the smart electric meter when the smart electric meter is online, thus the smart electric meter may complete recharge according to the recharge instruction.

A second sending module 2240 may be configured to send the recharge instruction to the client terminal when the smart electric meter is offline, thus the client terminal may send the recharge instruction to the smart electric meter through a near field communication technique.

A feedback receiving module 2330 may be configured to receive successful recharge indication information sent by the smart electric meter after the recharge is successful or failed recharge indication information sent after the recharge is failed.

The failed recharge indication information may include failure reason information.

If the recharge instruction is executed successfully, that is, when the recharge is successful, the server may record relevant information for the record. If the recharge fails, the server may determine whether the recharge instruction needs to be reissued based on the failure reason information, or send corresponding prompt information to the user, such as a smart electric meter failure.

In the embodiment, a device for charging an electric meter may generate a payment notification to remind the user to purchase electricity quantity in time when the electric quantity of the electric meter satisfies a certain condition to avoid the inconvenience caused by the sudden power failure of the user during using electricity. At the same time, the device for recharging an electric meter may receive the message of the successful recharge or the failed recharge sent by the smart electric meter, thus it may be convenient to make corresponding operations in time and improve the user experience.

Figure 24:
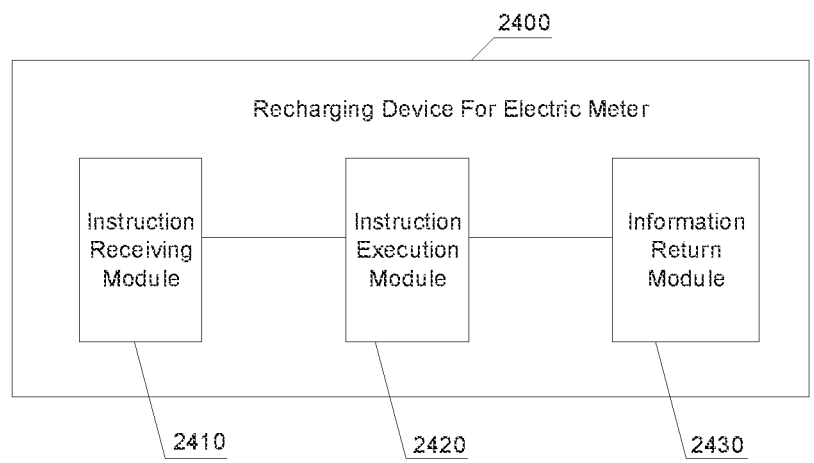
FIG. 24 is a structural diagram of another device for recharging an electric meter according to some embodiments of the present disclosure.

FIG. 24 is a structural diagram of another device for recharging an electric meter according to some embodiments of the present disclosure. The device may be implemented on a smart electric meter. As shown in FIG. 24, the device 2400 for recharging an electric meter may include modules as follows:

An instruction receiving module 2410 may be configured to receive recharge instruction issued by a server through the network or receive the recharge instruction sent by a client terminal through a near-field communication technique.

When the smart electric meter is online, the smart electric meter may receive the recharge instruction issued by the server through the network, wherein the network may be a wired network or a wireless network. When the smart electric meter is offline, the server may send the recharge instruction to the client terminal, and the smart electric meter may receive the recharge instruction sent by the client terminal through the near field communication technique.

An instruction execution module 2420 may be configured to execute the received recharge instruction.

After receiving the recharge instruction, the smart electric meter may execute the recharge instruction to complete the recharge operation to provide the user with electricity supply service continuously.

An information return module 2430 may be configured to send successful recharge indication information or failed recharge indication information to the server according to an execution result of the recharge instruction.

The failed recharge indication information may include failure reason information.

If the recharge instruction is executed successfully, that is, when the recharge is successful, the smart electric meter may send the successful recharge indication information to the server, and the server may record relevant information for filing. If the recharge instruction fails to execute, the smart electric meter may send the failed recharge indication information to the server, the server may determine whether it is necessary to reissue the recharge instruction according to the failure reason information, or send corresponding prompt information to the user, such as the failure of the smart electric meter.

In the embodiment, a device for recharging an electric meter may complete the purchase of electricity quantity through the network. The recharge instruction may be issued on the network through the near-field communication between the client terminal and the smart electric meter. The whole process may be convenient and fast to avoid normal recharge when the network signal of the smart electric meter is not good, which may greatly improve user experience.

Figure 25:
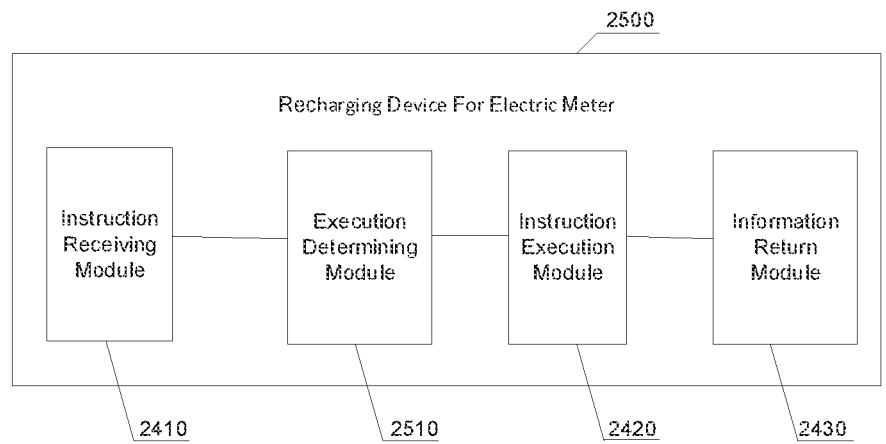
FIG. 25 is a structural diagram of another device for recharging an electric meter according to some embodiments of the present disclosure.

FIG. 25 is a structural diagram of another device for recharging an electric meter according to some embodiments of the present disclosure. The device may be implemented on a smart electric meter. Refer to FIG. 25, the device 2500 for recharging an electric meter may include modules as follows:

An instruction receiving module 2410 may be configured to receive recharge instruction issued by a server through the network, or receive the recharge instruction sent by a client terminal through a near field communication technique.

An execution determining module 2510 may be configured to determine whether the received recharge instruction is a recharge instruction that has been executed.

Specifically, if the recharge instruction includes a unique ID number, the execution determining module 2510 may be configured to determine whether the recharge instruction is a recharge instruction that has been executed according to the unique ID number. For example, after a certain recharge instruction is successfully executed, the smart electric meter may add the unique ID number stored locally to a successful recharge mark. When a new recharge instruction is subsequently executed, firstly, the unique ID number of the new recharge instruction may be compared with the unique ID number with the successful recharge mark. If the unique ID number of the new recharge instruction is the same as the unique ID number with the successful recharge mark, it may indicate that the new recharge instruction has been executed, and if all the unique ID numbers with the successful recharge mark are not the same as the unique ID number of the new recharge instruction, it may indicate that the new recharge instruction has not been executed.

The unique ID number may be a unique ID number of the recharge instruction, and the unique ID number of the recharge instruction may be generated according to a certain rule based on the meter ID and a generation time of the recharge information.

If the smart electric meter has already executed the received recharge instruction, the recharge instruction may be no longer executed to avoid repeated recharging. For example, the recharge instruction may include a unique ID number 20180101, and the unique ID number 20180101 may be included in a successful recharge ID list stored locally in the smart electric meter, which indicates that the smart electric meter has executed the recharge instruction with the unique ID number 20180101, and recharged successfully, in this case, the received recharge instruction may not be executed again.

An instruction execution module 2420 may be configured to execute the received recharge instruction.

An information return module 2430 may be configured to send successful recharge indication information or failed recharge indication information to a server according to an execution result of the recharge instruction.

When an execution determining module 2510 determines that the smart electric meter has not executed the received recharge instruction, the execution determining module 2510 may directly execute the recharge instruction.

In the embodiment, after receiving the recharge instruction, it may first determine whether the recharge instruction has been executed before, if the recharge instruction has been executed, the recharge instruction may not be executed to avoid repeated recharging.

Some embodiments of the present disclosure propose a method for controlling a switch component of a smart meter. In some embodiments, the switch component may be configured to change a resource supply state of a meter. For example, when the switch component is turned off, the meter may stop the resource supply, as another example, when the switch component is turned off, the meter may open the resource supply. In some embodiments, a server may obtain monitoring information of the meter, determine a switch component state based on the monitoring information. In some embodiments, the monitoring information may be specified state information of a switch component of the meter, information about whether the meter is online or not, or information about forced opening after the meter closes a valve. In some embodiments, the meter may switch the switch component state of the meter to a working state consistent with a specified state according to specified state information of a switch component of a server or specified state information of a switch component of a client terminal.

In some embodiments, the meter may control the switch component by itself. In some embodiments, the meter may determine the switch component state of the meter based on a connection to the network or whether an offline time of the meter is greater than a certain preset value. If the meter is offline, a working state of the switch component may be controlled to close. If the meter is online, a working state of the switch component may be maintained. In some embodiments, the meter may also obtain a resource amount at a certain moment (e.g., electricity consumption at a certain moment), and a switch component may be turned off if the resource amount at that moment is greater than a set threshold. In some embodiments, the meter may also control the switch component based on the operation of the user. For example, the meter may be provided with a controlling component (such as a configuration key, a reset button, a switch, etc.), when the controlling component is triggered according to a preset rule, the switch component may be turned off. The preset rule may include the number of triggers within a set time, for example, the controlling component may be triggered 3 times in 5 seconds, or the duration of triggering the controlling component continuously may exceed a preset time, for example, long-pressing the controlling component for 5 seconds. The present disclosure does not impose any restrictions on the descriptions mentioned above. In some embodiments, when the working state of a switch component is forced to switch from a disconnected state to a closed state by the user and the duration is longer than a certain preset time period, the monitoring parameter of the meter may be obtained again (e.g., the remaining amount of resource or the consumption of resource at a certain time), and the working state of the switch component may be controlled according to the monitoring parameter of the meter. For example, when the consumption of resource at a certain moment after reopening is greater than the set threshold, a switch component of the meter may be controlled to close a valve.

Figure 26:
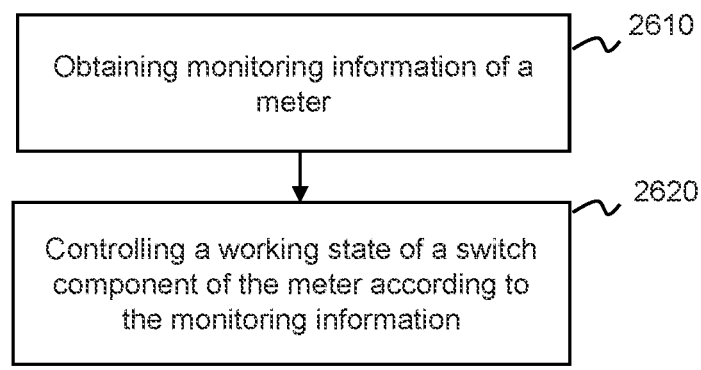
FIG. 26 is a flowchart illustrating an exemplary method for controlling a switch component of a smart meter according to some embodiments of the present disclosure.

FIG. 26 is a flowchart illustrating an exemplary method for controlling a switch component of a smart meter according to some embodiments of the present disclosure.

In step 2610, monitoring information of a meter may be obtained. In some embodiments, the monitoring information may include the amount of a resource that has been consumed, for example, the amount of electricity that has been consumed, the amount of water that has been consumed, the amount of gas that has been consumed, the time length of a house that has been rented, etc., or the monitoring information may be remaining resources, such as a remaining electricity quantity, a remaining water quantity, a remaining gas quantity, etc. In some embodiments, the monitoring information may also be designated state information of a switch component of the meter, state information about whether the meter is online or not, or information associated with forced opening after the meter closes the valve. In some embodiments, the designated state information of the switch component of the meter may be state information of the switch component of the meter designated by the server. For example, the server may specify the state information that the meter closes the valve. The state information about whether the meter being online may be that a network connection state of the meter, is in an online state or an offline state. If the network connection state of the meter is in the online state, it may indicate that the network connection of the meter is normal, and if the network connection state of the meter is in the offline state, it may indicate that the network connection of the meter is abnormal. The information associated with forced opening after the meter closes the valve may be the information that the server may forcibly change the state of the switch component to the open state after specifying the switch component of the meter to be closed.

In step 2620, the server may control a working state of the switch component of the meter according to the monitoring information.

In some embodiments, the specified state information of the switch component of the meter may be state information specified by the server or the client terminal. For example, the server may determine whether the meter closes or open the valve according to the lease information of the house, and may designate at least one meter to close the valve if the user does not pay the rent in time. As another example, the user may specify the working state of the switch component of the meter through the client terminal, and when the user is away from home, the user may specify at least one meter to close the valve through the client terminal in a certain time period. In some embodiments, when the working state specified by the server is different from the working state specified by the user through the client terminal, the working state may be negotiated or given priority to the working state specified by the server. Certainly, a priority for information that the server designates the working state based on and information that the user designates the working state based on may be set through the client terminal, thus, when the working state designated by the server is different from the working state designated by the user through the client terminal, the working state may be determined based on the priority, such as determining the working state specified based on the information with a higher priority. In some embodiments, when the meter is online, the working state of the switch component of the meter may be switched to a working state consistent with the designated state according to the designated state information of the switch component of the meter.

In some embodiments, the state information that whether the meter is online through the internet may be determined based on connection information between the meter and the network or whether the offline time of the meter is greater than a certain preset value. In some embodiments, the server may detect the network connecting state of the meter at a preset time interval, and the preset time may be determined according to actual applications, that may be 30 seconds, 3 minutes, 5 minutes, etc. In some embodiments, the meter may send a breathing instruction to the server in a certain time period, or the server may send the breathing instruction to the meter in a certain time period to determine whether the meter is online. For example, the meter may send the breathing instruction to the server. If a response instruction corresponding to the breathing instruction sent by the server is not received, the network connection of the meter may be abnormal, and the network connecting state of the meter may be offline. If the response instruction corresponding to the breathing instruction is received, the network connection of the meter may be normal, and the network connecting state of the meter may be online. In some embodiments, whether the duration of the meter continuously being in the offline state is greater than a certain preset duration may be determined if the network connecting state of the meter is offline, and if the duration of the meter continuously being in the offline state is greater than the first preset duration, the meter connecting state may be determined to be in the offline state. In some embodiments, the working state of the switch component may be controlled to be a state of closing the valve when the meter is in the offline state. In some embodiments, the working state of the switch component may be unchanged when the meter is in the online state. The offline state of the meter may be caused by stealing resources. Therefore, controlling the working state of the switch component based on the state information whether the meter is in the online state may reduce the probability of stealing resources.

In some embodiments, controlling the switch state of the meter according to the state information of forced opening after the meter closes the valve may be that after the meter executes a designated closing operation, the working state of the switch component may be switched from a disconnected state to a closed state. If it is determined that the duration of switching the working state of the switch component from the disconnected state to the closed state is longer than a certain preset duration, the monitoring parameters of the meter may be obtained, and the working state of the switch component may be controlled according to the monitoring parameters of the meter. For example, after the server directs the meter to close the valve, the user may specify the meter to open the valve through the client terminal, and the duration after opening may be greater than the preset duration (for example, 30 minutes), then the monitoring parameters (e.g., total usage information, remaining usage information) of the meter may be obtained, and the switch component of the meter may be controlled to be closed if the determined amount of resource is greater than the remaining amount of resource after reopening. The meter may be kept open if the user completes the recharge after opening the valve, and the total amount of resource may be less than the remaining amount of resource after the recharge. In some embodiments, the monitoring parameters obtained herein may be the remaining amount of resource, the amount of recharge, and the amount of resource that has been used within a time range after the forced opening. It may ensure that the user may still use the resource when a remaining amount or a small amount of recharge has been made. When the remaining amount is 0, a user may be prevented from continuing to steal the resource. In some embodiments, the way of forcibly opening the valve may be that the user may manually operate the switch component to open the valve. In some embodiments, the way of forcibly opening the valve may be that the user may repeatedly execute a designated opening operation of the valve. For example, three consecutive keypresses within 5 seconds may indicate the designated opening operation.

In some embodiments, the working state of the switch component of the meter may be controlled based on the monitoring information such as resource usage, remaining usage, maximum allowable power, etc. For example, the consumption amount of a resource corresponding to the meter during the time period may be obtained at each of the time periods. If the consumption amount of resource corresponding to the meter during the time period is greater than a maximum available electricity quantity (remaining electricity quantity), the working state of the switch component may be controlled to be closed. During the time period, if the consumption amount of resource is less than or equal to the maximum available electricity quantity, the working state of the switch component may be controlled to be open. Alternatively, the total electricity quantity of the electric meter during the time period may be obtained at each of the time periods. If the total power obtained at a plurality of time periods (such as at least twice) is greater than a preset electricity power, the working state of the switch component may be controlled to be closed.

The method may automatically control the working state of the switch component of the meter according to the remaining amount of resource of the tenant or in the house, the current total power of electricity consumption, the recharge situation, and the personal requirements. A manager may directly control the working state of the meter without having to arrive at the site, which reduces the workload of the manager.

Figure 27:
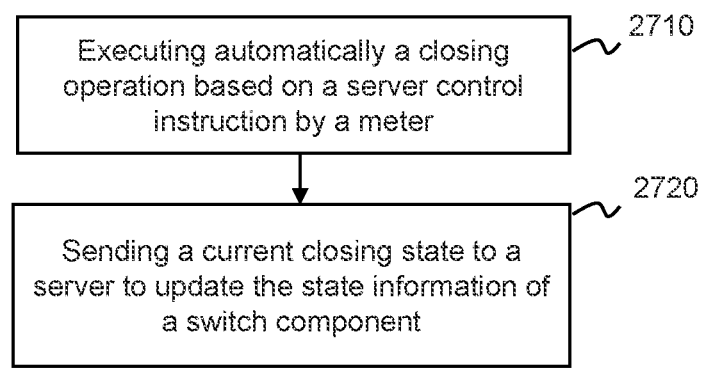
FIG. 27 is a flowchart illustrating another exemplary method for controlling a switch component of a smart meter according to some embodiments of the present disclosure.

FIG. 27 is a flowchart illustrating another exemplary method for controlling a switch component of a smart meter according to some embodiments of the present disclosure.

In step 2710, a meter may automatically execute a closing value operation based on a control instruction from a server. In some embodiments, the server may determine the control instruction of the switch component based on designated state information of the switch component of the meter, state information whether the meter is online or not, information about forced opening after the meter is closed, or other monitoring information. In some embodiments, the meter may determine the control instruction according to the priority of different monitoring information.

In step 2720, a current closing valve state or opening valve state may be sent to the server and the state information of the switch component may be updated. In some embodiments, if the meter is in the online state through a network, the meter may directly send the state information of the switch component to the server. In some embodiments, if the meter is offline through the network, the meter may first save the state information of the switch component in a database in the meter. When the meter changes from the offline state to the online state, the database of the meter and the server may execute data synchronization to update the configuration information of the meter. In some embodiments, when the working state of the switch component in the configuration information of the server is inconsistent with the working state of the switch component of the current meter, the current working state of the switch component may be changed according to the latest configuration information of the time, and the updated working state information of the switch component may be sent to the server.

Figure 28:
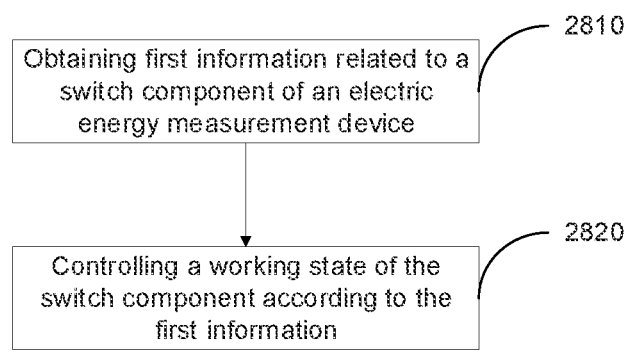
FIG. 28 is a flowchart illustrating an exemplary method for controlling a working state of a switch component of an electric meter according to some embodiments of the present disclosure.

FIG. 28 is a flowchart illustrating an exemplary method for controlling a working state of a switch component of an electric meter according to some embodiments of the present disclosure.

In step 2810, first information related to a switch component of an electric meter.

It may be understood that the switch component may be a component of the electric meter configured to control whether the electric meter may supply power to other devices (such as household devices) that are connected with the electric meter through one or more electricity supply lines. If the working state of the switch component is in a disconnected state, the electric meter may stop supplying power to other devices that are connected with the electric meter; if the working state of the switch component is in a closed state, the electric meter may supply power to other devices that are connected with the electric meter.

The first information may be one or more types of monitoring information. For example, the first information may be configured to indicate at least one of the working state designated by the server for the switch component, the duration of the electric meter continuously in the offline state, and the working state of the switch component after performing a preset operation on a first component related to the switch component. In other words, the first information may be at least one of the working state specified by the server for the switch component, the duration that the meter has been continuously in the offline state, the working state of the switch component after performing the preset operation on the first component related to the switch component. For example, the first information may be the working state of the switch component after performing a preset operation on the first component related to the switch component, thus the working state of the switch component may be controlled through the first information.

The first component may be a component of the electric meter configured to control the working state of the switch component, that is, the first component may correspond to one of the closed state and the disconnected state of the switch component, and the preset operation may be the operation determined for the first component based on actual applications. After the preset operation is executed by the first component, the first component may indicate that the switch component is in a working state bound by the first component. If the working state bound by the first component is the closed state, the switch component may be controlled to be closed if the switch component is in the disconnected state after the first component executes the preset operation. The preset operation may be not limited by the embodiments of the present disclosure and may be determined according to actual applications. For example, the preset operation may be a continuous pressing operation on the first component within a first time period.

The network connecting state of the electric meter may be configured to indicate a network connection of the electric meter. In the embodiment, the network connecting state of the electric meter may be one of an online state and an offline state. If the network connecting state of the electric meter is the online state, it may indicate that the network connection of the electric meter is normal, if the network connecting state of the electric meter is the offline state, it may indicate that the network connection of the electric meter is abnormal.

The network connecting state of the electric meter may be determined by a network detection technique. For example, the process of using the network detection technique to determine the network connecting state of the electric meter may include the electric meter sending a breathing instruction to the server at a certain interval. If the electric meter does not receive a response instruction corresponding to the breathing instruction sent by the server, it may indicate that the network connection of the electric meter is abnormal, and the network connecting state of the electric meter is the offline state. If the electric meter receives the response instruction corresponding to the breathing instruction sent by the server, it may indicate that the network connection of the electric meter is normal, and the network connecting state is the online state.

In step 2820, a working state of the switch component may be controlled according to the first information.

The following descriptions may illustrate any one of the first information being the working state specified by the server for the switch component, the first information being the duration that the meter is continuously in the offline state, and the first information being the working state of the switch component after a preset operation is executed on the first component related to the switch component.

When the first information is the working state specified by the server for the switch component, the process of controlling the working state of the switch component may include when the electric meter is in the online state, determining whether the current working state of the switch component is consistent with the working state specified by the server for the switch component. If the current working state of the switch component is inconsistent with the working state specified by the server for the switch component, the current working state of the switch component may be switched to the working state specified by the server for the switch component.

For example, the current working state of the switch component may be the closed state. If the working state specified by the server for the switch component is the disconnected state, the current working state of the switch component may be switched to be the disconnected state. If the working state specified by the switch component of the server is the closed state, the current working state of the switch component may be maintained.

The working state specified by the server for the switch component may be a desired state of the switch component, that may be determined by the server according to the lease of the house that uses the meter, for example, based on whether the house that uses the electric meter is in arrears. If the rent arrears occur, the specified working state for the switch component may be the disconnected state, which may automatically control the working state of the switch component according to the rental situation of the house. In particular, when the house is in arrears, the working state of the switch component may be controlled to remind the user to pay the rent, or the user may send the working state specified by the user for the switch component to the server through the client terminal. For example, if the user designates the working state according to the time length that the user leaves the house that uses the electric meter, the time length the user leaves the house is greater than N days, and N is greater than 1, the user may designate the working state to be the disconnected state to make the user control the working state of the switch component according to the situation.

It should be noted that the two ways of designating the working state of the switch component may be applied to the electricity meter, but the information that the server specified the working state based on may be different from the information that the user specified the working state based on through the client terminal. For example, the server may specify the working state based on the lease of the house that uses the electric meter, the user may specify the working state through the client terminal according to own situations, and when the working state designated by the server is different from the working state specified by the user through the client terminal, a working state may be negotiated or giving priority to the working state specified by the server. Certainly, the priority may also be set for the information that the server specifies the working state based on and information that the user specifies the working state based on through the client terminal. Thus, when the working state specified by the server is different from the working state specified by the user through the client terminal, a working state may be determined based on the priority, such as determining the working state that is designated based on information with the higher priority.

The first information may be the information that the electric meter continues to be in the offline state, and the process of controlling the working state of the switch component may include determining whether the duration of the electric meter continuously being in the offline state is greater than a first preset duration; if the duration of the meter continuously being in the offline state is greater than the first preset time period, the working state of the switch component may be controlled to be the disconnected state.

The continuous offline state of the electric meter may indicate that the electric meter has been in the offline state for a period of time, and the time period may include an ending time corresponding to the last offline state and a stating time corresponding to a first offline state when the electric meter is continuously in the offline state. If the time period (that is, the duration of the offline state) is greater than the first preset time period, the working state of the switch component may be controlled to be the disconnected state to realize controlling the working state of the switch component based on the state of the electric meter. The first preset duration may be determined according to the actual application, and the embodiment does not limit the value of the first preset duration.

When the first information is the working state of the switch component after the preset operation is executed on the first component related to the switch component, the process of controlling the working state of the switch component may include after obtaining an operating body executing the preset operation on the first component, switching the working state of the switch component from the disconnected state to the closed state, and if it is determined that the duration of the working state of the switch component switching from the disconnected state to the closed state is longer than a second preset time period, one or more working parameters of the electric meter may be obtained and the working state of the switch component may be controlled according to the working parameters of the electric meter. The operating body may be the user or some objects available for the user, such as insulating objects available for the user, e.g., a wooden stick, etc.

In other words, when the preset operation is performed on the first component, the working state of the switch component may be the disconnected state, and after the preset operation is performed on the first component, the working state of the switch component may be switched from the disconnected state to the closed state (which may be automatically switched), at this time, it may be necessary to further obtain the duration of the switch component from the disconnected state to the closed state (that is, the duration after switching to the closed state), and determine whether the duration is greater than the second preset duration. If the duration is greater than the second preset duration, the working parameters of the electric meter may be obtained, thereby controlling the working state of the switch component according to the working parameters of the electric meter.

The second preset duration may be determined according to actual applications, and the value of the second preset duration may be not limited in the embodiments of the present disclosure. The obtained working parameter may be the total electricity consumption quantity of the electric meter, and the total electricity consumption quantity of the electric meter may be determined from a starting time when the switching of the working state of the switch component from the disconnected state to the closed state is performed after the preset operation is performed on the first component. For example, the total electricity consumption quantity of the electric meter may include the electricity quantity consumed within a time range corresponding to the duration of the switch component switching from the disconnected state to the closed state.

Correspondingly, according to the working parameters of the electric meter, a feasible way to control the working state of the switch component may include controlling the working state of the switch component to be maintained in the closed state if the total electricity consumption quantity of the electric meter is less than a maximum available electricity quantity of the meter. If the total electricity consumption quantity of the electric meter is greater than or equal to the maximum available electricity quantity of the electric meter, the working state of the control switch component may be switched from the closed state to the disconnected state.

The maximum available electricity quantity may be rated electricity preset for the electric meter, but the rated electricity may not limit an electricity quantity that may be used by the electric meter from the starting time when the working state of the switch component is switched from the disconnected state to the closed state after the preset operation is performed on the first component. Therefore, in some cases, the total electricity consumption quantity of the electric meter may be greater than the electricity quantity that may be used. At this time, the switch component may be in a closed state, resulting in a control error of the switch component. Therefore, in the embodiment, the maximum available electricity quantity in the time period corresponding to the duration of the switch component in the closed state switched from the disconnected state may be set to the maximum available electricity quantity of the electric meter to control the switch component based on the electricity consumption quantity of the electric meter in the time period corresponding to the duration and the maximum available electricity quantity within the time period corresponding to the duration, and reduce the probability of controlling errors.

Specifically, if the electricity consumption quantity of the electric meter in the time period corresponding to the duration is less than the maximum available electricity quantity in the time period corresponding to the duration, the working state of the control switch component may be maintained in the closed state. If the electricity consumption quantity of the electric meter in the time period corresponding to the duration is greater than or equal to the maximum available electricity quantity in the time period corresponding to the duration, the working state of the control switch component may be switched from the closed state to the disconnected state.

In other words, the electricity consumption quantity of the electric meter in the time range corresponding to the duration may be less than the maximum available electricity quantity in the time period corresponding to the duration, indicating that there may be a remaining electricity quantity in the electric meter, and the working state of the switch component may be controlled to maintain the closed state to supply electricity, otherwise, the working state of the switch component may be switched to be the disconnected state to stop power supply.

It may be understood that the application scenarios for the control may include supplying power in the short-term when the available electricity quantity of the electric meter is insufficient, and the purpose of stealing electricity may not be achieved by repeatedly performing the preset operation on the first component, for example, when the available electricity quantity in the electric meter is insufficient (less than 0), the working state of the switch component may automatically change to be the disconnected state. At this time, the preset operation may be executed on the first component, and the working state of the switch component may be switched from the disconnected state to the closed state (it may be automatically switched). Within the time period corresponding to the duration of the switch component maintaining the closed state, the electric meter may continue to supply power within the time period corresponding to the duration, and the user may recharge the electric meter within the time period corresponding to the duration (purchasing available electricity).

If the purchased available electricity quantity (which may be regarded as the maximum available electricity quantity) is greater than the electricity consumption quantity of the electric meter in the time range corresponding to the duration, it may indicate that the available electricity quantity purchased by the user may be surplus after subtracting the electricity consumption quantity of the electric meter within the time period corresponding to the duration. At this time, the switch component may be maintained in the closed state to make the electric meter supply power continuously. If the purchased available electricity quantity is less than or equal to the electricity consumption quantity of the electric meter in the time period corresponding to the duration, it may indicate that the available electricity quantity purchased by the user may not be surplus after subtracting the electricity consumption of the electric meter within the time period corresponding to the duration. At this time, the switch component may be controlled to switch from the closed state to the disconnected state to make the electric meter stop supplying power. If the user does not purchase the available electricity quantity within the time period corresponding to the duration, the maximum available electricity quantity may be still 0. At this time, it may also determine that the electricity consumption quantity of the electric meter within the time period corresponding to the duration may be greater than the maximum available electricity quantity, and then the switch component may be controlled to switch from the closed state to the disconnected state to make the electric meter stop supplying power.

The following descriptions may describe the controlling of the working state of the switch component when the first information is the working state of the switch component after the preset operation is executed on the first component related to the switch component in the embodiment. In the embodiment, the user may be regarded as the operating body, the first component may be a configuration key related to the switch component, and the user may click the configuration key. If the user clicks the configuration key three times in 5 seconds (considering as repeated executions of the preset operation), whether the switch component is currently in the disconnected state may be determined, and if the switch component is currently in the disconnected state, the switch component may be controlled to automatically switch from the disconnected state to the closed state. The starting time may be the time when the switch component is automatically switched to the closed state, and whether the duration of the switch component continuously in the closed state from the starting time is greater than the second preset duration (such as 30 minutes) may be determined, and if the duration of the switch component continuously in the closed state is greater than the second preset duration, the electricity consumption quantity of the electric meter within 30 minutes may be obtained, and whether the electricity consumption quantity of the electric meter within the 30 minutes is greater than or equal to the maximum available electricity quantity of the electric meter within the 30 minutes may be determined. If the electricity consumption quantity of the electric meter within the 30 minutes is greater than or equal to the maximum available electricity quantity of the electric meter within the 30 minutes, it may indicate that there is no remaining electricity quantity in the electric meter. At this time, the switch component may be controlled to switch from the closed state to the disconnected state, otherwise, the switch component may be controlled to maintain the closed state.

It should be noted that when the working state of the switch component is switched if the electric meter is in the online state, the electric meter may report to the server that the working state of the switch component is switched and report the working state after switching to the server, and the working state of the switch component recorded in the server may be consistent with its actual state. Therefore, the server may analyze the working state of the switch component through the recorded working state, for example, analyzing the reason that the working state of the switch component changes.

Certainly, in addition to the three aspects of controlling the working state of the switch component, the embodiment may also control the working state of the switch component from other aspects, for example, obtaining the working parameters of the electric meter during the time period at intervals, controlling the working state of the switch component in the time period according to the working parameters of the electric meter.

For example, the electricity consumption quantity of the electric meter during the time period may be obtained at each of time periods, for example, the electricity consumption quantity of the electric meter during one hour may be obtained at every hour, which may not be limited to one hour. If the electricity consumption quantity of the electric meter during the time period is greater than the maximum available electricity quantity (the remaining electricity quantity after the last time period), the working state of the switch component may be controlled to be the disconnected state, and if the electricity consumption quantity of the electric meter in the time period is less than or equal to the maximum available electricity quantity, the working state of the switch component may be controlled to be the closed state. Alternatively, the total power of the electric meter during the time period may be obtained at each of the time periods. If the total power obtained for a plurality of times (such as at least twice) is greater than a preset power, the working state of the switch component may be controlled to be the closed state.

The preset power may be modified according to actual needs. For example, the preset power may be 1000 watts at a certain time period, and the preset power may be 500 watts at other time periods. The reason that controlling the working state of the switch component to be the closed state under the condition that the total power obtained in the plurality of consecutive times is greater than the preset power may include under the influence of some uncertain factors (such as voltage instability), the total power may instantly increase beyond the preset power. In this case, there may be no need to control the working state of the switch component to be the closed state, to prevent the working state of the switch component from changing due to uncertain factors. The embodiment may need to control the working state of the switch component to be the closed state when the total power obtained in the plurality of consecutive times is greater than the preset power and reduce the probability of control errors.

It may be known from the technical solution that after obtaining the first information related to the switch component in the electric meter, the working state of the switch component may be controlled according to the first information. The first information may be configured to indicate at least one of the working state designated by the server for the switch component, the duration that the electric meter is continuously in the offline state, the network connecting state of the electric meter, and the working state of the switch component after the preset operation is performed on the first component related to the switch component. Therefore, the working state of the switch component may be controlled at least based on the three aspects of the working state designated by the server for the switch component, the duration of the electric meter in an offline state, and the working state of the switch component after the preset operation is performed on the first component related to the switch component. Comparing with the prior art, the illustration mentioned above may increase the control way.

In addition, a method for controlling a working state according to some embodiments may also control the synchronization of information between the electricity meter and the server. The process may be described as follows:

The processing may include sending an information synchronization request to the server through a first wireless channel, the server obtaining the configuration information after receiving the information synchronization request of the electric meter, and sending the configuration information to the electric meter through the first wireless channel. The information synchronization request may be sent to the server through the second wireless channel by a gateway. The server may need to send the configuration information to the gateway through the second wireless channel after obtaining the configuration information. The gateway may send the configuration information to the electric meter through a first wireless channel. The first wireless channel and the second wireless channel may be two types of wireless channels, which may not be specifically limited in the embodiment.

The processing may include receiving the configuration information corresponding to the information synchronization request through the first wireless channel.

The processing may include synchronizing information according to the configuration information, thus the configuration information in the electricity meter and the server may be consistent. If the configuration information includes the working state designated for the switch component by the server that may be used as the first information, the working state of the switch component may need to be controlled according to the first information, the embodiment may not be further illustrated. After the working state of the switch component may be controlled based on the first information, the current working state of the switch component may be reported to the server, for example, reporting to the gateway through the first wireless channel, and then the gateway may report to the server through the second wireless channel, thus the working state of the switch component of the electric meter and the server may be consistent.

Figure 29:
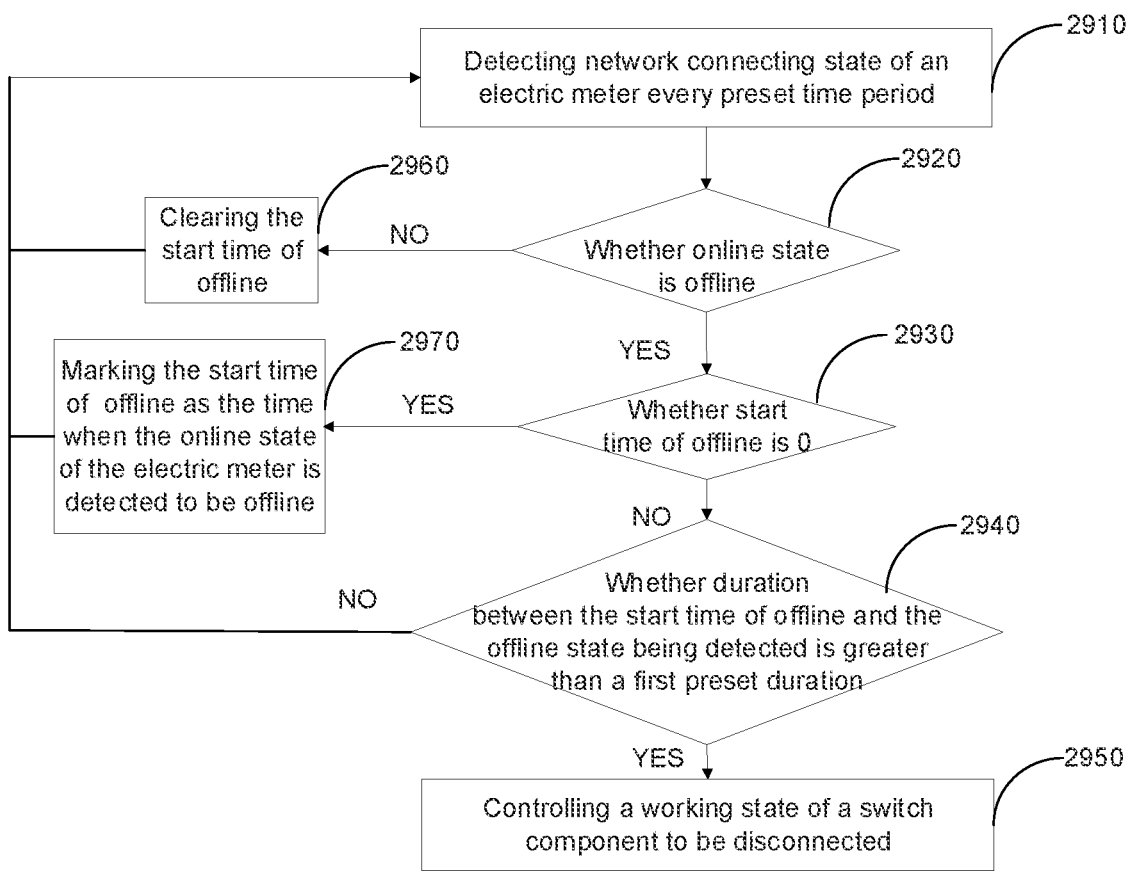
FIG. 29 is a flowchart illustrating an exemplary method for controlling a switch component when an electric meter is continuously in an offline state according to some embodiments of the present disclosure.

FIG. 29 is a flowchart illustrating an exemplary method for controlling a switch component when an electric meter is continuously in an offline state according to some embodiments of the present disclosure.

In step 2910, a network connecting state of an electric meter may be detected at every preset time period. The preset time period may be determined according to actual applications and may be not limited herein, and the detection of the connection state of the electric meter may refer to the related descriptions in step 2810, which may not be described in the embodiment.

In step 2920, whether the detected network connecting state of the electric meter is an offline state may be determined.

In step 2930, whether a start time of offline is 0 if the network connecting state of the electric meter is the offline state.

In step 2940, whether the duration between the start time of offline and the time when the offline state is detected at the current time period is greater than a first preset duration if the start time of offline of the electric meter is not 0. If the duration is not greater than the first preset duration, step 2910 may be performed to continue to detect the network connecting state of the electric meter. The working state of the switch component may be unchanged when the duration between the start time of the offline and the time when the offline state is detected at the current time period is not greater than the first preset duration.

In step 2950, a working state of the switch component may be controlled to be a disconnected state when the duration between the start time of the offline and the time when the offline state is detected at the current time period is greater than the first preset duration.

In step 2960, the start time of offline may be cleared if the network connecting state of the electric meter is the online state, and step 2910 may be performed to continuously check the network connecting state of the electric meter. The clearing the start time of offline may be performed by setting the value of the start time of offline to 0, and the start time of offline may be the time when the electric meter is detected to be in the offline date for the first time when the switch component is controlled based on the state of the electric meter.

In step 2970, the start time of offline may be marked as the time when the network connecting state of the electric meter is detected to be the offline state and step 2910 is performed to continuously detect the network connecting state of the electric meter.

The process illustrated above may realize the control of the working state of the switch component based on the network connecting state of the electric meter, and sometimes the electric meter being offline may be caused by stealing electricity, thus controlling the working state of the switch component through the process may reduce the probability of stealing electricity.

Figure 30:
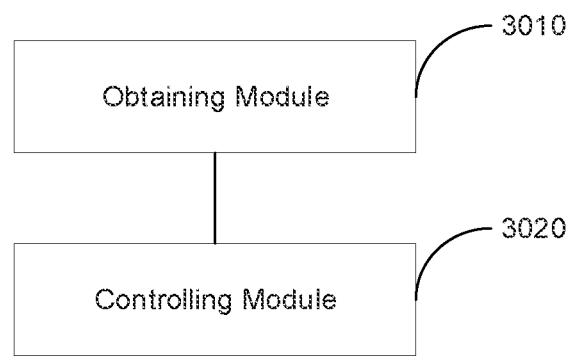
FIG. 30 is a structural diagram of a device for controlling a working state of an electric meter according to some embodiments of the present disclosure.

Corresponding to the method embodiment mentioned above, the present disclosure may provide a device for controlling a working state of an electric meter. The device may be shown in FIG. 30 and may include an obtaining unit 3010 and a controlling unit 3020.

The obtaining unit 3010 may be configured to obtain first information related to a switch component of an electric meter. For the description of the switch component, please refer to the related description in the embodiment, and the first information related to the switch component may be configured to indicate at least one of the working states designated by the server for the switch component, the duration of the electric meter continuously in the offline state, and the working state of the switch component after performing a preset operation on a first component related to the switch component.

The first component may be a component of the electric meter configured to control the working state of the switch component, that is, the first component may correspond to one of the closed state and the disconnected state of the switch component, and the preset operation may be the operation determined for the first component according to actual applications. After the preset operation is executed by the first component, the first component may indicate that the switch component is in a working state bound by the first component. If the working state bound by the first component is the closed state, the switch component may be controlled to be closed if the switch component is in the disconnected state after the first component executes the preset operation. The preset operation may be not limited by the embodiments of the present disclosure and may be determined according to actual applications. For example, the preset operation may be a continuous pressing operation on the first component within a first time period.

The network connecting state of the electric meter may be configured to indicate a network connecting state of the electric meter. In the embodiment, the network connecting state of the electric meter may be one of an online state and an offline state. For specific instructions, please refer to relevant instructions in the embodiment. The embodiment may not be explained again.

The controlling unit 3020 may be configured to control a working state of the switch component according to the first information.

The following descriptions may illustrate any one of three aspects: the first information may be the working state specified by the server for the switch component, the duration that the electric meter is in the offline state, and the working state of the switch component after a preset operation is executed on the first component related to the switch component.

When the first information is the working state specified by the server for the switch component, the process of the controlling unit 3020 controlling the working state of the switch component may include when the electric meter is in the online state, determining whether the current working state of the switch component is consistent with the working state specified by the server for the switch component. If the current working state of the switch component is inconsistent with the working state specified by the server for the switch component, the current working state of the switch component may be switched to the working state specified by the server for the switch component. For example, the current working state of the switch component may be the closed state. If the working state specified by the server for the switch component is the disconnected state, the current working state of the switch component may be switched to the disconnected state. If the working state specified by the server for the switch component is the closed state, the current working state of the switch component may be maintained.

When the first information is the information that the electric meter continues to be in the offline state, the process of the controlling unit 3020 controlling the working state of the switch component may include determining whether the duration of the electric meter continuously being in the offline state is greater than a first preset duration; if the duration of the electric meter continuously being in the offline state is greater than the first preset time period, the working state of the switch component may be controlled to be the disconnected state.

When the first information is the working state of the switch component after the preset operation is executed on the first component related to the switch component, the process of controlling the working state of the switch component by the controlling unit 3020 may include after obtaining an operating body executing the preset operation on the first component, the working state of the switch component may be switched from the disconnected state to the closed state, and if it is determined that the duration that the working state of the switch component switching from the disconnected state to the closed state is longer than a second preset duration, one or more working parameters of the electric meter may be obtained and the working state of the switch component may be controlled according to the working parameters of the electric meter. The operating body may be the user or some objects available for the user, such as insulating objects available for the user, e.g., a wooden stick, etc.

For example, the obtaining unit 3010 may obtain the total electricity consumption quantity of the electric meter; correspondingly, the controlling unit 3020 may be configured to control the working state of the switch component to be maintained in the closed state if the total electricity consumption quantity of the electric meter is less than a maximum available electricity quantity of the electric meter. If the total electricity consumption quantity of the electric meter is greater than or equal to the maximum available electricity quantity of the electric meter, the working state of the switch component may be controlled to be switched from the closed state to the disconnected state. The total electricity consumption of the electric meter may include the electricity consumption of the electric meter in a time range corresponding to the duration. The maximum available electricity quantity of the electric meter may include the maximum available electricity within the time period corresponding to the duration.

For the descriptions of three controlling processes of the controlling unit 3020, please refer to the relevant descriptions in the embodiment, which may not be described in the embodiment.

Certainly, in addition to the above three aspects of controlling the working state of the switch component, the controlling unit 3020 of the embodiment may also control the working state of the switch component from other aspects, such as obtaining the working state of the electric meter during the time period at intervals, controlling the working state of the switch component in the time period according to the working parameter of the electric meter.

For example, the electricity consumption quantity of the electric meter during the time period may be obtained at each time period, such as the electricity consumption quantity of the electric meter during one hour may be obtained at every hour, which may not be limited to one hour. If the electricity consumption quantity of the electric meter during the time period is greater than the maximum available electricity quantity (the remaining electricity quantity after the last time period), the working state of the switch component may be controlled to be the disconnected state, and if the electricity consumption quantity of the electric meter in the time period is less than or equal to the maximum available electricity quantity, the working state of the switch component may be controlled to be the closed state. Alternatively, the total power of the electric meter during the time period may be obtained at each time period. If the total power obtained in a plurality of times (such as twice) is greater than a preset power, the working state of the switch component may be controlled to be closed.

Also, the controlling unit 3020 in the embodiment may also control the synchronization of information between the electricity meter and the server, and the process described in the embodiment may not be described in the embodiment.

It may be known from the above technical solution that after obtaining the first information related to the switch component of the electric meter, the working state of the switch component may be controlled according to the first information. The first information may be configured to indicate at least one of the working states specified by the server for the switch component, the duration of the electric meter continuously in the offline state, the network state of the electric meter, and the working state of the switch component after performing a preset operation on a first component related to the switch component. Therefore, the working state of the switch component may be controlled at least according to three aspects: the working state specified by the server for the switch component, the duration of the electric meter continuously in the offline state, and the working state of the switch component after performing the preset operation on the first component related to the switch component. Therefore, comparing with the prior art, the present disclosure may increase control ways.

The present disclosure relates to a method for associated control of a plurality of meters and smart devices. In some embodiments, the server may obtain monitoring information of at least one type of resource of a house (the first type of resource). The types of resources of the house may include an electricity resource, a water resource, a gas resource, a rent (house rent, the usage of smart devices), and other living resources required for daily rent. The first type of resource may be any resource of the house. In some embodiments, the monitoring information may be monitoring information related to the first type of resource. In some embodiments, a server may determine the remaining amount of the first type of resource according to the monitoring information of the first type of resource, and turn off at least one meter or smart device when the remaining amount of the first type of resource is less than an available amount of the first type of resource. For example, the meter corresponding to the first type of resource, or the meter or smart device of other resources may be turned off to help a renting house manager or renting house owner to manage the house, and avoid the arrears of the user causing losses to the manager or owner.

Figure 31:
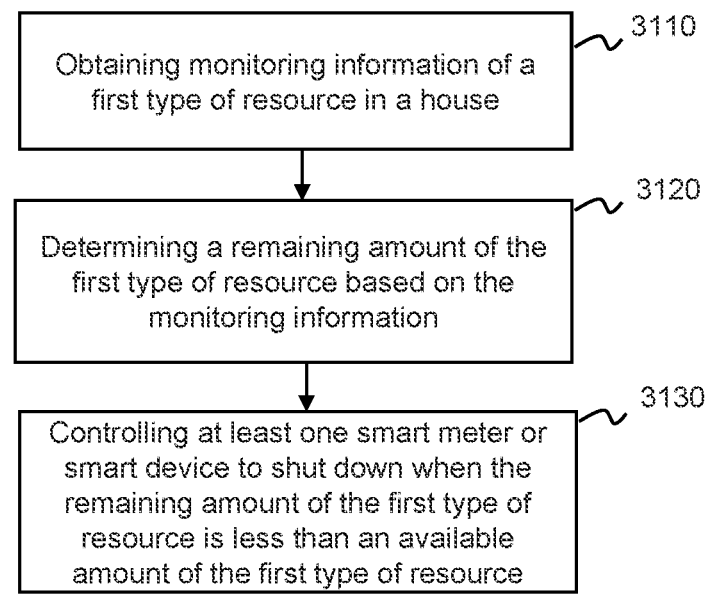
FIG. 31 is a flowchart illustrating an exemplary method for associated control of a plurality of smart meters and smart devices according to some embodiments of the present disclosure.

FIG. 31 is a flowchart illustrating an exemplary method for associated control of a plurality of smart meters and smart devices according to some embodiments of the present disclosure.

In step 3110, monitoring information of a first type of resource in a house may be obtained.

In some embodiments, the house may be a certain house or a certain room dedicated to renting, such as a hotel, a rental house, a rental apartment, etc. In some embodiments, the resource types in the house may include an electricity resource, a water resource, a gas resource, rents (the house rent, the usage of smart devices), and other living resources required for daily rent. The first type of resource may be any resource in the house, for example, the electricity resources or the rent. In some embodiments, each resource may be controlled by a corresponding meter. For example, an electric meter may control the usage record and supply of electric resources, a water meter may control the usage record and supply of water resources, and a gas meter may control the usage record and supply of gas resources. In some embodiments, the rent may be recorded and managed by a rent manager or a house owner through a server or a client terminal and the supply of the house rent or devices may be controlled by controlling the closing of at least one meter or the closing of at least one smart device. In some embodiments, the monitoring information may be monitoring information related to the corresponding resource. For example, an electricity consumption quantity and a remaining electricity quantity may be monitoring information related to electric resources. A prepaid rent, a used rent, and a remaining rent may be monitoring information related to the house rent, and other resource supplies used by the smart devices in the house. In some embodiments, the monitoring information may be collected by a data collection module built in a collector or a meter and uploaded to the server.

In step 3120, the remaining amount of the first type of resource may be determined based on the monitoring information.

In some embodiments, the server may store the amount information of the first type of resource that has been consumed and the remaining amount information of the first type of resource uploaded each time. The amount of the first type of resource that has been consumed in a current upload cycle may be determined according to the cumulative amount of the first type of resource in the current upload cycle and a previous cumulative amount of the first type of resource that has been consumed in a previous upload cycle, and the current remaining amount of the first type of resource may be determined by subtracting the amount of the first type of resource that has been consumed in the current upload cycle from the last remaining amount in the previous upload cycle. For example, the cumulative water consumption volume in the previous upload cycle may be 10 tons of water, the remaining water volume in the previous upload cycle may be 90 tons of water, and the cumulative water consumption volume in the current upload cycle may be 20 tons of water, then the actual water consumption volume in the current upload cycle may be 20-10=10 tons of water, the remaining water volume may be 90−10=80 tons of water in the current upload cycle.

In step 3130, at least one smart meter or smart device may be controlled to close a valve when the remaining amount of the first type of resource is less than an available amount of the first type of resource.

In some embodiments, the preset available amount of the first type of resource may be a minimum available amount of the first type of resource. When the remaining amount of the first type of resource of the user is less than the available amount of the first type of resource, the meter corresponding to the first type of resource may be controlled to close the valve, and the user may be prevented from using the first type of resources continuously. In some embodiments, when the remaining amount of the first type of resource is less than the available amount of the first type of resource, other meters or smart devices may be controlled to turn off at the same time to prohibit the user from using other resources continuously. For example, when the remaining rent is less than the unit price of daily rent, the smart door lock may be controlled to close, or the meter may be controlled to close the valve, or the smart door lock may be closed and the meter may be controlled to close the valve at the same time.

In some embodiments, when the current remaining amount of the first type of resource is less than a preset warning amount of the first type of resource, warning information may be sent to the client terminal. In some embodiments, the warning amount of the first type of resource may be greater than the available amount of the first type of resource. A message may be sent to the client terminal to remind the user to recharge as soon as possible when the remaining amount of the first type of resource reaches the warning amount of the first type of resource.

In some embodiments, when the server receives the fee for the first type of resource paid by the user, the server may control at least one previously closed smart meter to open the valve or the opening of the smart device. In some embodiments, the fee of the first type of resource may be re-determined according to the fee of the first type of resource paid by the user, and if the updated remaining amount of the first type of resource is greater than the available amount of the first type of resource, at least one previously closed smart meter may be controlled to open the valve or the smart device may be controlled to open. In some embodiments, the updated remaining amount of the first type of resource may be the sum of the remaining amount of the first type of resource in the previous upload cycle and the fee of the first type of resource paid by the user.

In some embodiments, if the current remaining amount of the first type of resource is less than the available amount of the first type of resource, after turning off at least one meter or a smart device and the user does not recharge for a certain time period, the server may control other meters or the smart devices to be turned off. For example, if the remaining electricity quantity is less than an available electricity quantity, the meter may be turned off, and the user does not recharge and pay within a week, the smart door lock may be further controlled to be closed.

In some embodiments, if the first type of resource is allowed to be overspent, the first type of resource has been overspent, and when the overspent usage amount has exceeded a maximum overspent amount, other meters or smart devices may be controlled to be further turned off. For example, if the electricity overspent amount is greater than a maximum electricity overspent amount, the smart door lock may be further controlled to be turned off after the meter closes the valve.

The technical solution may be applied to the management of rental houses and may improve management efficiency. Rental houses may be generally single-family houses. After renting a house, users should pay water, electricity, and gas fees in time to realize water supply, electricity supply, and gas supply normally, otherwise, it may bring economic losses to the lessors. Applying the technical solution to the rental housing management, when users are in arrears, long-term non-payment or overspending of resources, a plurality of meters or smart devices may be forcibly controlled to be turned off, thus the user may not enter and exit the rental housing or use other resources, thereby forcing the user to pay.

Figure 32:
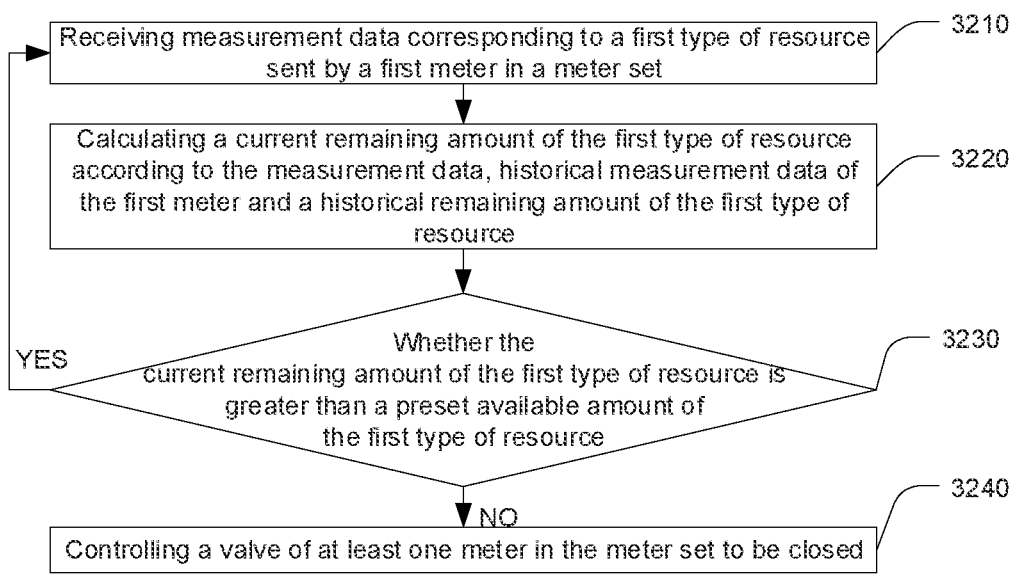
FIG. 32 is a flowchart illustrating an exemplary method for controlling a plurality of meters according to some embodiments of the present disclosure.

FIG. 32 is a flowchart illustrating an exemplary method for controlling a plurality of meters according to some embodiments of the present disclosure.

In step 3210, measurement data corresponding to a first type of resource sent by a first meter in a meter set may be received, wherein the meter set may include at least one meter associated with each other;

Specifically, the above meter set may refer to a meter set formed by correlating various meters within a certain area to be able to uniformly control the various meters in the area. The above correlation between various meters may refer to a mutual association in relation and does not limit data links association among the various meters. It may be understood that the meter set may include at least one meter that is associated with each other, and according to the application scenario of the technical solution of the present disclosure, the meters in the meter set may be smart meters with functions of data recording, data communication, and command execution. For example, usually, a residential household may have an electricity meter, a water meter, a gas meter, etc., installed at the same time, and due to the recharge of electricity, water, and gas fees are all charged on a household basis, the electricity meter, the water meter, and the gas meter in the residential family may be associated with each other because they are in the same residential household, thus the smart electric meter, the smart water meter, and the smart gas meter in the residential household may be combined into the meter set.

Usually, the meters in any area may be divided into the meter set. For example, all the meters in a room of an apartment building may be divided into the meter set, all the meters in each room of the apartment building may be divided into the meter set, or all the meters of the same type in all rooms of the apartment building may be divided into the meter set, etc. In the specific implementation of the technical solutions of the embodiments of the present disclosure, the scope of the meters included in the meter set may be freely demarcated. In theory, as long as meters are artificially set to be controlled uniformly, the meters may be used as correlated meters to compose the meter set, and the correlated meters may be respectively connected to the processor according to the system described in FIG. 1 of the present disclosure, and the processor may implement the method proposed in the embodiments of the present disclosure for controlling the meters to realize the unified control of each meter in the meter set. In the embodiments of the present disclosure, the smart water meter, the smart electric meter, and the smart gas meter in a certain room of an apartment may be divided into the meter set and connected to the processor in a manner shown in FIG. 1 as an example to illustrate the technical solution for the unified control of each meter through the processor.

Each meter in the meter set may be configured to measure the usage or fee of a certain type of resource, that is, each meter in the meter set may record measurement data corresponding to a type of resource. For example, a smart water meter in a room of an apartment may record a water consumption volume, a water fee, etc.; a smart electric meter in the room may record an electricity consumption quantity; a smart gas meter in the room may record a natural gas consumption amount, etc. In the embodiment of the present disclosure, the first meter may be configured to represent any meter in the meter set, and the measurement data corresponding to the first type of resource may be obtained by measuring the usage of the first type of resource corresponding to the first meter or the fee of the first type of resource. The measurement data may be the measurement data corresponding to the first type of resource, which may include but is not limited to the usage of the first type of resource. In the embodiments of the present disclosure, the technical solutions of the embodiments of the present disclosure may be illustrated according to the usage of the above measurement data.

In the embodiment of the present disclosure, each smart meter in the meter set may be connected to the processor as shown in FIG. 1, and each smart meter in the meter set may be set to periodically send the collected information about a certain type of resource to the connected processor.

In step 3220, a current remaining amount of the first type of resource may be determined according to the measurement data, historical measurement data of the first meter, and a historical remaining amount of the first type of resource;

The historical measurement data may be the measurement data corresponding to the first type of resource sent by the first meter last time, and the historical remaining amount of the first type of resource may be the remaining amount of the first type of resource calculated last time.

Specifically, after receiving the measurement data corresponding to the first type of resource sent by the first meter in the meter set, the processor may record and store the measurement data corresponding to the first type of resource received this time (current moment).

In some embodiments of the present disclosure, the prepayment way may be still configured for controlling resource usage measurement. That is, only when the user pays to recharge first, the valve of the meter may be opened and the resource usage may be measured at the same time. When the user recharges, the processor may calculate the corresponding available amount of resources according to the recharge fee of the user. For example, after the user recharges the water fee, the processor may calculate how many tons of water the user may use according to the recharge of the user, that is, the remaining water resource volume.

The embodiment of the present disclosure may set that when the first meter records and feeds back the measurement data (usage) of the first type of resource to the processor, the processor may use the received measurement data of the first type of resource this time to subtract the received measurement data corresponding to the first type of resource last time and obtain the used amount of the first type of resource from the last time that the first meter sends the measurement data corresponding to the first type of resource to this time (current moment) that the first meter sends the measurement data corresponding to the first type of resource.

Further, the processor may calculate the remaining amount of the first type of resource after the first meter reports the measurement data of the first type of this time according to the determined remaining amount of the first type of resource when the first meter reports the measurement data corresponding to the first type of resource last time. Specifically, the processor may use the determined remaining amount of the first type of resource when the first meter reports the measurement data corresponding to the first type of resource last time to subtract the used amount of the first type of resource from the last time that the first meter sends the measurement data corresponding to the first type to this time (current moment) that the first meter sends the measurement data corresponding to the first type, and obtain the remaining amount of the first type of resource after the first meter reports the measurement data of the first type of resource this time.

For example, assuming that after the user recharges 500 yuan, 100 tons of water may be available. When the user uses water for a period of time, the water meter of the user may send the measured water consumption volume of the user to the processor once. Assuming that the water meter sends 10 tons of water consumption, then the processor may calculate and obtain that the remaining water resource is 90 tons according to the 100 tons of available water after recharging and the 10 tons of water consumption reported by the water meter. When the water meter reports the measured water consumption of the user is 20 tons again, the processor may use 20 tons to subtract 10 tons to calculate and obtain that the water consumption is 10 tons from the last time the water meter reporting the measurement data to this time the water meter reporting the measurement data. At the same time, the processor may use 90 minutes 10 to calculate the remaining 80 tons of water resources after the measurement data is reported by the water meter this time.

According to the processing method described above, after the processor receives the measurement data corresponding to the first type of resource sent by the first meter, it may calculate the current remaining amount of the first type of resource (after receiving the measurement data corresponding to the first type of resource this time).

In step 3230, whether the current remaining amount of the first type of resource is greater than a preset available amount of the first type of resource may be determined.

Specifically, the available amount of the first type of resource may refer to a preset minimum available amount of the first type of resource. When the remaining amount of the first type of resource of the user is less than the available amount of the first type of resource, the user may be prohibited from continuously using the first type of resource.

When the processor receives the measurement data corresponding to the first type of resource sent by the first meter and calculates the current remaining amount of the first type of resource, the processor may determine whether the remaining amount of the first type of resource is greater than the preset available amount of the first type of resource to determine whether the user may be allowed to continuously use the first type of resource.

If the current remaining amount of the first type of resource is not greater than the preset available amount of the first type of resource, step 3240 may be performed to control at least one valve of a meter in the meter set to be closed.

Specifically, if the processor determines that the current remaining amount of the first type of resource is not greater than the preset available amount of the first type of resource after receiving the measurement data corresponding to the first type of resource sent by the first meter, the current remaining amount of the first type of resource may be determined to be very small, and the user may no longer continue to be allowed to use the first type of resource. At this time, the processor may send an instruction of closing the valve to at least one meter in the meter set to control the valve of at least one meter in the meter set to be closed.

For example, assuming that the preset available amount of water resources is 0.1 tons when the processor receives the water consumption data sent by the smart water meter in a certain room of the apartment, the remaining water resource amount may be determined to be 0.05 tons after calculation, then it may be determined that the current remaining amount of water resources is not greater than the preset available amount of water resources. At this time, the processor may send a closing instruction to at least one of the smart water meter, the smart electric meter, or the smart gas meter in the room to control the valve of at least one of the smart water meter, the smart electric meter, and the smart gas meter in the room to be closed.

As an exemplary implementation, the embodiment of the present disclosure may adopt a linkage control scheme for a smart meter. When it is determined that the current remaining amount of the first type of resource is not greater than the preset available amount of the first type of resource by step 3230, step 3240 may be performed. At this time, controlling the closing of the valve of at least one meter in the meter set may specifically refer to controlling the closing of one or more designated meters associated with the first meter while controlling the closing of the first meter. That is, a plurality of meters including the first meter may be controlled to be closed at the same time.

Specifically, when implementing the technical solutions of the embodiments of the present disclosure, one or more meters in the meter set that may be controlled to be closed at the same time when the first meter is closed may be determined in advance, that is, the correlation relationship between other meters in the meter set and the first meter may be set in advance, and when the first meter is controlled to be closed, the meters associated with the first meter may be controlled to be closed at the same time.

By adopting the linkage control solution of the smart meters, when the first type of resource is insufficient, users may be informed of the occurrence of arrears through a plurality of ways and methods to prompt the user to pay as soon as possible.

Alternatively, when step 3240 is performed, only other meters that are associated with the first meter may be controlled to be closed.

It should be noted that, in the linkage control scheme, other meters linked with the first meter may be changed according to the settings of the user or the resource manager.

Another optional implementation manner may be that when it is determined that the current remaining amount of the first type of resource is not greater than the preset available amount of the first type of resource, and the user needs to know which type of resource is in arrears clearly, only the valve of the first meter in the meter set may be controlled to be closed, thus the user may know that the remaining amount of the first type of resource is insufficient after the valve of the first meter is closed.

For example, when the processor determines that the current remaining amount of water resources in a certain room of an apartment is not greater than the preset available amount of water resources, the processor may send a closing instruction to the smart water meter in the room to control the valve of the smart water meter to be closed; the processor may also send a closing instruction to the smart electric meter or smart gas meter in the room to control the valve of the smart electric meter or smart gas meter to be closed; the processor may also send a closing instruction to the smart water meter, the smart electric meter, and the smart gas meter in the room to control the valves of the smart water meter, the smart electric meter, and the smart gas meter to be closed.

It may be seen from the above illustration that the technical solution of the embodiment of the present disclosure connects a plurality of meters with the processor at the same time, the processor may receive the resource measurement data sent by the meter, and calculate the remaining resource amount based on the received measurement data and the historical measurement data; determine whether the resource may continue to be used by determining whether the remaining amount of resource is greater than the preset available amount of resource. If the remaining amount of resource is not greater than the available amount of resource, the processor may control the valve of at least one of a plurality of connected meters to be closed. The technical solution may realize the linkage control of a plurality of meters by the processor, that is, the unified control and management of the plurality of meters may be realized.

Figure 33:
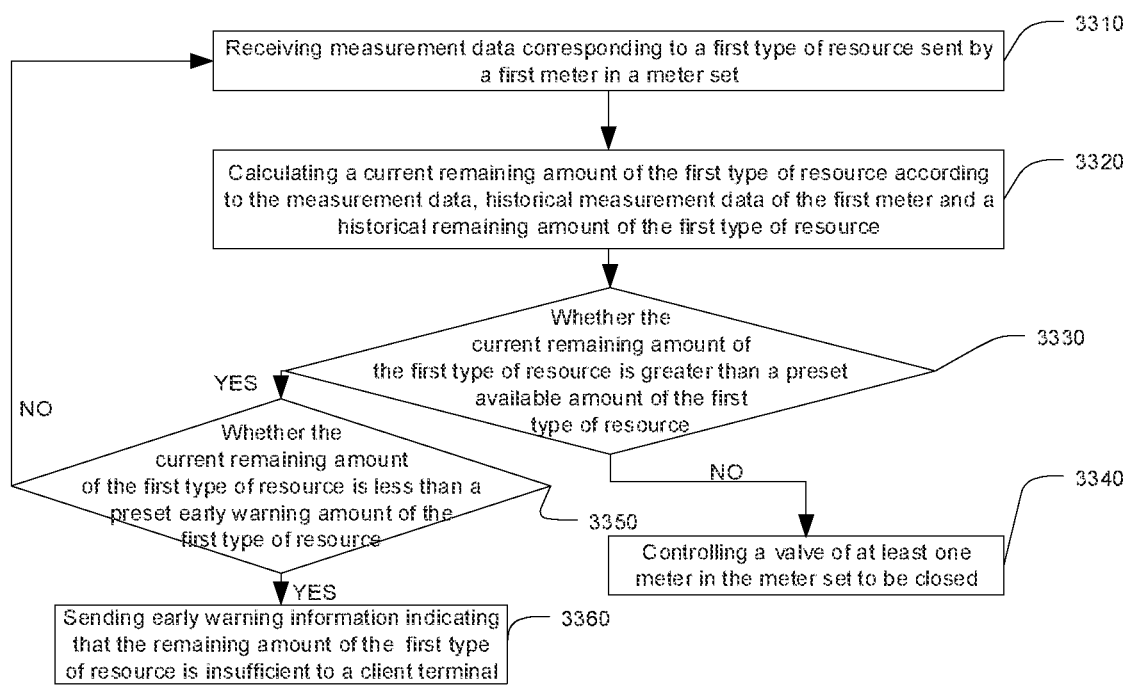
FIG. 33 is a flowchart illustrating another exemplary method for controlling a plurality of meters according to some embodiments of the present disclosure.

FIG. 33 is a flowchart illustrating another exemplary method for controlling a plurality of meters according to some embodiments of the present disclosure.

The embodiment of the present disclosure may also disclose that if the processor determines that the current remaining amount of the first type of resource is greater than the preset available amount of the first type resource, step 3350 may be performed to determine whether the current remaining amount of the first type of resource is less than a preset warning amount of the first type of resource;

Specifically, the preset warning amount of the first type of resource may refer to a predetermined fixed value of the amount of the first type of resource. When the remaining amount of the first type of resource is less than the warning amount of the first type of resource, an early warning may be triggered.

If the current remaining amount of the first type of resource is less than the preset warning amount of the first type resource, step 3360 may be performed to send the warning information that indicates the insufficient of the remaining amount of the first type of resource to the client terminal.

Specifically, if the processor calculates and determines that the current remaining amount of the first type of resource is less than the preset warning amount of the first type of resource, the processor may send the warning information to the connected client terminal to inform the user that the remaining amount of the first type of resource is insufficient.

For example, assuming that the processor calculates and determines that the remaining amount of water resources in a room of an apartment is 1 ton. Although the remaining amount of water resources is greater than the preset available water resources volume of 0.1 ton, the remaining amount of water resources may be less than the preset warning amount of water resources of 2 tons, the processor may send a message to the connected client terminal to inform the user of insufficient water resources.

It may be understood that by setting the warning amount of resource in the embodiment, the processor may send the warning information to the client terminal when determining that the remaining amount of resource is less than the warning amount of resource, thus the user may know the remaining resource in time to improve the user experience.

Steps 3310 to 3340 in the embodiment correspond to steps 3210 to 3240 in the embodiment shown in FIG. 32, respectively. More descriptions regarding steps 3310 to 3340 may refer to the descriptions of the embodiments shown in FIG. 32, which may not be repeated herein.

Optionally, in another embodiment of the present disclosure, it may also be disclosed that when the processor controls the valve of at least one meter in the meter set to be closed, the processor may send a prompt message to the client terminal to pay a fee of the first type of resource.

Specifically, the processor in the system shown in FIG. 1 may have the communication capability, especially the communication capability with the client terminal, when the processor determines that the current remaining amount of the first type of resource is not greater than the preset available amount of the first type of resource, the value of at least one meter in the meter set may be controlled to be closed, and a prompt message may be sent to the client terminal to prompt the user to pay the fee of the first type of resource.

Due to the embodiment of the present disclosure realizes the linkage control of a plurality of meters, when the remaining amount of the first type of resource measured by the first meter is too small and the meter valve needs to be closed, the processor may or may not just close the valve of the first meter. After closing the valve of at least one meter in the meter set, the embodiment of the present disclosure may set the processor to send a prompt message to the client terminal, prompting the user which type of resource fee should be paid, which may not lead to the phenomenon that the user does not know which type of resource fee should be paid.

For example, when the remaining water resource volume is less than the available water resource volume, the processor may simultaneously close the valves of the smart water meter and the smart electric meter, and the processor may send a prompt message to the client terminal to prompt the user to pay the water fee.

Further, the processor may also generate the bill of the first type of resource and send the bill to the client terminal, thus the user may understand the usage of the first type of resource in more detail.

Optionally, it may also be disclosed in another embodiment of the present disclosure that after controlling the valve of at least one meter in the meter set to be closed, the method further may include:

Freezing a smart door lock corresponding to the meter set when the fee of the first type of resource paid by the user is not received in a period of time, and/or the overspending of the first type of resource of the user exceeds the preset amount of overdraft.

Specifically, on the one hand, if the remaining fee of the first type of resource is insufficient, that is, when the remaining amount of the first type of resource is insufficient, after the valve of at least one meter in the meter set is controlled to be closed, for example, the valve of at least one meter in the home of the user is controlled to be closed, if the fee of the first type of resource paid by the user is not received within the preset time period, it may be considered that the user is in arrears with the first type of resource fee for a long time. At this time, the embodiment of the present disclosure may freeze the smart door lock corresponding to the meter, that is, freezing the smart door lock of the user's residence, thus the user cannot get in and out of the user's residence to achieve the purpose of forcing the user to pay.

On the other hand, after controlling the valve of at least one meter in the meter set to be closed, if the closed meter is not the meter corresponding to the first type of resource, for example, if closing the meter in the meter set except for the first meter, the user may continue to use the first type of resource without paying the fee, and the corresponding first meter may measure the overspent usage of the user. When the user overspends the first type of resource and exceeds the preset overspent amount, the smart door lock corresponding to the meter set may be frozen, that is, freezing the smart door lock of the user's residence.

The technical solution may be applied to the management of renting houses and may improve management efficiency. Renting houses may be generally single-family houses. After renting a rental house, users should pay water, electricity, and gas fees in time to realize water supply, electricity supply, and gas supply normally, otherwise, it may bring economic losses to the lessors. Applying the technical solutions to the management of the renting houses, when users are in arrears, long-term non-payment, or overspending of resources such as water, electricity, and gas, a door lock password of the renting house may be forcibly frozen, thus users may not enter and exit the renting house, thereby forcing the user to pay.

Figure 34:
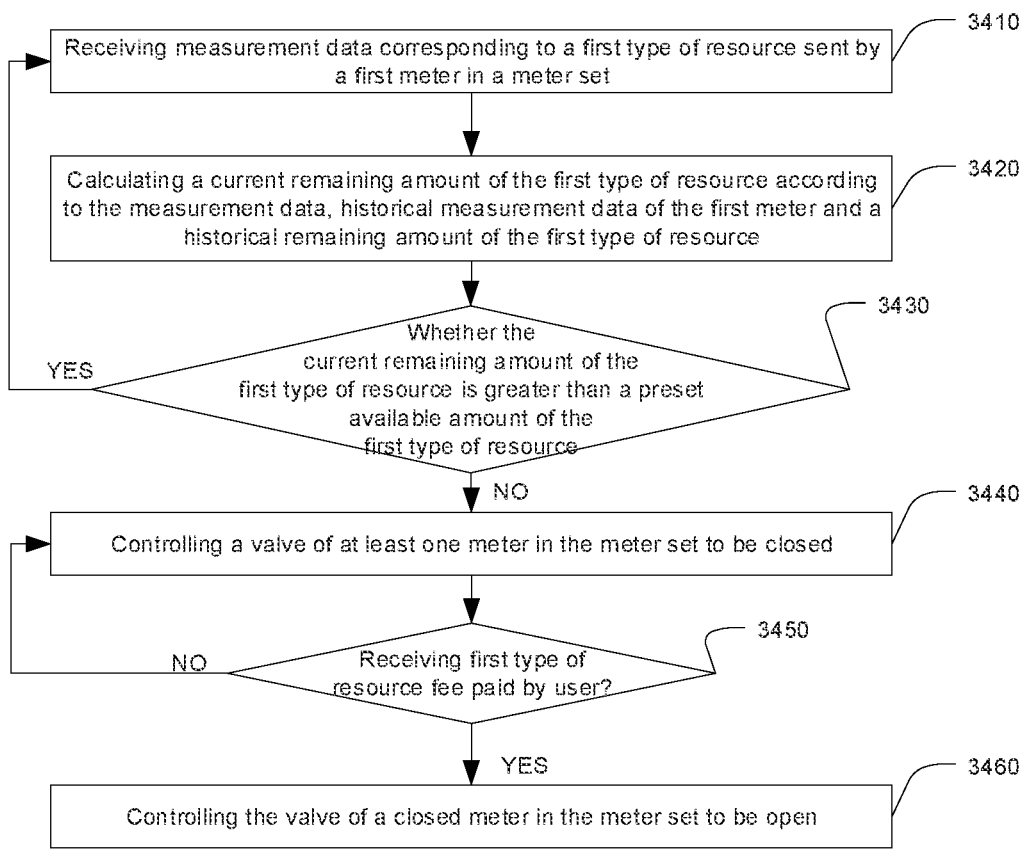
FIG. 34 is a flowchart illustrating another exemplary method for controlling a plurality of meters according to some embodiments of the present disclosure.

FIG. 34 is a flowchart illustrating another exemplary method for controlling a plurality of meters according to some embodiments of the present disclosure.

After the processor controls the valve of at least one meter in the meter set to be closed, the processor may further perform step 3450 to determine whether the fee of the first type of resource paid by the user is received;

Specifically, the received fee of the first type of resource from the user may be the first type of resource fee paid by the user through electronic payment at the client terminal when the processor communicates with the client through the network. When the processor does not communicate with the client, the user may go to a department for recharging the first type of resource to pay the fee of the first type of resource. At this time, the processor may confirm that the user has paid the first type of resource through interaction with the department for recharging the first type of resource.

If the fee of the first type of resource paid by the user is received, the processor may execute step S506 to control the valve of the closed meter in the meter set to open.

Specifically, given the real-time nature of the technical solutions of the embodiments of the present disclosure, when the processor determines that the remaining amount of the first type of resource is less than the set available amount of the first type of resource, the valve of at least one of the meters in the meter set may be immediately closed. As long as the period of setting the first meter to send measurement data to the processor is small enough, it may guarantee that when the remaining amount of the first type of resource is just less than the available amount of the first type of resource, it may be detected by the processor, and the meter may execute the closing of the valve of the meter in time. After the user pays the first type of resource fee, it may be considered that the remaining amount of the first type of resource at this time is greater than the available amount of the first type of resource. At this time, the processor should control the closed valve of the meter to open to resuming normal use by the user.

Steps 3410 to 3440 in the embodiment may respectively correspond to steps 3210 to 3240 in the embodiment shown in FIG. 32. More descriptions regarding steps 3410 to 3440 may refer to the descriptions of the embodiments shown in FIG. 32, which may not be repeated herein.

Figure 35:
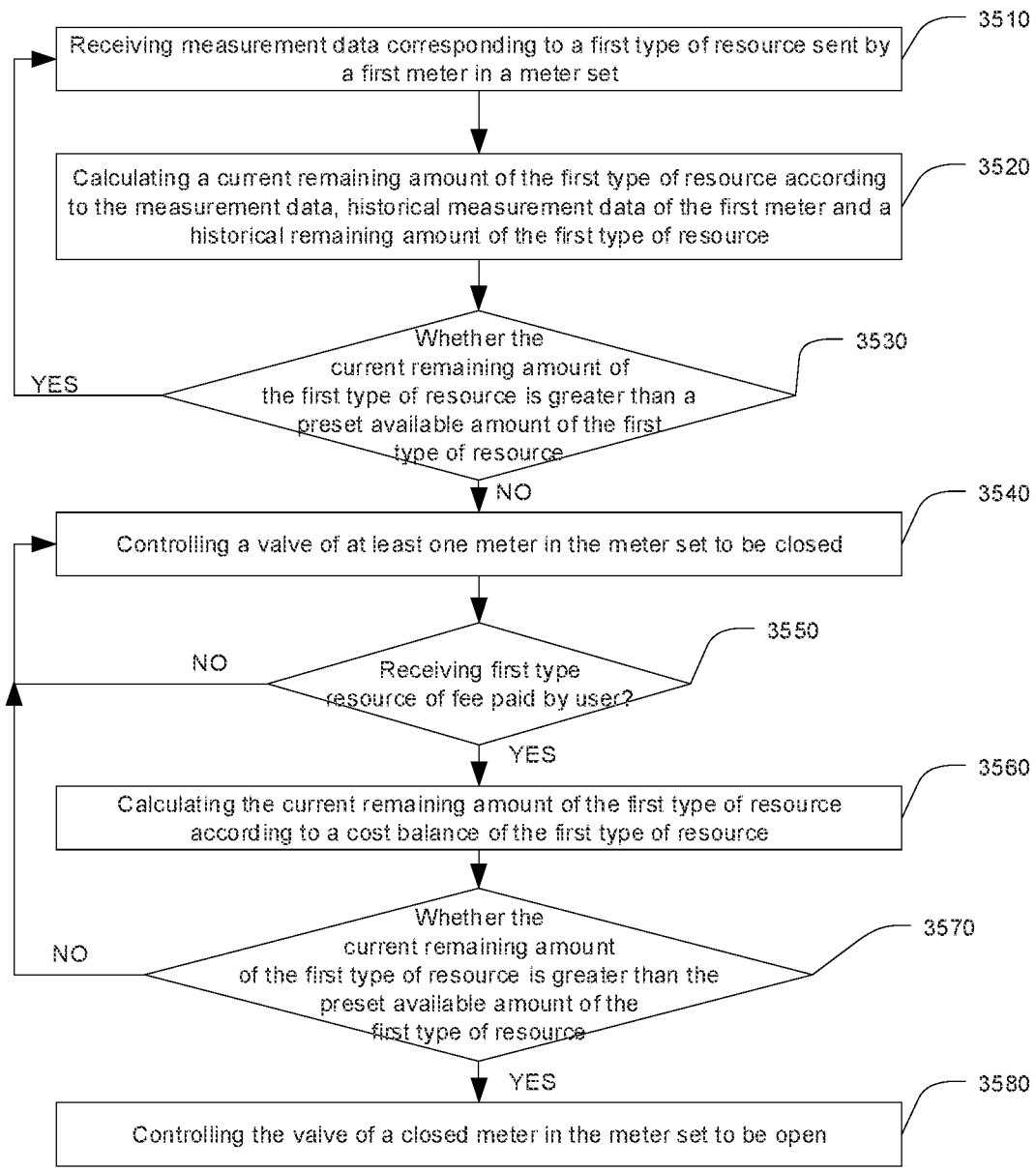
FIG. 35 is a flowchart illustrating another exemplary method for controlling a plurality of meters according to some embodiments of the present disclosure.

FIG. 35 is a flowchart illustrating another exemplary method for controlling a plurality of meters according to some embodiments of the present disclosure.

When the first type of resource fee paid by the user is received, step 3560 may also be performed, and the current remaining amount of the first type of resource may be calculated according to the fee balance of the first type of resource.

Specifically, after receiving the fee of the first type of resource paid by the user, the processor may calculate the total balance of the fee of the first type of resource, and then divide the total balance of the fee of the first type of resource by the unit price of the first type of resource to obtain the current remaining amount of the first type of resource.

For example, when an apartment tenant pays additional water fees due to insufficient water resources, the processor may calculate the total remaining water fees based on the water fees paid by the user, and then divide the remaining water fees by the unit price per ton to obtain the remaining tons of water resources.

In step 3570, whether the current remaining amount of the first type of resource is greater than the preset available amount of the first type of resource may be determined.

Specifically, the remaining amount of the first type of resource may be calculated after the user has paid the fee of the first type of resource, and the processor may determine whether the current remaining amount of the first type of resource is greater than the preset available amount of the first type of resource again.

It should be understood that if the payment of the first type of resource is too small, and the remaining amount of the first type of resource is still not greater than the preset available amount of the first type of resource after the user pays the fee of the first type of resource, the user may still not be allowed to continue using the first type of resource, the processor should keep the valve of the closed meter in the closed state.

If the current remaining amount of the first type of resource is greater than the preset available amount of the first type of resource, step 3580 may be performed to control the valve of the closed meter in the meter set to open.

Specifically, if the processor determines that the remaining amount of the first type of resource is greater than the preset available amount of the first type of resource after the user has paid the fee of the first type of resource, the processor may control the valve of the closed meter in the meter set to open and resume normal use by users.

It should be noted that when the valve of at least one meter in the meter set in the embodiment of the present disclosure is controlled to be closed and the smart door lock corresponding to the meter set is frozen at the same time when step 3580 is performed in the embodiments, it may also be necessary to unfreeze the smart door lock corresponding to the meter set while the valve of the closed meter in the meter set is controlled to open.

Steps 3510 to 3550 in the embodiment may correspond to steps 3410 to 3450 in the embodiment shown in FIG. 34, respectively. More descriptions regarding steps 3510 to 3540 may refer to the descriptions of the embodiments shown in FIG. 34, which may not be repeated herein.

Figure 36:
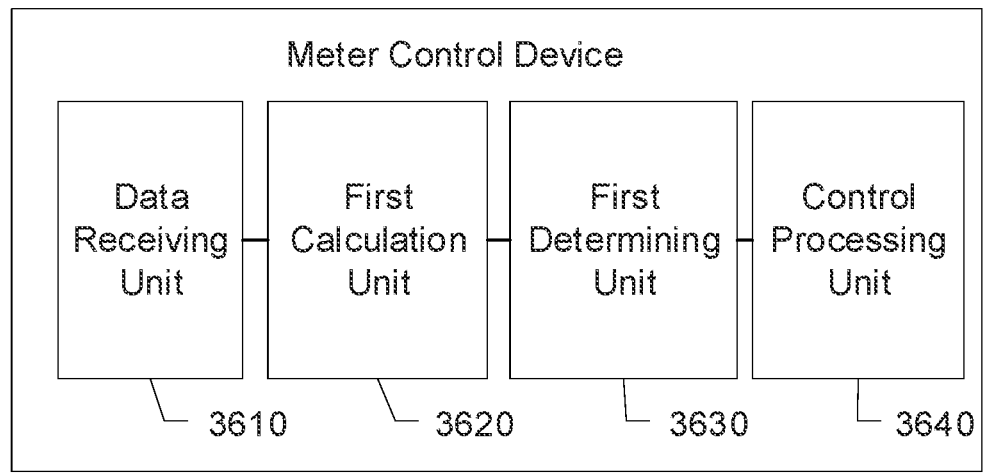
FIG. 36 is a structural diagram of a device for controlling a meter according to some embodiments of the present disclosure.

Another embodiment of the present disclosure may also disclose a device for controlling a meter. As shown in FIG. 36, the device may include units as follows:

A data receiving unit 3610 may be configured to receive measurement data corresponding to a first type of resource sent by a first meter in a meter set, wherein the meter set may include at least one meter.

A first calculating unit 3620 may be configured to calculate and obtain a current remaining amount of the first type of resource according to the measurement data, historical measurement data of the first type of resource, and a historical remaining amount of the first type of resource, wherein, the historical measurement data of the meter may be measurement data of the first meter corresponding to the first type of resource sent last time, the historical remaining amount of the first type of resource may be the remaining amount of the first type of resource calculated last time.

A first determining unit 3630 configured to determine whether the current remaining amount of the first type of resource is greater than a preset available amount of the first type of resource.

A control processing unit 3640 may be configured to control a valve of at least one meter in the meter set to be closed when the current remaining amount of the first type of resource is not greater than the preset available amount of the first type of resource.

Optionally, in another embodiment of the present disclosure, when the control processing unit controls the valve of at least one meter in the meter set to be closed, it may be specifically configured to:

Control the first meter to be closed, and/or control the closing of a specified meter associated with the first meter in the meter set.

Figure 37:
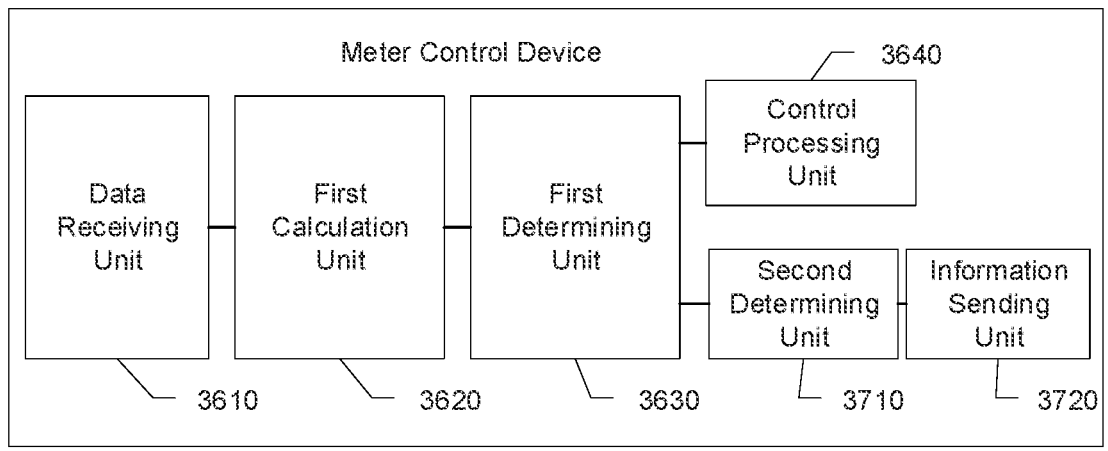
FIG. 37 is a structural diagram of another device for controlling a meter according to some embodiments of the present disclosure.

Optionally, in another embodiment of the present disclosure, refer to FIG. 37, the device may further include units as follows:

A second determining unit 3710 may be configured to determine whether the current remaining amount of the first type of resource is less than a preset warning amount of the first type of resource when the current remaining amount of the first type of resource is greater than the preset available amount of the first type of resource.

A information sending unit 3720 may be configured to send warning information that indicates an insufficient of the remaining amount of the first type of resource when the remaining amount of the first type of resource is less than the preset warning amount of the first type of resource.

The information sending unit 3720 may be further configured to send a prompt message for paying the first type of resource fee to a client terminal when the control processing unit 3640 controls the valve of at least one meter in the meter set to be closed.

Optionally, in another embodiment of the present disclosure, the control processing unit may be further configured to:

freeze a smart door lock corresponding to the meter set after controlling the valve of at least one meter in the meter set to be closed in the condition that the user may have not received the first type of resource fee paid by the user in a preset time period, and/or the overdraft of the first type of resource may exceed a preset amount of overdraft.

Optionally, in another embodiment of the present disclosure, the device may further include:

a second calculating unit configured to calculate the current remaining amount of the first type of resource according to a remaining fee of the first type of resource when receiving the first type of resource fee paid by the user.

The device may further include a third determining unit configured to determine whether the current remaining amount of the first type of resource is greater than the preset available amount of the first type of resource.

If the current remaining amount of the first type of resource is greater than the preset available amount of the first type of resource, the control processing unit may control the valve of a closed meter in the meter set to open.

Optionally, in another embodiment of the present disclosure, after the valve of the closed meter in the meter set is controlled to open, the method may further include:

Unfreezing the smart door lock corresponding to the meter set.

Specifically, for the specific work content of each unit in the embodiments, please refer to the content of the embodiments, which may not be repeated herein.

Another embodiment of the present disclosure may also disclose a system for controlling a meter. As shown in FIG. 1, the system may include:

A meter set 130 including at least one meter associated with each other, a processor 110 connected to each meter in the meter set, and a client terminal 140 connected to the processor.

The meters in the meter set 130 may be configured to record measurement data corresponding to the resource and send the recorded measurement data to the processor.

The processor 110 may be configured to receive the measurement data corresponding to the first type of resource sent by the first meter in the meter set 130; calculate the current remaining amount of the first type resource according to the measurement data, the historical measurement data of the first meter, and the historical remaining amount of the first type of resource; determine whether the current remaining amount of the first type of resource is greater than the preset available amount of the first type of resource, if the current remaining amount of the first type of resource is not greater than the preset available amount of the first type of resource, the valve of at least one meter in the meter set 130 may be controlled to be closed; freeze or unfreeze the smart door lock corresponding to the meter set; send information to the client terminal 140, receive a control instruction sent by the client terminal 140, and send the control instruction to the meter in the meter set 130 according to the received control instruction.

The client terminal 140 may be configured to receive information sent by the processor 110 and send the control instruction to the processor.

When the processor 110 controls the valve of at least one meter in the meter set 130 to be closed, the processor 110 may be specifically configured to:

Control the first meter to be closed, and/or control the specified meter associated with the first meter in the meter set 130 to be closed.

Optionally, the processor 110 may be further configured to:

If the current remaining amount of the first type of resource is greater than the preset available amount of the first type of resource, determine whether the current remaining amount of the first type of resource is less than the preset warning amount of the first type of resource;

If the current remaining amount of the first type of resource is less than the preset warning amount of the first type of resource, send the warning information indicating that the first type of resource is insufficient to the client terminal.

When controlling the valve of at least one meter in the meter set to be closed, the processor 110 may be further configured to:

Send prompt information for paying the first type of resource fee to the client terminal.

Optionally, in another embodiment of the present disclosure, the processor 110 may be further configured to:

Freeze the smart door lock corresponding to the meter set after controlling the valve of at least one meter in the meter set to be closed under the condition that the user may not receive the first type of resource fee paid by the user in the preset time period, and/or the overdraft of the first type of resource may exceed the preset amount of overdraft.

Optionally, in another embodiment of the present disclosure, the processor 2 may be further configured to:

Control the valve of the closed meter in the meter set to open when receiving the first type of resource fee paid by the user.

Optionally, in another embodiment of the present disclosure, when receiving the first type of resource fee paid by the user, the processor 110 may be further configured to:

Calculate the current remaining amount of the first type of resource according to a cost balance of the first type of resource;

Determine whether the current remaining amount of the first type of resource is greater than the preset available amount of the first type of resource;

If the current remaining amount of the first type of resource is greater than the preset available amount of the first type of resource, control the valve of the closed meter in the meter set to open.

Optionally, in another embodiment of the present disclosure, after controlling the valve of the closed meter in the meter set to open, the processor 2 may be also configured to:

Freeze the smart door lock corresponding to the meter set.

Specifically, for the specific work content of each part of the meter control system, please refer to the content of the embodiment, which may not be repeated herein.

The present disclosure relates to a method for collecting data. In some embodiments, the process of the method may be executed by a data collection module. In some embodiments, the data collection module may be an independent collector. One collector may be connected to a plurality of meters and smart devices. A server may be connected to the collector, and the data of a plurality of meters and smart devices may be obtained through the collector. In some embodiments, the data collection module may be a data processing module inside the smart device, and the server may be directly connected to a plurality of meters or smart devices to collect data from a plurality of meters and smart devices directly. In some embodiments, the data collection module may obtain a configuration instruction of data collection. According to the configuration instruction of data collection, the data of the meter or the smart device may be collected. In some embodiments, the collected data may be compressed and stored. When a preset upload condition is satisfied, stored data may be uploaded to the server.

Figure 38:
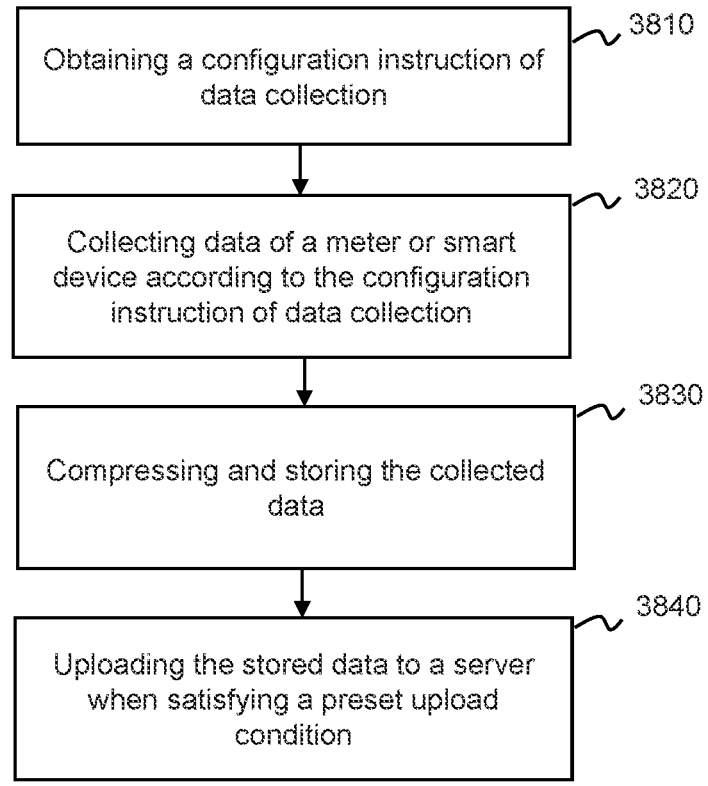
FIG. 38 is a flowchart illustrating an exemplary method for collecting data according to some embodiments of the present disclosure.

FIG. 38 is a flowchart illustrating an exemplary method for collecting data according to some embodiments of the present disclosure.

In step 3810, a configuration instruction of data collection may be obtained. In some embodiments, the data may include information data of meters or smart devices, such as an electricity consumption amount, a power, a remaining electricity amount, a water consumption amount, a remaining water amount, a gas consumption amount, a remaining gas amount, a rent, a remaining rent, etc. In some embodiments, a data collection module may be an independent collector or a data processing module inside a meter or smart device. In some embodiments, the method may be performed by the data collection module. In some embodiments, the data collection module may be an independent collector. One collector may be connected with a plurality of meters and smart devices. The server may be connected with the collector, and the server may obtain the data of a plurality of meters and smart devices through the collector. In some embodiments, the data collection module may be a data processing module inside the smart device, and the server may be directly connected with a plurality of meters or smart devices. The server may collect data from a plurality of meters and smart devices directly.

In some embodiments, the collected data may be data within a time period, and the change of the corresponding data may be analyzed based on the data within the time period. For example, an electricity consumption amount in a time period may be collected and electricity consumption data at peaks may be analyzed. As another example, the power of an electric meter may be collected, the power data over a time period may be analyzed, and statistics of the maximum power and the minimum power may be performed.

In some embodiments, the configuration instruction of data collection may be pre-configured by the server and then sent to the collector or the data processing module of the meter/smart device byways of the remote configuration. When the configuration instruction of data collection is issued for the first time and the server updates the configuration instruction of data collection, the server may remotely issue the configuration instruction of data collection, and the collector or the data processing module inside the meter/smart device may save the issued configuration instruction of data collection locally.

In some embodiments, the server may generate the configuration instruction of data collection. The configuration instruction of data collection may include information such as a data collection frequency, a data collection time, a collected data content, collection time distribution information of different meters or smart devices, function switch information, etc. The function switch information may be information about whether the data processing unit starts the collection function of power data. The function switch information may be the content of the above function switch. In some embodiments, the server may generate the configuration instruction of data collection according to the requirements of the user. For example, if a manager wants to know the electricity consumption amount in the house, the server may generate the configuration instruction for collecting the electricity consumption amount. In some embodiments, the server may send the configuration instruction of data collection to the data processing unit by remotely issuing the generated configuration instruction. For example, the server may configure the power statistics function of the smart meter/collector by remotely issuing instructions, thus the smart meter/collector may collect and upload power data according to the issued instructions.

In step 3820, data of the meter or smart device according to the configuration instruction of data collection may be collected. In some embodiments, the data collection may be performed on a plurality of meters or smart devices according to a unique number of the meter or smart device and a collection period.

In step 3830, data compression processing may be performed on the collected data and the collected data may be stored. The collected data may be compressed and stored. The data compression process may reduce the memory occupied by the amount of data, thus fewer resources may be occupied when the data is uploaded to the server, and the amount of data of uplink communication may be reduced, which may not increase the communication pressure of the server uplink. In some embodiments, the method of data compression may include performing a bytes compression on the collected data to obtain intermediate data firstly, determining continuous data groups in each of which the value of two adjacent data changes within a preset value from the intermediate data, and then processing the data groups according to preset data processing rules to obtain the compressed data.

In step 3840, the stored data may be uploaded to the server when a preset upload condition is satisfied. In some embodiments, the preset upload condition may be determined according to the configuration instruction of data collection. For example, the configuration instruction of data collection may include a data upload frequency or a data upload amount. The data upload frequency and data upload amount may be set by a technician according to a specific usage scenario. For example, the data upload frequency may be uploaded every one hour, and the upload operation may be performed when the amount of saved data reaches 500 M. In some embodiments, when the upload condition is satisfied, the data collection module may upload the stored data to the server at one time.

The method may realize the compression and upload of basic data in the house, achieve the purpose of small data volume, reasonable data transmission time, and avoid increasing the network burden. The method in the embodiment may be applied to scenarios where smart meters are configured for resource usage control, such as hotels, long-term/short-term rental apartments, public rental houses, etc. According to the resource usage statistics and reporting functions, users may understand changes in the amount of the resources of houses, know the time period that the higher-power appliances are used, and the time period when the amount of water is higher, etc. In the embodiment, the data may be collected in a time period, Compared with the traditional method of only obtaining instantaneous data, the collected data may be more comprehensive and more convenient for data analysis.

Figure 39:
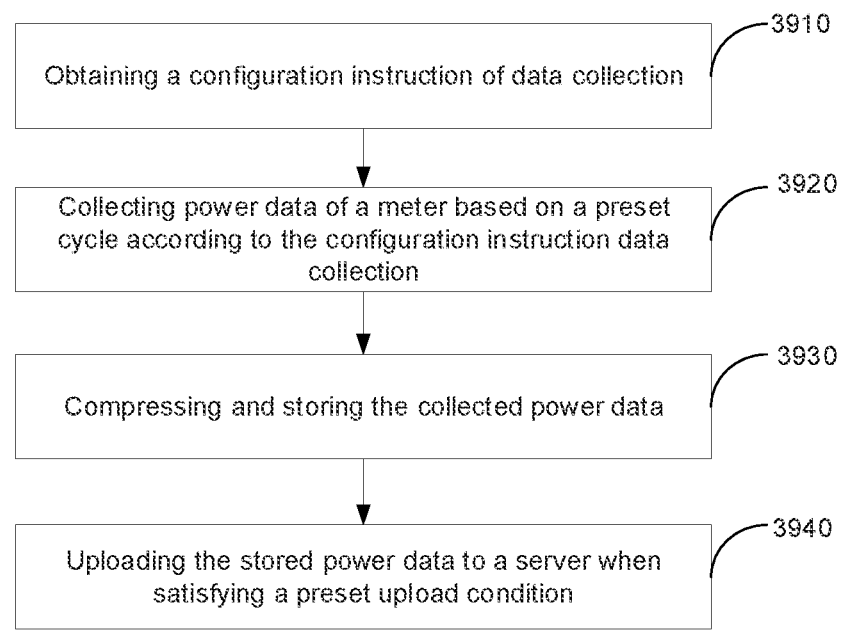
FIG. 39 is a flowchart illustrating an exemplary method for collecting data of an electric meter according to some embodiments of the present disclosure.

FIG. 39 is a flowchart illustrating an exemplary method for collecting data of an electric meter according to some embodiments of the present disclosure.

In step 3910, a configuration instruction of data collection may be obtained.

When checking the power changes, a shorter statistical interval may be set, thus the more power data may be collected within the same time range, which may better reflect electric appliances used by the user. However, the amount of power data may be larger than the amount of electricity data that is reported under a normal condition (generally, the electricity data may be uploaded once an hour). Especially for devices that use GPRS traffic to report, if the power reporting function is always enabled or the collection interval frequency is one minute, more traffic data may be increased. Therefore, the power reporting function may be disabled by default. The server may remotely issue the configuration instruction of data collection, which may be transmitted to the collector or the data processing module inside the electric meter through a preset transmission technique. The preset transmission technique may be a wireless communication technique for smart homes, such as GPRS/ZigBee/WiFi/BLE/NB-IoT/LoRa, etc., or a wired communication technique such as a wired Ethernet, a power line carrier, etc.

Specifically, the information carried in the data configuration instruction may include a meter number, a data collection frequency, a function switch, a statistical start time, and a statistical end time. The meter number may be a serial identification number on the meter, and each meter may have a unique serial identification number; the data collection frequency may refer to a frequency of data sampling, and the sampling frequency may correspond to a sampling interval. The unit of the sampling interval may be minutes. The selected value of the sampling interval may be 1-60, for example, data may be collected every 2 minutes once.

The function switch may include stopping collection, the collection being permanently on and collection being valid for a certain time period.

The granularity of the statistics start time and the statistics end time may be both hours. It should be noted that the configuration instruction of data collection may be preset by the server, and then may be sent to the collector or the data processing module inside the meter through remote configuration. When the configuration instruction of data collection is issued for the first time and the server updates the configuration instruction of data collection, the server may remotely send the configuration instruction of data collection. The collector or the data processing module inside the meter may save the issued configuration instruction of data collection locally.

In step 3920, according to the configuration instruction of data collection, power data of an electric meter may be collected according to a preset cycle.

The collected power data may be power data corresponding to the meter number included in the configuration instruction of data collection.

Optionally, based on the embodiment, the configuration instruction of data collection may include the data collection frequency and the data collection time.

The data collection frequency may be illustrated above, please refer to the above corresponding descriptions. The data collection time may be a time period between the statistical start time and the statistical end time. The function switch may be the collection permanently being on and the collection valid for a certain time period.

In some embodiments, during the data collection time, the power data of the electric meter may be collected at regular intervals according to the data collection frequency.

The power data may be collected at regular intervals, and the power data may be saved after each collection is completed.

It should be noted that a timer may be required for timing to ensure that the power data is collected at regular intervals. The power data may be collected when time is within the data collection time. When time is not within the data collection time, the timer may be turned off to stop timing.

In step 3930, a data compression processing may be performed on the collected power data and the processed power data may be stored, wherein, the data compression processing may be performed to reduce the memory occupied by the amount of collected data, thus fewer resources may be occupied when the collected data is uploaded to the server, and the amount of data of the uplink communication may be reduced, which may not increase the communication pressure of the server uplink.

In step 3940, the stored power data may be uploaded to the server when a preset upload condition is reached. Optionally, based on the embodiment, the configuration instruction of data collection may include a data upload frequency or a data upload amount.

The data upload frequency and the data upload amount may be set by technicians according to specific usage scenarios. The data upload frequency may be such that the stored power data may be uploaded every one hour, and the data upload amount may be such that the stored power data may be uploaded when the amount of saved data reaches 500 M, When the upload condition is satisfied, the stored power data may be transmitted to the server.

In some embodiments, when the upload time corresponding to the data upload frequency is reached, or when the data amount of the stored power data of the electric meter is greater than the data upload amount, the collected power data may be uploaded to the server. Specifically, when the upload time is reached, or the amount of uploaded data reaches the data upload amount, the collected power data may be uploaded to the server. The upload manner may include using a wireless communication technique used in smart homes, such as GPRS/ZigBee/WiFi/BLE/NB-IoT/LoRa, etc., or a wired communication technique such as a wired Ethernet, a power line carrier, etc.

When the executor of the method in the embodiment is a collector, each collector may correspond to the power data, and the plurality of collectors may not upload the power data at the same time, ensuring that the communication volume for the data upload may be not too large.

When the executor of the method in the embodiment is the data processing module in the electricity meter, the data upload frequency of each electric meter may be different, and different electric meters may upload power data at different times, thereby ensuring that the communication volume for data upload may be not too large.

In the embodiment, the configuration instruction of data collection may be obtained, and the power data of the electric meter may be collected periodically according to the configuration instruction of data collection, and the collected power data may be compressed and stored. When the preset upload condition is reached, the stored power data may be uploaded to the server. In the present disclosure, the power data may be collected periodically, and when the preset upload condition is reached, the power data may be uploaded, which may realize the active collection and upload of the power data. When the user wants to know the power change of the electrical load under a certain meter, the configuration instruction of data collection may be issued through the server, and then the data processing module in the collector or the electric meter may collect and upload power data according to the configuration instruction of data collection.

Also, the method in the embodiment may be applied to a place where a smart meter is used for electricity consumption control, and a user may understand the power change of the electric appliances, and know when a higher-power electric appliance is used. Third, in the embodiment, the power data collected for a time period may be more comprehensive than the traditional method of only obtaining instantaneous power data, which may be more convenient for power data analysis.

Figure 40:
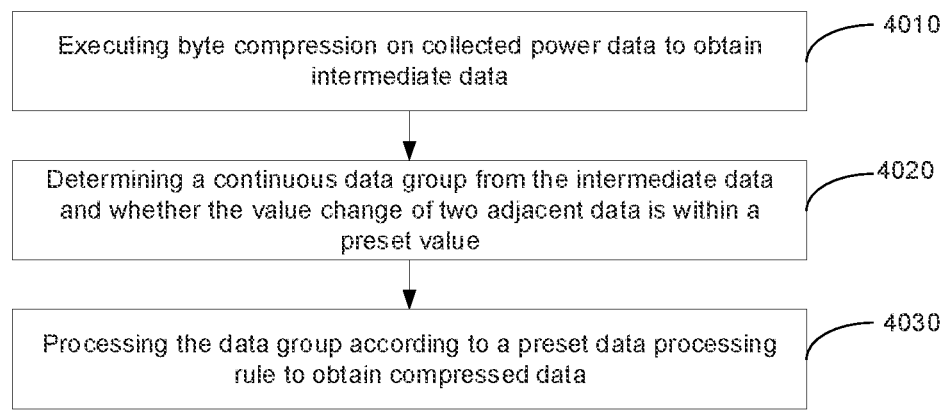
FIG. 40 is a flowchart illustrating an exemplary method for collecting data of an electric meter according to some embodiments of the present disclosure.

FIG. 40 is a flowchart illustrating an exemplary method for collecting data of an electric meter according to some embodiments of the present disclosure.

In step 4010, bytes compression may be performed on collected power data to obtain intermediate data. Due to the interval time for collecting power data is constant, the shorter the interval time is, the larger the amount of data that needs to be temporarily saved and uploaded may be, but more accurately the use of electric appliances may be indicated. There may be a lot of stored power data, in particular for the collector device. If the number of meters mounted under the collector is 32, and according to the data collection frequency of once every 1 minute, the amount of data collected in 1 hour may be 1920 (32*1*60) power values. The power data collected by a meter that satisfies the national standard may be represented by a 3-byte BCD code. For example, a power value corresponding to 0x123456 may be 12.3456 kilowatts. Therefore, the original power data volume may be 5760 bytes (1920*3). For devices with weak storage capabilities, larger resource overhead may be required, and the amount of data reported to the server may also need to be so much. Furthermore, the method in the embodiment may be performed to reduce the storage space and the amount of reported data. In some embodiments, the end value of each power value in the power data may be deleted to obtain the data to be processed, and the format of each power value in the data to be processed may be converted into a preset format to obtain the intermediate data.

The preset format may be the hexadecimal format.

Specifically, considering that the power range of different electric appliances may be generally greater than 0.001 kW (i.e. 1 watt), a 2-byte non-BCD code may be used to represent the power value, and the following strategy may be used, and the following strategy may include:

(1) Ignoring the changes of power values in 0.0001~0.0009 kW (the power value changes within 1 watt), that is, ignoring and deleting the last BCD code of a power value;

(2) When using 2 bytes to represent a power value, representing power values in the range of 0.000 kW~65.535 kW (0x0~0xFFFF), the accuracy may be 0.001 kilowatts (i.e. 1 watt). Using 2 bytes to save the statistical power values, according to the above data collection frequency of once every 1 minute, the data statistics volume of 32 meters in 1 hour may be determined as 3840 bytes (32*1*60*2). Compared with the original 5760 bytes, the data storage capacity may be reduced by ⅓.

Still taking 0x123456 as an example, the last bit value of 0x123456 may be removed to become 12345. The 12345 may be decimal data, and the data converted from 12345 into the hexadecimal format may be 3039, that may occupy two bytes compared with the original three bytes.

It should be noted that the power values of the smart meter/collector generally do not reach a maximum power value set by the server, and the maximum power value may be set to not exceed 60 kilowatts. When a power value exceeds the rated value, an over-power trip may be occurred and reported to the server to achieve the purpose of safe utilization of electric power. Due to using 2 bytes to represent a power value, the maximum value of the power values may be 65535 kilowatts, thus when 2 bytes are configured to represent the power values, there may be no situation that the power value is too large to be represented by two bytes.

In step 4020, data groups in each of which numerical values are continuous and numerical values of two adjacent data changes within a preset value may be determined from the intermediate data. The preset value may be determined by a technician according to the specific usage scenario.

Specifically, the data collection frequency may be such that data may be collected every 2 minutes to illustrate step 4020. Assuming that a power value collected at 20:00 is 0.5000 kilowatts, the default value may be 10 watts, and the power values collected every 2 minutes within the next 60 minutes may be:

0.5000, 0.5020, 0.5010, 0.5010, 0.5050,
1.2100, 1.2130, 0.5030, 0.5010, 0.5000,
0.5070, 0.8130, 0.8150, 0.8190, 0.8170,
0.8200, 1.2100, 1.2130, 0.8100, 0.5000,
0.5050, 0.5030, 0.5190, 0.5500, 0.5010,
0.5020, 0.5300, 0.5320, 0.5390, 0.5020.

The data groups in each of which power values are continuous and two adjacent power values changes within the preset value from the above power values, that is, the data groups in each of which the power values are continuous and two adjacent power values changes within 10 watts. The data groups that are obtained by screening may be:
0.5000, 0.5020, 0.5010, 0.5010, 0.5050; 1.2100, 1.2130;
0.5030, 0.5010, 0.5000, 0.5070; 0.8130, 0.8150, 0.8190,
0.8170, 0.8200; 1.2100, 1.2130 . . . .

Due to the large amount of data mentioned above, only the screened data groups may be given as examples. The data groups may be separated by ";".

In step 4030, the data groups may be processed according to a preset data processing rule to obtain compressed data, wherein, the preset data processing rule may include converting a data group into a data group including the first data in the data group and a number of no changes of data in the data group.

The number of no changes may include a value of the total number of data in the data group minus one. Specifically, the power value collected next time may be compared with a power value collected last time. When the power value collected next time is unchanged relative the power value collected last time or the change of the power value collected next time relative the power value collected last time is less than the preset value, the power value collected next time may be not saved. Only the number of no changes (using one byte to indicate the number of no changes) may be saved. If a large change occurs, the number of no changes may be the number of no changes that have been collected in the middle, and then the current collected power value may be saved.

Specifically, taking 0.5000, 0.5020, 0.5010, 0.5010, 0.5050 as an example, the first data in the data group may be 0.5000, the total number of data in the data group may be 5, and after subtracting one from the total number of data in the data group is 4, then 0.5000, 0.5020, 0.5010, 0.5010, 0.5050 may be converted to a data group including 0.5000 and 4.

By the method mentioned above, each data group may be converted, and then the collected power data in one-hour may be converted into "005000 4 012100 1 005030 3 008130 4 012100 1 008100 0 0050002 005190 0 005500 0 005010 1 005300 2 005020".

It should be noted that it may also be necessary to use two bytes of data to represent the time at the forefront of the power data, that is, clock and minutes, such as 20/00 for 8 o'clock. The final data may be:

2000 005000 4 012100 1 005030 3 008130 4 012100 1
008100 0 005000 2 005190 0 005500 0 005010 1
005300 2 00502

If data compression is not used for saving, the 30 power values collected in the one hour may need 90 bytes to save, and the data compression of the number of no changes may be used for saving. The above power values may need 49 bytes to save (including clock information), wherein there may be 11 changes of more than 10 watts. When adding 2 bytes to represent the power value as described above, only 37 bytes may be needed to save, which may be more than ½ less than the original 90 bytes. In the best case, if the data collected within 1 hour does not undergo a major change, only 5 bytes may be needed (2 bytes of clock information, 2 bytes of the first obtaining power value, 1 byte of the number of no changes) to report the changes in one hour, which may greatly reduce the amount of original storage and reporting data. The power of electric appliances used by general users may not change every minute, in particular during the low peak hours of electricity consumption in the daytime, changes may be less.

In the embodiment, the local statistical data compression technique may be configured according to the needs of different users, which may be applied to any smart meter/collector device with different resource conditions, and may reduce the amount of data stored and reported, which may not affect the wireless data bandwidth.

Figure 41:
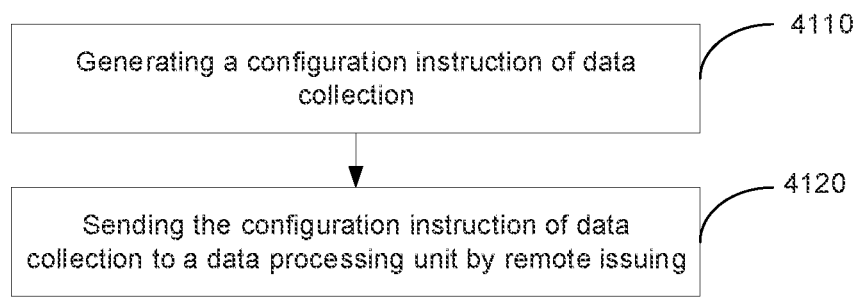
FIG. 41 is a flowchart illustrating an exemplary method for collecting data of an electric meter according to some embodiments of the present disclosure.

FIG. 41 is a flowchart illustrating an exemplary method for collecting data of an electric meter according to some embodiments of the present disclosure.

In step 4110, a configuration instruction of data collection may be generated, wherein the configuration instruction of data collection may include a data collection frequency, a data collection time, and function switch information. The function switch information may be information whether a data processing unit starts power data collection functions. The function switch information may be the content of the above function switch.

In step 4120, the configuration instruction of data collection may be sent to the data processing unit through remote issuing.

Specifically, more descriptions regarding steps 4110 to 4120 may refer to the descriptions of the above embodiments, which may not be repeated herein.

In the embodiment, the server may configure the power statistics function of the smart meter/collector by remotely issuing instructions, thus the smart meter/collector may collect and upload power data according to the issued instructions.

Figure 42:
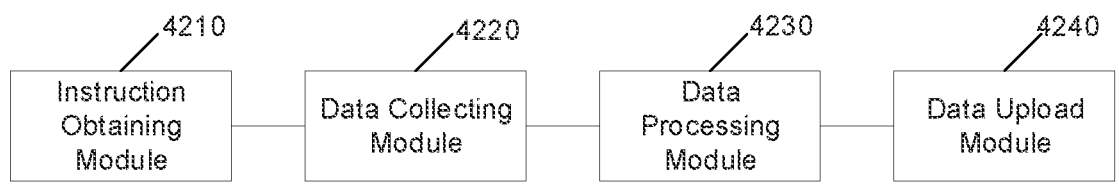
FIG. 42 is a block diagram of a device for obtaining data according to some embodiments of the present disclosure.

FIG. 42 is a block diagram of a device for obtaining data according to some embodiments of the present disclosure.

The device for obtaining data may include an instruction obtaining module 4210 configured to obtain configuration instruction of data collection.

The device for obtaining data may include a data obtaining module 4220 configured to obtain power data of an electric meter in a preset cycle according to the configuration instruction of data collection.

The device for obtaining data may include a data processing module 4230 configured to compress and store the collected power data.

The device for obtaining data may include a data upload module 4240 configured to upload the stored power data to a server when a preset upload condition is satisfied.

Further, the configuration instruction of data collection may include data collection frequency and data collection time. Correspondingly, the data collection module 4220 may include a data collecting sub-module, which may be configured to execute data collection within the data collection time according to the data collection frequency and collect the power data of the meter at regular time intervals. Further, the configuration instruction of data collection may include data upload frequency or data upload volume. Correspondingly, the data upload module 4240 may include a data upload sub-module configured to upload time corresponding to the data upload frequency, or when the data volume of the stored power data of an electric meter is greater than the data upload volume, upload the collected power data to the server. In the embodiment, the configuration instruction of data collection may be obtained, the power data of the electric meter may be collected periodically according to the configuration instruction of data collection, and the collected power data may be data compressed and stored. When the preset upload condition is satisfied, the stored power data may be uploaded to the server. In the present disclosure, the power data may be collected periodically, and when the preset upload condition is satisfied, the power data may be uploaded to realize the collection and upload of the power data. When the user wants to know the power change of electrical load under a certain meter, the configuration instruction of data collection may be issued through the server, and a data processing module in the collector or the electric meter may collect and upload the power data according to the configuration instruction of data collection.

Also, the method of the embodiment may be applied to scenarios where a smart meter is configured to control electricity consumption, such as a hotel, a long-term/short-term renting apartment, a public renting house, etc. By power statistics and a reporting function, users may learn about power changes of electrical appliances and the time period when a higher power appliance is used, etc.

It should be noted that, for the working process of each module and sub-module in the embodiment, please refer to the corresponding descriptions in the embodiment, which may not be repeated herein. Optionally, based on any of the embodiments of the data collection device, the data processing module 4230 may include a data compression sub-module for a byte compression on the collected power data to obtain intermediate data. A data selection sub-module may be configured to determine continuous data groups in each of which the value of two adjacent data may change within a preset value from the intermediate data; the data processing sub-module may be configured to process the data group according to a preset data processing rule to obtain the compressed data, wherein the preset data processing rule may include converting a data group into a data group including a first data in the data group and a number of no changes of data in the data group. The number of no changes may include a value of the total number of data in the data group minus one.

Further, the data compression sub-module may include a deleting unit configured to delete the last value of each power value in the power data to obtain the data to be processed; a format converting unit configured to convert the format of each power data to be processed into a preset format to obtain intermediate data.

In the embodiment, a local statistic data compression method may be configured according to the needs of different users, which may be applied to any smart meter/collector device with different resource conditions, and may reduce the amount of data stored and reported, which may not affect wireless data bandwidth. It should be noted that, for the working process of each module, sub-module, and unit in the embodiment, please refer to the corresponding descriptions in the embodiment, which may not be repeated herein. Optionally, based on the embodiment of the method implemented on a server for collecting data, another embodiment of the present disclosure may provide a device implemented on a server for collecting data, which may include:

The device for obtaining data may include an instruction generating module configured to generate configuration instruction of data collection, wherein, the configuration instruction of data collection may include data collection frequency, data collection time, and function switch information; the function switch information may be information whether a data processing unit turns on the power data collection function.

The device for obtaining data may include an instruction issuing module configured to send the configuration instruction of data collection to the data processing unit through remote issuing.

In the embodiment, a server may configure the power statistics function of a smart meter/collector by remotely issuing an instruction, thus the smart meter/collector may collect and upload power data according to the issued instruction.

It should be noted that, for the working process of each module in the embodiment, please refer to the corresponding descriptions in the embodiment, which may not be repeated herein.

The present disclosure relates to a method for monitoring an abnormal state in a renting house. In some embodiments, the server may obtain monitoring information of a smart meter or smart device corresponding to the renting house. The abnormal state of the renting house may be detected based on the monitoring information. In some embodiments, the monitoring information may include resource usage record information, expense information, remaining amount, arrears information, meter switch state information, information collection time, meter or smart device ID number, house rental state record, door lock switch record information, door lock password state information, housing public area usage record information, which may be one of the information mentioned above or a combination of other information. In some embodiments, the actual usage state of the renting house may be determined according to the door opening and closing record information of a smart door lock and the usage record information sent by a smart meter. If the actual usage state of the renting house does not match a rental registration record, the renting house may be determined in an abnormal state. In some embodiments, it may be determined whether the renting house is in arrears of resources or rent based on the rental state of the renting house, the state information of the door lock password, the resource usage record information of the renting house, and the resource usage record information of the public area. In some embodiments, if the resource or rent is in arrears, it may be determined whether the renting house is in an abnormal state based on the resource usage record in the public area.

Figure 43:
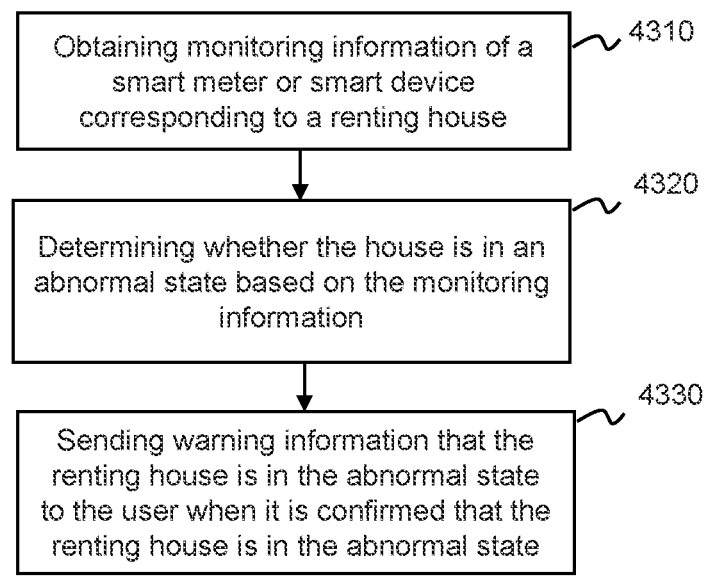
FIG. 43 is a flowchart illustrating an exemplary method for monitoring an abnormal state of a renting house according to some embodiments of the present disclosure.

FIG. 43 is a flowchart illustrating an exemplary method for monitoring an abnormal state of a renting house according to some embodiments of the present disclosure.

In step 4310, monitoring information of a smart meter or smart device corresponding to a renting house.

In some embodiments, the renting house may be a certain house or a certain room dedicated to renting, such as a hotel or an apartment building. In some embodiments, the smart meter may be a smart electric meter, a smart water meter, a smart gas meter, etc., and the smart device may be a household device such as a smart door lock, a smart air conditioner, a smart TV etc. In some embodiments, the monitoring information may include resource usage record information, expense information, remaining usage information, arrears information, switch state information of a meter, information collection time, the ID number of a meter or a smart device, house rental status records, opening and closing record information of a door, door lock password state information, and usage record information of a public area including the renting house, or the like, or a combination thereof.

In step 4320, whether the renting house is in an abnormal state may be determined based on the monitoring information.

In some embodiments, the abnormal state may be a state that the rental record of the house does not match the actual usage of the house. For example, if the house has no rental record, and it is determined that someone uses the house according to the monitoring information of the meter and the smart device, the house may be in an abnormal state. If the house has a rental registration record, the house may be in a normal state. In some embodiments, the server may send the detection result to the client terminal, for example, to remind the user that the house is in an abnormal state through a message, an app, a prompt sound, etc.

In some embodiments, the monitoring information including the opening and closing record information of the door and the door lock password state information sent by the smart door lock of the renting house, the usage record information sent by the smart meter of the house, the expense information, the switch state information of the meter, etc., may be obtained to determine whether the house is in the abnormal state. For example, according to the opening and closing record information of the door sent by the smart door lock and the electricity consumption record information sent by an electric smart meter, it may be analyzed that a certain number of times of door opening and closing and a certain amount of electricity consumption within a set time period may exist in the renting house, and the house is occupied. If the renting house has no rental registration record, the renting house may be in an abnormal state. The renting house may be rented out but not registered for renting, which may be an abnormal rental phenomenon, or it may be that the renting house manager privately rents or use the renting house without a clear record.

In some embodiments, whether the number of times of door opening in the renting house within a first preset time period is greater than a first preset number of times of door opening may be determined according to the monitoring information, and whether the resource consumption quantity in the first preset time period is greater than a first preset electricity consumption quantity may be determined according to the resource usage record information of the renting house. If the number of times of door opening in the renting house within the first preset time period is greater than the first preset number of times of door opening, and the resource consumption quantity of the renting house during the first preset time period is greater than the first preset electricity consumption quantity, the renting house may be in the actual rental state. If the actual usage state of the renting house does not match the rental registration record, it may be determined that the renting house is in an abnormal state. For example, if the number of times of door opening in the renting house is more than 5 times a day, and the electricity consumption quantity on the same day is more than 3 degrees, but if the renting housing has no rental record, the abnormal state of the renting house may occur.

In some embodiments, whether the renting house is in an abnormal state may be determined according to a preset rule based on the rental state of the renting house, the state information of the door lock password, the resource usage record information of the renting house, and the resource usage record information of the public area. In some embodiments, the public area may refer to a space area that is larger than the actual space of the renting house and includes the renting house, and the space area may be a common area. In public areas, such as a corridor, a stair, a public toilet, etc., resource usage may be generated by related facilities and devices, such as public lighting, ventilation facilities, public bathrooms, public toilets, public kitchens, etc., or the resource usage may also be generated by a cleaning staff performing cleaning work. Generally, in the public areas mentioned above, smart meters may also be installed to record the resource usage in the public areas. In some embodiments, the door lock password state information may refer to the state information that whether the door lock password monitored by the smart door lock is frozen. In some embodiments, the door lock password may be frozen when one or more housing resources are in arrears or the rent is insufficient. In some embodiments, when the rental state of the renting house is registered for renting, the server may determine whether the renting house is actually used by users and whether the users use resources according to the lock password state information and resource usage record information of the renting house, and then determine whether the renting house has a phenomenon of stealing resources based on the resource usage record information of the public area where the renting house is located. For example, when the renting house is in the state of being registered for renting, and by identifying the password state of the door lock of the renting house and the resource usage record information of the renting house, it may be confirmed that the renting house is occupied but the resource usage quantity is very small. The amount of resource consumption in the public area may have increased sharply compared to the usual time, it may be considered that the electricity resource of the renting house is stolen. It may be very likely that the user of the renting house does not use the resources in the renting house but may steal the resources of the public area where the renting house is located, and the renting house may be considered to be in an abnormal state at this time.

In some embodiments, whether the user of the renting house has owed resources or rent based on the door lock password state information and the resource usage record of the renting house. For example, if the door lock password state information is that the door lock password is frozen, it may be determined that the user of the renting house has arrears in resources or rent. As another example, if the door lock code of the renting house is frozen and the switch of the meter of the renting house is in a closed state, it may be confirmed that the renting house is in arrears of resources or rent. If the state of the door lock password is not frozen, and the switch of the meter of the renting house is in the closed state, the renting house may also be considered to be in arrears of resources or rent. On the contrary, if the door lock password of the renting house is not frozen, and the switch of the meter of the renting house is in the open state, the renting house may be not in arrears of resources or rent. In some embodiments, if the resource is in arrears or the rent is in arrears, whether the resource consumption quantity of the public area in a second preset time period is greater than a second preset consumption quantity may be determined according to the public area resource usage record. If the resource consumption quantity of the public area in the second preset time period is greater than the second preset consumption quantity, it may be confirmed that the renting house is in an abnormal state. If the resource consumption quantity of the public area in the second preset time period is not greater than the second preset consumption quantity, the renting house may be in a normal state.

In step 4330, when the renting house is in an abnormal state, a warning message that the renting house is in an abnormal state may be sent to a user. In some embodiments, the user may be the owner of the renting house or the operator of the renting house. In some embodiments, the owner of the renting house may be an owner of the property right of the renting house who entrusts the renting house to the operator of the renting house to manage the rental operation. The owner of the renting house may hope that the supervising operator may abide by the agreement and operate the renting house reasonably and efficiently. If the operator privately uses or rents the house without performing a formal rental registration process, then for the owner of the renting house, it may cause a large economic loss, but the operator may earn income secretly.

In the present disclosure, the server may obtain the monitoring information sent by the meter or the smart device of the renting house, and then determine whether the renting house is in an abnormal state according to the monitoring information. Detecting automatically whether the renting house is in an abnormal state may be more efficient than manual on-site detection of whether the renting house is in an abnormal state, which may reduce the operating cost of the renting house, and reduce labor costs.

Figure 44:
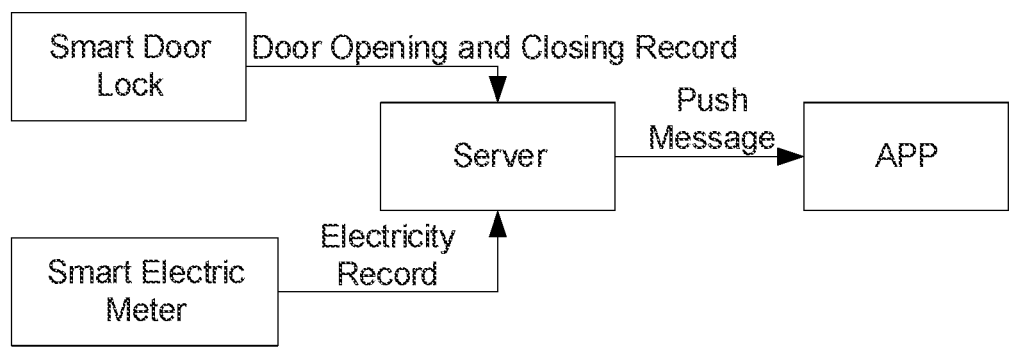
FIG. 44 is a diagram of a system for monitoring a renting house according to some embodiments of the present disclosure.

The technical solutions of the embodiments of the present disclosure may be implemented based on the monitoring system of the renting house shown in FIG. 44, which may mainly include a smart door lock, a smart meter, and a server. The smart door lock may have the function of the recording door opening and closing information, door lock password information, and a door lock password state, and have a communication function, which may send the recorded information to the server. The smart meter may be mainly configured to recharge and record electricity consumption information and control a room's power on and off. The smart meter may also have a communication function and may send the recorded information to the server. The server may have strong processing capabilities and may store the information sent by the smart door lock and the smart meter, analyze and process the information sent by the smart door lock and the smart meter, and generate corresponding control instructions based on the analysis results, such as controlling the smart door lock to lock or open, controlling the smart meter to cut off the power, etc.

It may be understood that the above monitoring system of a renting house may mainly collect information by the smart door lock and the smart meter, and then the server may analyze and process the collected information to obtain corresponding analysis results or generate corresponding control instructions to control the smart door lock and the smart meter, thereby forming an intelligent monitoring and intelligent control system.

Furthermore, as shown in FIG. 44, the server in the above monitoring system of the renting house may also have a message push function. After completing the monitoring of the renting house state, the monitoring results may be sent to the corresponding application APP, thus the user may know the state of the renting house anytime and anywhere by the APP installed on a mobile terminal.

In the embodiment of the present disclosure, a technical solution that may detect the abnormal state of the renting house may be designed using the information collection function of the smart door lock and the smart meter in the above system and the analysis and processing function of the server may be mainly configured to design. Also, the technical solution of the embodiment of the present disclosure may be implemented by the server in the monitoring system of the renting house shown in FIG. 44 as the executive body, which may be a technical solution that analyzing and processing the information sent by the smart door lock and the smart meter to determine whether the renting house has an abnormal state.

Figure 45:
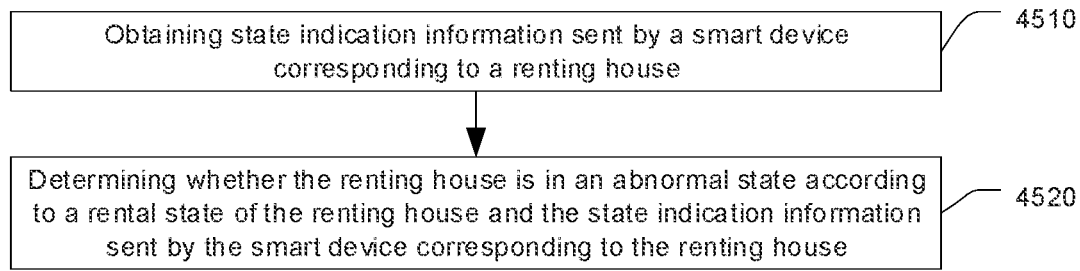
FIG. 45 is a flowchart illustrating an exemplary method for monitoring an abnormal state of a renting house according to some embodiments of the present disclosure.

FIG. 45 is a flowchart illustrating another exemplary method for monitoring an abnormal state of a renting house according to some embodiments of the present disclosure.

In step 4510, state indication information sent by a smart device corresponding to a renting house may be obtained.

Specifically, the above renting house may refer to a certain house or room of a hotel or an apartment building dedicated to renting. Given the purpose of renting houses, smart devices such as a smart door lock, a smart electricity meter, a smart water meter, a smart gas meter, etc., may be installed in each independent renting house. These smart devices may have data collection functions and may send the collected data to the server. In the embodiment of the present disclosure, the information sent by the smart devices may be collectively referred to as the state indication information. The state indication information collected by a smart device may be configured to characterize usage record information of the smart device. For example, the state indication information sent by the smart door lock may be door opening and closing record information and the state indication information sent by the smart electric meter may be electricity consumption record information, etc. It may be understood that smart devices such as the smart door lock and the smart meters may be smart devices that coexist in the same renting house. These smart devices may be configured to record the usage record information of the same renting house and the above smart devices may be smart devices that correspond to the renting houses.

It should be noted that the state indication information sent by the smart device may have a time factor, that is, the information sent by the smart device to the server may have been marked at which time point the information was collected. Therefore, when the server analyzes and processes the information sent by the smart device, it may be convenient to analyze and process the information collected in a set time period based on time.

In step 4520, whether the renting house is in an abnormal state may be determined according to the rental state of the renting house and the state indication information sent by the smart devices corresponding to the renting house.

Specifically, the renting house may be generally entrusted by the renting house owner (that is, the owner of the property right of the renting house) to a professional renting house operator to operate the rental management to achieve profitability. When the renting house is managed by the renting house operator, the renting house operator may generally register the rental state of the renting house. When the renting house is rented by the user, it may be recorded that the renting house has been registered for renting. When the renting house is idle and without users renting, it should be recorded that the renting house is not registered for renting. For example, a guest room management system of a hotel may record the state of each room, thus the rental state of each room may be determined concisely and efficient operation may be realized. At the same time, the record of the rental state of the renting house may be also an important basis for the renting house owner to supervise whether the renting house operator is operating the renting house reasonably, as well as an important reference for evaluating the operating performance of the operator.

The embodiment of the present disclosure may set that the rental state record information of the renting house may also be stored in the server, that is, the server may retrieve and check the rental state information stored in the renting house at any time.

When the server detects the abnormal state of the renting house, the server may read the rental state information of the renting house, that is, the server may determine whether the renting house has been registered for renting. The server may analyze and process the state indication information sent by the smart devices to determine the actual usage state of the renting house, specifically to determine whether the actual usage state of the door locks and electricity consumption of the renting house satisfies the house registration state. If the actual usage state of the renting house does not satisfy the house registration state, the server may be determined that the renting house is in an abnormal state; if the actual usage state of the renting house satisfies the house registration state, the server may be determined that the renting house is in a normal state.

After determining whether the renting house is in an abnormal state in step 4520, if it is determined that the renting house is in an abnormal state, the embodiment of the present disclosure may set the server to send the detection result to the client terminal, that is, to the application APP installed on the user client terminal to remind the user that the renting house is in an abnormal state.

As may be seen from the above introduction, in the technical solution of the embodiment of the present disclosure, the server may obtain the state indication information sent by the smart device of the renting house, and then determine whether the renting house is in an abnormal state according to the rental state of the renting house and the state indication information. The above technical solution may realize that the server may automatically detect whether the renting house is in an abnormal state according to the received information. Compared with manual on-site detection of whether the renting house is in an abnormal state, the technical solution of the embodiment of the present disclosure may have higher detection efficiency and reduce the operation cost of the renting house and labor.

In some embodiments, assuming that the above smart devices are the smart door lock and the smart electric meter in the renting house, the state indication information sent by the smart device corresponding to the renting house may be obtained, specifically, the door opening and closing record information sent by the smart door lock of the renting house and the electricity record information of the renting house sent by the smart meter of the renting house may be obtained.

Specifically, the smart door lock may have an information collection function, which mainly collects information such as the opening and closing records of the door lock and the password state of the door lock, stores the collected information, and sends the collected information to the server. The smart door lock may collect the door opening and closing record information and the password state information of the door lock in real-time, that is, the door lock opening and closing state and the password state change of the door lock may be monitored constantly. However, the cycle for the smart door lock sending the collected information to the server may be flexibly controlled, that is, the cycle for the smart door lock sending the collected information to the server may be set according to actual needs.

Similarly, the smart electric meter may also have an information collection function, which mainly collects electricity consumption information, user expense information, power on/off information, etc. And the collected information may be stored and sent to the server. The information collection function of the smart meter may be also carried out at all times, but the cycle for reporting the collected information to the server may be flexibly set, that is, the cycle for the smart meter sending the collected information to the server may be set according to actual needs.

Based on the obtained state indication information, whether the renting house is in an abnormal state may be determined according to the rental state of the renting house and the state indication information sent by the smart device corresponding to the renting house. Specifically, based on the rental state of the renting house, the door opening and closing record information, and the electricity consumption record information of the renting house, whether the renting house is in an abnormal state may be determined.

Specifically, the server may retrieve and check the rental state information stored in the renting house at any time to determine whether the renting house has been registered for renting. At the same time, the server may analyze and process the information sent by the smart door lock and the smart meter to determine whether the usage information of the door lock and the electricity consumption information of the renting house satisfies the rental or non-rental state of the renting house. If the usage information of the door lock and the electricity consumption information of the renting house satisfies the rental state, the renting house may be determined in the rental state; if the usage information of the door lock and the electricity consumption information of the renting house satisfies the non-rental state, the renting house may be determined to be in the non-rental state and the actual usage state of the renting house may be determined. It may be understandable that if the renting house is occupied by people, there should be several times of door opening and closing within a set time period, for example, within one or two days, and the smart door lock may record the number of times of door opening and closing accordingly. At the same time, the renting house may generate a certain amount of electricity consumption during the residence and usage of the user in the set time period, such as in the above one or two days, and the smart meter may correspondingly record the electricity consumption within the set time period mentioned above. Based on the above descriptions, the embodiment of the present disclosure may set that the server records the door opening and closing record information sent by the smart door and the electricity consumption record information sent by the smart meter to analyze whether the renting house has a certain number of times of door opening and closing within the set time period and whether there is a certain amount of electricity consumption to determine whether the renting house is used within the set time period.

The server may compare and determine whether the read state information of the renting house is consistent with the actual usage state of the renting house determined by the information analysis processing. If the read state information of the renting house is consistent with the actual usage state, it may indicate that the renting house is in a normal state. If the read state information of the renting house is inconsistent with the actual usage state, it may be confirmed that the renting house is in an abnormal state, specifically, an abnormal rental phenomenon may have occurred.

For example, assuming that the registration state of a renting house is not registered for renting, but through analysis and processing of the information collected by the smart door lock and the smart meter of the renting house, it may be found that the renting house involves door opening and closing and includes electricity consumption information that is obviously in line with normal use. That is, the renting house may be determined to be in actual use through information analysis, and it may be determined that the renting house is rented but not registered for renting, which may be an abnormal rental phenomenon caused by the private renting through the renting house operator or using the renting house without clear records.

Figure 46:
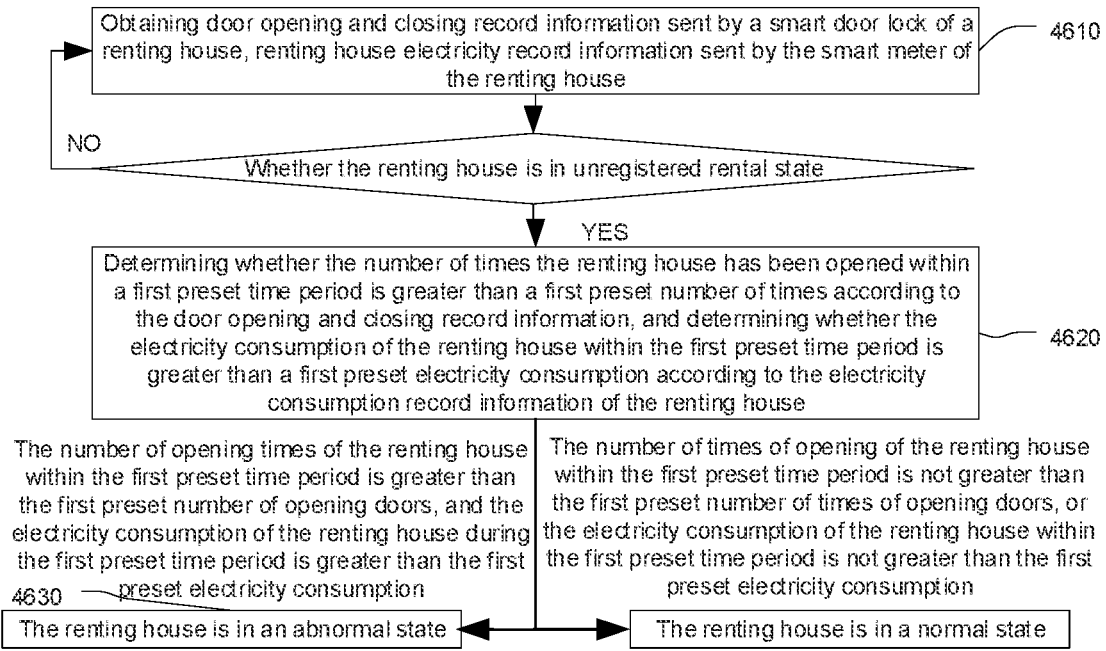
FIG. 46 is a flowchart illustrating another exemplary method for detecting an abnormal state of a renting house according to some embodiments of the present disclosure.

FIG. 46 is a flowchart illustrating another exemplary method for detecting an abnormal state of a renting house according to some embodiments of the present disclosure.

In step 4610, door opening and closing record information sent by a smart door lock of the renting house and electricity record information sent by the smart meter of the renting house may be obtained.

In step 4620, if the renting house is in an unregistered rental state, whether the number of times of door opening of the renting house within a first preset duration is greater than a first preset number of times may be determined according to the door opening and closing record information, and according to the electricity consumption record information of the renting house, whether the electricity consumption quantity of the renting house within the first preset duration is greater than a first preset electricity consumption quantity may be determined.

Specifically, compared to the state that the renting house has been registered for renting, the renting house owner may be more concerned about whether the renting house has abnormal conditions in the state of unregistered renting, for example, whether is the house has an abnormal rental phenomenon to avoid waste of resources and economic losses caused by the use of the renting house without registration for renting.

Therefore, when it is determined that the renting house is in an unregistered rental state, the server may further determine whether the number of times of door opening is greater than the preset number of times of door opening (that is, the above first preset number of times of door opening) of the renting house in a preset duration (that is, the first preset duration) according to the door opening and closing record information of the renting house sent by the smart door lock of the renting house, and at the same time, according to the electricity consumption record information of the renting house sent by the smart meter of the renting house, the server may determine whether the electricity consumption quantity of the renting house is greater than a preset electricity consumption quantity (that is, the first preset electricity consumption quantity mentioned above) within the set duration.

In the embodiment of the present disclosure, the actual usage state of the renting house may be determined in units of days, specifically, the door opening and closing record information of the renting house sent by the smart door lock of the renting house may be configured to determine whether the number of times of door opening is greater than 5 in one day, and at the same time, whether the electricity consumption quantity of the renting house in the same day is greater than 3 degrees may be determined according to the electricity consumption information of the renting house sent by the smart meter of the renting house.

It should be noted that in the actual implementation of the technical solution of the embodiment of the present disclosure, the specific duration of the "first preset duration" may be flexibly set, for example, it may be set to half a day, one day, two days, or several hours. Similarly, the "first preset number of times of door opening" and "first preset electricity consumption quantity" may be flexibly set according to actual conditions. The embodiments of the present disclosure may be only examples of the technical solutions to name and set specific values of the embodiments of the present disclosure, which is not strictly limited herein.

In step 4630, if the number of times of door opening of the renting house in the first preset duration is greater than the first preset number of times of door opening, and the electricity consumption quantity of the renting house in the first preset duration is greater than the first preset electricity consumption, the renting house being in an abnormal state may be determined.

Specifically, if it is confirmed that the number of times of door opening of the renting house within the first preset duration is greater than the first preset number of door openings, that is, the number of times of door opening of the renting house in a day is greater than 5 times, and the electricity consumption quantity within the first preset duration is greater than the first preset electricity consumption quantity of the renting house in the first preset duration, that is, the electricity consumption quantity of the renting house in one day is greater than 3 degrees, then it may be confirmed that the renting house is used by a user in the first preset duration, that is, the renting house may be in the actual usage state. However, the registration state of the renting house may be unregistered for renting, which may be inconsistent with the actual usage state of the renting house determined through information analysis. Therefore, it may be concluded that the renting house is in an abnormal state, and more specifically, it may be determined that the renting house has an abnormal rental phenomenon.

On the contrary, it may be considered that the renting house has no abnormal rental phenomenon, that is, the renting house may be in a normal state.

It should be noted that the technical solution of the embodiment of the present disclosure determines whether the renting house is used according to the number of times of door opening of the renting house and the electricity consumption quantity. In places that do not require high determining accuracy, it may also be possible to determine whether the renting house is used based on the number of times of door opening of the renting house alone or according to the electricity consumption of the renting house. For the specific determining process, please refer to the determination introduced above. The process may not be described in detail in the embodiment of the present disclosure.

Figure 47:
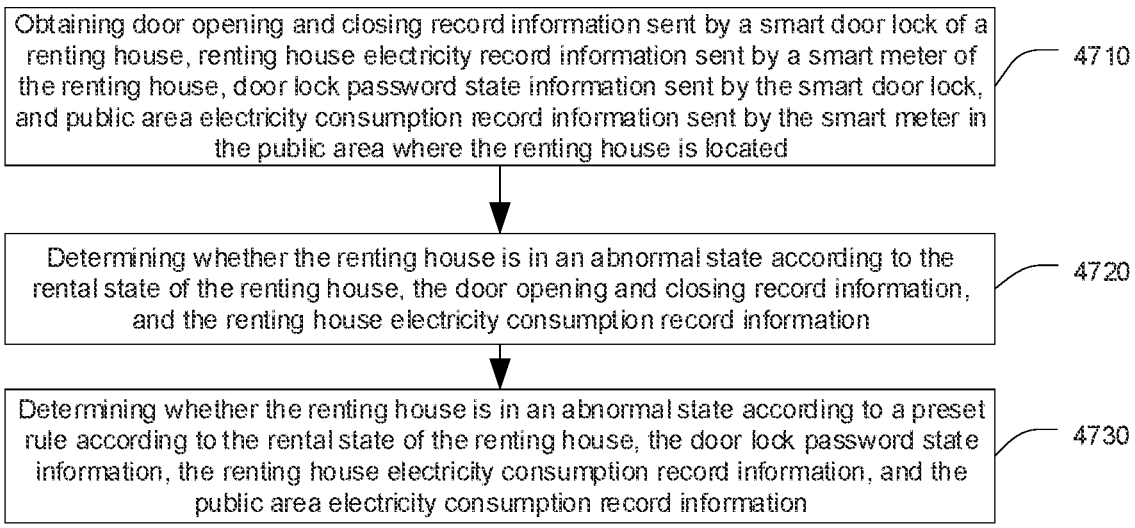
FIG. 47 is a flowchart illustrating another exemplary method for detecting an abnormal state of a renting house according to some embodiments of the present disclosure.

FIG. 47 is a flowchart illustrating another exemplary method for detecting an abnormal state of a renting house according to some embodiments of the present disclosure.

In step 4710, door opening and closing record information sent by a smart door lock of a renting house, electricity consumption record information of the renting house sent by a smart meter of the renting house, door lock password state information sent by the smart door lock, and electricity consumption record information of a public area where the renting house is located sent by smart meters in the public area may be obtained.

Specifically, the door lock password state information may refer to the state information whether a door lock password monitored by the smart door lock is frozen. It may be understood that when the user obtains the available door lock password, the smart door lock may be opened normally, and when the door lock password obtained by the user is frozen, the smart door lock may know that the door lock password has been frozen. The door lock password may no longer be used to unlock, and the smart door lock may monitor the state information of the door lock password and may send the state information of the door lock password to the server along with the monitored door opening and closing record information. In general, when the prepaid rent of the user for a renting house is insufficient, the renting house operator may freeze the door lock password obtained by the user.

The public area where the renting house is located may refer to an area that is larger than the actual area of the renting house and includes the renting house. The area may be public, thus the area may also be referred to as the public area. It may be understood that the renting house is actually a separate house divided in the public area, and there may also be multiple renting houses in the public area. For example, in a hotel, each room may be rented out as a separate renting house, and the floor where the room is located may be used as the public area where the room is located.

In the public area, such as a corridor, a stair, a public toilet, etc., there may be public lighting, ventilation facilities, and other electric devices that may generate the electricity consumption quantity, or the electricity consumption quantity may be generated d when a cleaning staff using cleaning tools to performs cleaning work. Generally, in the public areas mentioned above, smart meters may also be installed to record the electricity consumption quantity in the public area. It may be clear that the electricity consumption quantity of the renting house in the public area may be recorded by the smart meter of the renting house, and the smart meters in the public area may record the electricity consumption information in the public area except for the renting house, that is, the electricity consumption record information of the public area.

In step 4720, whether the renting house is in an abnormal state may be determined according to a rental state of the renting house, the door opening and closing record information, and the electricity consumption record information of the renting house.

In step 4730, according to the rental state of the renting house, the door lock password state information, the electricity consumption record information of the renting house, and the electricity consumption record information of the public area, whether the renting house is abnormal may be determined according to the state of the preset rules.

Specifically, when the rental state of the renting house is a registered rental state, the server may determine whether the renting house is used by users and actual electricity consumption occurs in the renting house according to the door lock password state of the renting house and the electricity consumption record information of the renting house. Then combined with the electricity consumption record information of the public area where the renting house is located, whether the renting house is in an abnormal state may be determined. Specifically, whether an electricity theft event occurs in the renting house may be determined. If the renting house is in the registered rental state, and the renting house is occupied but the electricity consumption is very small according to the door lock password state information and the electricity consumption record information of the renting house, on the contrary, the electricity consumption quantity of the public area increases sharply compared to the usual electricity consumption, it may be considered that the renting house has experienced electricity theft. It may be very likely that the renting house user does not use the electricity in the renting house, but uses the electricity of the public area where the rented house is located. Therefore, the electricity consumption of the public area mentioned above may be increased sharply. At this time, it may be considered that the renting house is in an abnormal state.

According to the above method, whether an electricity theft occurs in the renting house may be determined. It may be understood that the determining process may be only an automated determination based on existing information, and it may not be said that the electricity theft event has occurred in the renting house. For the determining result (whether there is electricity theft), it may be actually to determine whether there is suspected electricity theft. When the electricity theft occurs in a renting house according to the above method, it may be essentially a suspected electricity theft phenomenon. It may be further confirmed based on the determination manually, which may greatly improve the efficiency of investigation compared to blindly investigating electricity theft manually.

In some embodiments, there is no strict sequence restriction between step 4720 and step 4730.

Figure 48:
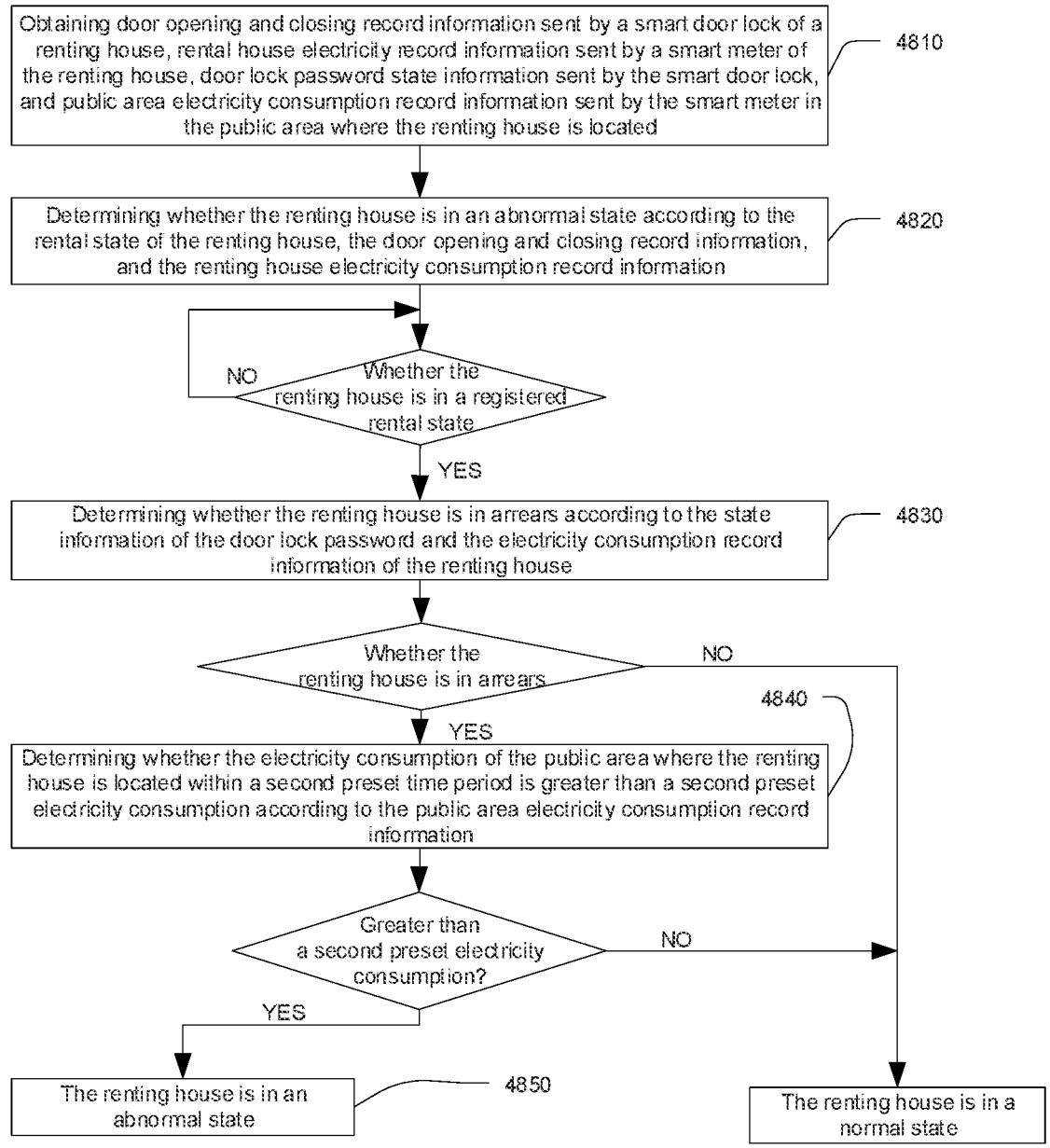
FIG. 48 is a flowchart illustrating another exemplary method for detecting an abnormal state of a renting house according to some embodiments of the present disclosure.

FIG. 48 is a flowchart illustrating another exemplary method for detecting an abnormal state of a renting house according to some embodiments of the present disclosure.

In step 4810, door opening and closing record information sent by a smart door lock of a renting house, electricity consumption record information of the renting house sent by a smart electric meter of the renting house, door lock password state information sent by the smart door lock, and electricity consumption record information of a public area where the renting house is located sent by one or more smart meters in the public area may be obtained.

In step 4820, according to a rental state of the renting house, the door lock password state information, the electricity consumption record information of the renting house, and the electricity consumption record information of the public area, whether the renting house is abnormal may be determined according to a preset rule.

In step 4830, if the renting house is in a registered rental state, whether the renting house is in arrears may be determined based on the door lock password state information and the electricity consumption record information of the renting house.

Specifically, when the renting house is in the registered rental state, it may indicate that the renting house has been rented to a user. The server may obtain the door lock password state information of the renting house, and determine whether a door lock password is frozen according to the door lock password state information. If the door lock password is frozen, it may be determined that the user of the renting house has been in arrears, at this time, the power supply in the renting house may be in a power-off state and may not be used normally. In some embodiments, whether the door lock password of the renting house is in a frozen state, and whether the power supply of the renting house is in a power-off state may be determined simultaneously according to the electricity consumption record information of the renting house. If the door lock password of the renting house is in the frozen state, and the power supply of the renting house is in the power-off state, it may determine that the renting house is in arrears. If the door lock password is not in the frozen state, and the power supply of the renting house is in the power-off state, it may also be considered that the renting house is in arrears and may not use electricity normally.

On the contrary, if the door lock password of the renting house is not in the frozen state, and the power supply of the renting house is not in the power-off state, the renting house may not be in arrears.

In step 4840, if the renting house is in arrears, whether an electricity consumption quantity of the public area where the renting house is located exceeds a second preset electricity consumption quantity within a second preset duration according to the electricity consumption record information of the public area.

Specifically, the smart electric meter of the public area where the renting house is located may record the electricity consumption record information of the public area, and the server may determine whether the electricity consumption quantity of the public area where the renting house is located is greater than the preset electricity consumption quantity (i.e. the second preset electricity consumption quantity) within a preset duration (that is, the second preset duration) based on the electricity consumption record information of the public area.

In the embodiment of the present disclosure, the electricity consumption quantity of the public area where the renting house is located may be calculated and analyzed in units of days. Specifically, whether the electricity consumption quantity of the public area in one day is greater than 10 degrees may be determined according to the electricity consumption information recorded by the smart meters of the public area.

It should be noted that when implementing the technical solutions of the embodiments of the present disclosure, the specific duration of the "second preset duration" may be flexibly set, for example, may be set to half a day, one day, two days, or several hours. Similarly, the "second preset electricity consumption" may also be flexibly set according to the actual situation. The embodiments of the present disclosure only illustrate the technical solution of the present disclosure to name it and set specific values but do not make strict limits herein.

In step 4850, if the electricity consumption quantity of the public area where the renting house is located during the second preset duration is greater than the second preset electricity consumption, the renting house may be determined to be in an abnormal state.

Specifically, the second preset electricity consumption may be generally set based on a normal electricity consumption quantity of the public area where the renting house is located within the second preset duration under normal circumstances. For example, in the embodiment of the present disclosure, it may be known that the electricity consumption quantity of the public area where the renting house is located does not exceed 10 degrees under normal circumstances, thus the second preset electricity consumption may be set to 10 degrees.

When it is determined that the renting house is in arrears, if the electricity consumption quantity of the public area where the renting house is located exceeds the second preset electricity consumption but the electricity consumption quantity of the public area may not exceed the second preset electricity consumption under normal circumstances within the second preset duration (one day), it may be considered that the user of the renting house steals the electricity in the public area of the renting house when the electricity of the renting house is not available, which may cause a sharp increase in the electricity consumption quantity of the public area. Thus, if the electricity is stolen in a renting house, it may be considered that the renting house is in an abnormal state.

In some embodiments, when it is confirmed that the renting house is in the abnormal state, warning information indicating that the renting house is in the abnormal state may be sent to the owner of the renting house; and/or the warning information indicating that the renting house is in an abnormal state may be sent to the operator of the renting house.

Specifically, the owner of the renting house may be the owner of the property right of the renting house who entrusts the renting house to the operator of the renting house to manage and perform the renting. The owner of the renting house may hope that the operator may abide by the agreement to supervise and operate the renting house reasonably and efficiently. If the operator privately uses or rents the house without performing a formal rental registration process, for the owner of the renting house, it may cause large economic losses, but the operator may secretly earn income from it.

The technical solution of the embodiment of the present disclosure may detect whether the renting house is in an abnormal state. Specifically, after separately detecting whether the renting house is abnormally rented and whether there is an electricity theft phenomenon, the corresponding warning information may be sent according to the determination, which may be conducive to maintaining a good business order in the operation of the renting house.

According to the embodiment of the present disclosure, if the server confirms that the renting house is abnormally rented and determines that the renting house is in an abnormal state, it may be confirmed that the phenomenon is caused by the illegal operation of the renting house operator. The server may send the warning information indicating that the renting house is in an abnormal state, and specifically, the warning information may indicate the occurrence of the abnormal rental phenomena in the renting house, without notifying the renting house operator, which may enable the owner of the renting house to monitor the behavior of the operator.

If the server confirms that the renting house is in an abnormal state and determines that the abnormal state is caused by an electricity theft phenomenon occurring in the renting house, it may be confirmed that the phenomenon is caused by the user. Therefore, the server may send the warning information indicating that the renting house is in an abnormal state to the renting house operator, specifically, the warning information indicating the electricity theft phenomenon of the renting house, thus the operator may conduct on-site management and investigation. At the same time, the server may also send the warning information indicating the electricity theft phenomenon of the renting house to the renting house owner and renting house operator, thus both parties may know that the renting house is in an abnormal state.

Figure 49:
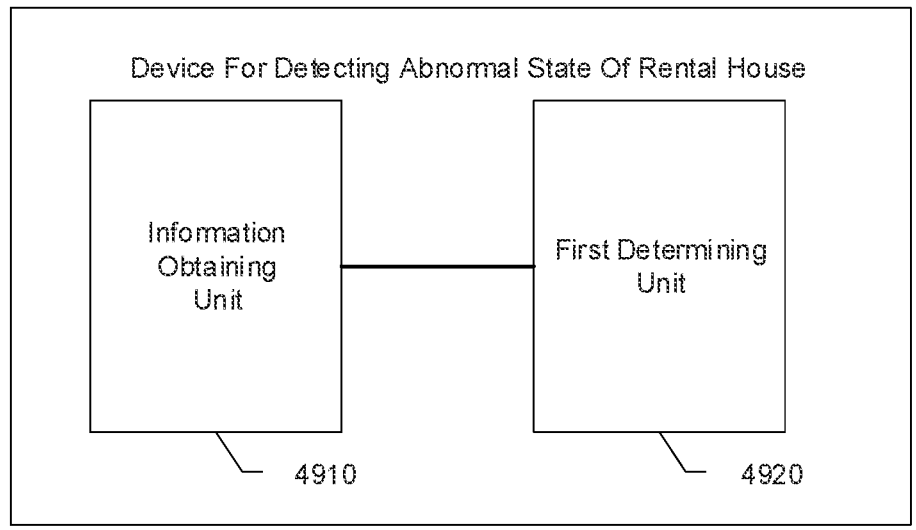
FIG. 49 is a device for detecting an abnormal state of a renting house according to some embodiments of the present disclosure.

Another embodiment of the present disclosure discloses a device for detecting an abnormal state of a renting house as shown in FIG. 49. The device may include:

an information obtaining unit 4910 configured to obtain state indication information sent by the smart device corresponding to the renting house. The smart device corresponding to the renting house may include at least a smart door lock and a smart meter, and the state indication information may be configured to characterize the usage record information of the smart device;

the device may include a first determining unit 4920 configured to determine whether the renting house is in an abnormal state according to the rental state of the renting house and the state indication information sent by the smart device corresponding to the renting house.

Optionally, in another embodiment of the present disclosure, the smart device may include a smart door lock and a smart meter, and the state indication information may include door opening and closing record information and electricity consumption record information:

the first determining unit 4920 may determine whether the renting house is in an abnormal state according to the rental state of the renting house and the state indication information sent by the smart device corresponding to the renting house, including:

if the renting house is in the unregistered rental state, determining whether the number of times of opening the renting house in the first preset duration is greater than the first preset number of times of opening according to the door opening and closing record information, and determining whether the electricity consumption of the renting house during the first preset duration is greater than the first preset electricity consumption according to the electricity consumption record information of the renting house;

if the number of times of opening the renting house in the first preset duration is greater than the first preset number of door openings, and the electricity consumption of the renting house within the first preset duration is greater than the first preset electricity consumption, then determining that the renting house is in an abnormal state.

Optionally, in another embodiment of the present disclosure, the smart device may further include a smart meter of the public area where the renting house is located; the state indication information may also include door lock password state information, the electricity consumption record information of the public area where the renting house is located.

Figure 50:
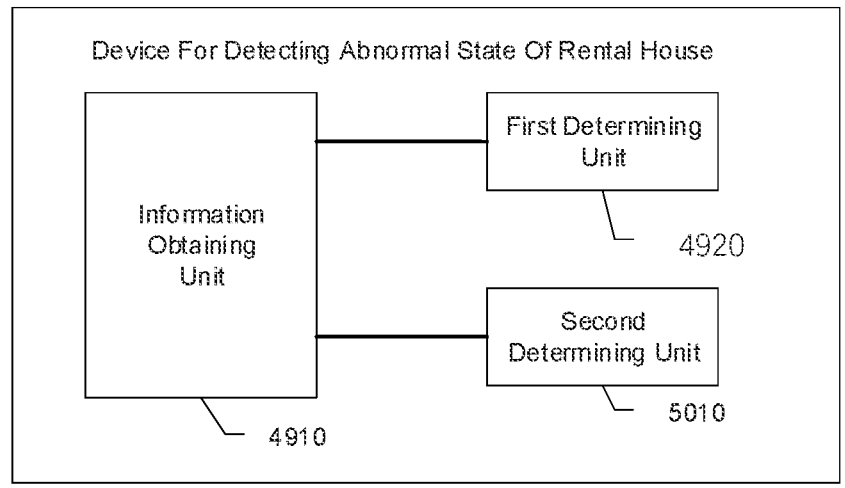
FIG. 50 is a structural diagram of another device for detecting an abnormal state of a renting house according to some embodiments of the present disclosure.

Referring to FIG. 50, the device may also include:

a second determining unit 5010 configured to determine the rental state and location of the renting house. According to the state information of the door lock password, the electricity consumption record information of the renting house, and the electricity consumption record information of the public area, determining whether the renting house is in an abnormal state according to preset rules.

The second determining unit 5010 may determine whether the renting house is in an abnormal state according to the preset rules based on the rental state of the renting house, the state information of the door lock password, the electricity consumption record information of the renting house, and the electricity consumption record information of the public area. Specifically, it may include:

if the renting house is in the registered rental state, determining whether the house is in arrears according to the rental according to the state information of the door lock password and the electricity consumption record information of the renting house;

if the renting house is in arrears, determining whether the electricity consumption of the public area where the renting house is located is greater than the second preset electricity consumption in the second preset duration according to the electricity consumption record information of the public area;

if the electricity consumption of the public area where the renting house is located during the second preset duration is greater than the second preset electricity consumption, then confirming that the renting house is in an abnormal state.

Figure 51:
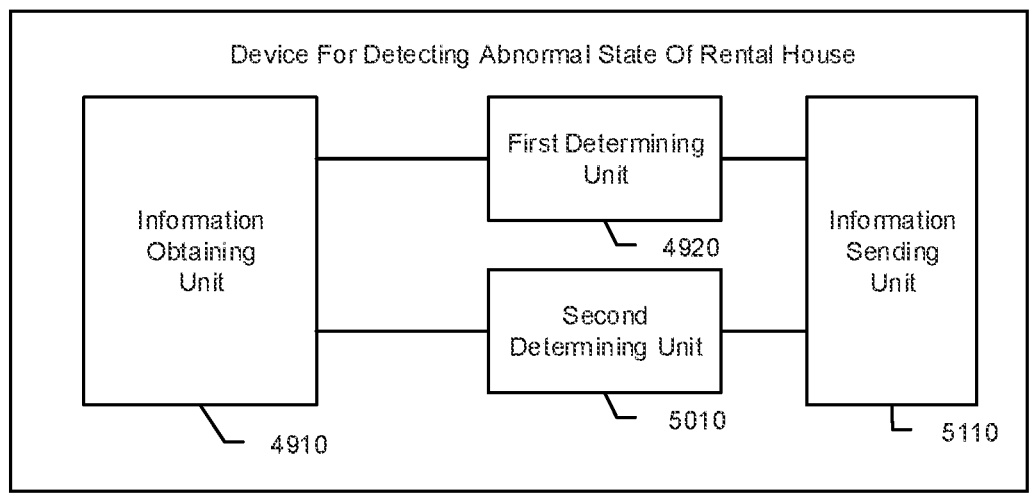
FIG. 51 is a structural diagram of another device for detecting an abnormal state of a renting house according to some embodiments of the present disclosure.

Optionally, in another embodiment of the present disclosure as shown in FIG. 51, the device may further include:

the device may also include an information sending unit 5110 configured to send the warning information indicating that the renting house is in an abnormal state to the renting house owner when it is confirmed that the renting house is in an abnormal state; and/or send the warning information indicating that the renting house in an abnormal state to the operator of the renting house.

For the specific work content of each unit in the embodiments, please refer to the content of the embodiments, the details are not repeated herein.

Any one of the devices for detecting an abnormal state of a renting house in the embodiment may include a processor, a memory, an information obtaining unit, a first determining unit, a second determining unit, and an information sending unit, which may be all configured as program modules stored in the memory in the embodiment, and the program modules stored in the memory may be executed by the processor to realize the corresponding functions.

The basic concepts have been described above. Obviously, for those skilled in the art, the detailed disclosure may be only an example and does not constitute a limitation to the present disclosure, Although not explicitly stated here, those skilled in the art may make various modifications, improvements, and amendments to the present disclosure. These alterations, improvements, and modifications are intended to be suggested by this disclosure and are within the spirit and scope of the exemplary embodiments of this disclosure.

Moreover, certain terminology has been used to describe embodiments of the present disclosure. For example, "one embodiment", "an embodiment", and/or "some embodiments" may indicate a certain feature, structure, or characteristic related to at least one embodiment of the present disclosure. Therefore, it should be emphasized and noted that "one embodiment", "one embodiment" or "an alternative embodiment" mentioned twice or more in different parts of the specification does not necessarily refer to the same embodiment. Also, some features, structures, or features in the present disclosure of one or more embodiments may be appropriately combined.

Also, those skilled in the art may understand that various aspects of the present disclosure may be explained and described through a number of patentable categories or situations, including any new and useful process, machine, product, or combination of substances, or any new and useful improvements. Accordingly, all aspects of the present disclosure may be performed entirely by hardware, may be performed entirely by software (including firmware, resident software, microcode, etc.), or may be performed by a combination of hardware and software. The above hardware or software can be referred to as "data block", "module", "engine", "unit", "component" or "system". Also, aspects of the present disclosure may appear as a computer product located in one or more computer-readable media, the product including computer-readable program code.

The computer storage medium may include a propagated data signal including a computer program code, for example, on a baseband or as part of a carrier wave. The propagation signal may have multiple manifestations, including electromagnetic forms, optical forms, etc., or a suitable combination. The computer storage medium may be any computer-readable medium other than the computer-readable storage medium, and the medium may be connected to an instruction execution system, device, or device to realize communication, propagation, or transmission of the program for usage. The program code located on the computer storage medium may be transmitted through any suitable medium, including radio, cable, fiber optic cable, RF, or similar medium, or any combination of the above medium.

The computer program codes required for the operations of each part of the present disclosure may be written in any one or more programming languages, including object-oriented programming languages such as Java, Scala, Smalltalk, Eiffel, JADE, Emerald, C++, C#, VB.NET, Python, etc., conventional programming languages such as C, Visual Basic, Fortran 2003, Perl, COBOL 2002, PHP, ABAP, and dynamic programming languages such as Python, Ruby, Groovy, or other programming languages. The programming code may run entirely on the computer of the user or run as an independent software package on the computer of the user, or partly run on the computer of the user, or partly run on a remote computer, or run entirely on the remote computer or server. In the latter case, the remote computer may be connected to the computer of the user through any network, such as a local area network (LAN) or a wide area network (WAN), or connected to an external computer (e.g., via the Internet), or in a cloud computing environment, or using as a service, such as software as a service (SaaS).

Also, unless explicitly stated in the claims, the order of processing elements and sequences, the use of numbers and letters, or the use of other names in the present disclosure are not configured to limit the order of the procedures and methods of the present disclosure. Although the above disclosure discusses through various examples what is currently considered to be a variety of useful embodiments of the disclosure, it may be to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that the present disclosure object requires more features than the features mentioned in the claims. Rather, claimed subject matter may lie in less than all features of a single foregoing disclosed embodiment.

In some embodiments, numbers describing the number of ingredients and attributes are used. It should be understood that such numbers used in the description of the embodiments use the modifiers "approximately", "approximately" or "substantially" in some examples to modify. Unless otherwise stated, "approximately", "approximately" or "substantially" indicates that the number is allowed to vary by ±20%, Correspondingly, in some embodiments, the numerical parameters used in the specification and claims are approximate values, and the approximate values may be changed according to the required characteristics of individual embodiments. In some embodiments, the numerical parameter should consider the prescribed effective digits and adopt the method of general digit retention. Although the numerical ranges and parameters configured to confirm the breadth of the range in some embodiments of the present disclosure are approximate values, in specific embodiments, the setting of such numerical values is as accurate as possible within the feasible range.

For each patent, the present disclosure, the present disclosure publication, and other materials cited in the present disclosure, such as articles, books, specifications, publications, documents, etc., the entire contents are hereby incorporated into the present disclosure by reference. The present disclosure history documents that are inconsistent or conflicting with the content of the present disclosure are excluded, and documents that restrict the broadest scope of the claims of the present disclosure (currently or later attached to the present disclosure) are also excluded. It should be noted that if there is any inconsistency or conflict between the description, definition, and/or use of terms in the attached materials of the present disclosure and the content of the present disclosure, subject to the description, definition, and/or terms of the present disclosure.

At last, it should be understood that the embodiments described in the present disclosure may be merely illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. A control system, comprising:
   a storage device configured to store a set of instructions; and one or more processors configured to communicate with the storage device, wherein when executing the set of instructions, the one or more processors are configured to cause the system to:
  obtain a registration state of a renting house;
  collect resource usage data through a meter that relates to the renting house;
  determine a resource usage state that reflects a usage state of the renting house by processing the resource usage data collected by the meter based on a preset algorithm, wherein the resource usage state reflects an amount of resource that has been used and the resource usage state includes a remaining amount of resource being less than a set threshold;
  obtain relevant time information;
  obtain a judgment result by determining whether the relevant time information belongs to a specific time period, the specific time period being a time period when a resource is restricted to be cut off; and
  control at least one of the meter and one or more smart devices to perform a specified operation based on the registration state, the resource usage state, and the judgment result.

2. The system of claim 1, wherein to control the at least one of the meter and the one or more smart devices to perform the specified operation, the one or more processors are further configured to cause the system to:
  if the remaining amount of resource is less than the set threshold and the relevant time information does not belong to the specific time period, control the meter to cut off a resource supply or control the one or more smart devices to be closed and locked.

3. The system of claim 1, wherein the one or more processors are further configured to cause the system to:
  receive recharge information from a client terminal;
  generate a recharge instruction based on the recharge information, the recharge instruction including unique identification information; and
  send the recharge instruction to the meter or the client terminal.

4. The system of claim 1, wherein the resource usage data is collected through one or more first type of resource meters and control the at least one of the meter and the one or more smart devices to perform the specified operation, and the one or more processors are further configured to cause the system to:
  control one or more second types of resource meters to perform the specified operation based at least on the resource usage state.

5. The system of claim 1, wherein to collect the resource usage data through the meter, the one or more processors are further configured to cause the system to:
  send a configuration instruction of data collection to the meter; and
  receive the resource usage data automatically uploaded by the meter based on the configuration instruction of data collection.

6. The system of claim 1, wherein to control the at least one of the meter and the one or more smart devices to perform the specified operation, the one or more processors are further configured to cause the system to:
  control the meter to cut off a resource supply or the one or more smart devices to be closed and locked in response to the registration state being vacant and the resource usage state being in use.

7. A control method, comprising:
  obtaining a registration state of a renting house;
  collecting resource usage data through a meter that relates to the renting house;
  determining a resource usage state that relates to the renting house by processing the resource usage data collected by the meter based on a preset algorithm, wherein the resource usage state reflects an amount of resource that has been used and the resource usage state includes a remaining amount of resource being less than a set threshold;
  obtaining relevant time information;
  obtaining a judgment result by determining whether the relevant time information belongs to a specific time period, the specific time period being a time period when a resource is restricted to be cut off; and
  controlling at least one of the meter and one or more smart devices to perform a specified operation based on the registration state, the resource usage state, and the judgment result.

8. The method of claim 7, wherein the controlling the at least one of the meter and the one or more smart devices to perform the specified operation includes:
  if the remaining amount of resource is less than the set threshold and the relevant time information does not belong to the specific time period, controlling the meter to cut off a resource supply or control the one or more smart devices to be closed and locked.

9. The method of claim 7, further including:
  receiving recharge information from a client terminal;
  generating a recharge instruction based on the recharge information, the recharge instruction including unique identification information; and
  sending the recharge instruction to the meter or the client terminal.

10. The method of claim 7, wherein the resource usage data is collected through one or more first types of resource meters and the controlling the at least one of the meter and the one or more smart devices to perform the specified operation based at least on the resource usage state includes:
  controlling one or more second types of resource meters to perform the specified operation based at least on the resource usage state.

11. The method of claim 7, wherein the collecting the resource usage data through the meter includes:
  sending a configuration instruction of data collection to the meter; and
  receiving the resource usage data automatically uploaded by the meter based on the configuration instruction of data collection.

12. The method of claim 7, wherein the controlling the at least one of the meter and the one or more smart devices to perform the specified operation includes:
  controlling the meter to cut off a resource supply or the one or more smart devices to be closed and locked in response to the registration state being vacant and the resource usage state being in use.

13. A non-transitory computer-readable storage medium, comprising a set of instructions, wherein when executed by at least one processor, the set of instructions direct the at least one processor to effectuate a method, the method comprising:
  obtaining a registration state of a renting house;
  collecting resource usage data through a meter that relates to the renting house;
  determining a resource usage state that reflects a usage state of the renting house by processing the resource usage data collected by the meter based on a preset algorithm, wherein the resource usage state reflects an amount of resource that has been used and the resource usage state includes a remaining amount of resource being less than a set threshold;

obtaining relevant time information;

obtaining a judgment result by determining whether the relevant time information belongs to a specific time period, the specific time period being a time period when a resource is restricted to be cut off; and controlling at least one of the meter and one or more smart devices to perform a specified operation based on the registration state, the resource usage state and the judgment result.

14. The non-transitory computer-readable storage medium of claim 13, wherein the controlling the at least one of the meter and the one or more smart devices to perform the specified operation comprises:

if the remaining amount of resource is less than the set threshold and the relevant time information does not belong to the specific time period, controlling the meter to cut off a resource supply or control the one or more smart devices to be closed and locked.

15. The non-transitory computer-readable storage medium of claim 13, wherein the method further comprises:

receiving recharge information from a client terminal;

generating a recharge instruction based on the recharge information, the recharge instruction including unique identification information; and sending the recharge instruction to the meter or the client terminal.

16. The non-transitory computer-readable storage medium of claim 13, wherein the resource usage data is collected through one or more first type of resource meters and the controlling the at least one of the meter and the one or more smart devices to perform the specified operation comprises:

controlling one or more second types of resource meters to perform the specified operation based at least on the resource usage state.

17. The non-transitory computer-readable storage medium of claim 13, wherein to collect the resource usage data through the meter, the one or more processors are further configured to cause the system to:

send a configuration instruction of data collection to the meter; and receive the resource usage data automatically uploaded by the meter based on the configuration instruction of data collection.

18. The non-transitory computer-readable storage medium of claim 13, wherein the controlling the at least one of the meter and the one or more smart devices to perform the specified operation comprises:

controlling the meter to cut off a resource supply or the one or more smart devices to be closed and locked in response to the registration state being vacant and the resource usage state being in use.

* * * * *